United States Patent [19]
Ikemasu et al.

[11] Patent Number: 6,004,842
[45] Date of Patent: Dec. 21, 1999

[54] METHOD OF MAKING A DRAM WITH A TRANSFER TRANSISTOR

[75] Inventors: Shinichiroh Ikemasu; Kazuhiro Mizutani, both of Kawasaki, Japan

[73] Assignee: Fujitsu Limited, Kawasaki, Japan

[21] Appl. No.: 09/048,178

[22] Filed: Mar. 26, 1998

[30] Foreign Application Priority Data

Oct. 9, 1997 [JP] Japan ..................... 9-276810

[51] Int. Cl.⁶ .............................. H01L 21/8242
[52] U.S. Cl. .................... 438/241; 438/253; 438/549
[58] Field of Search .................... 438/241, 253, 438/396, 527, 529, 549

[56] References Cited

U.S. PATENT DOCUMENTS

| | | | |
|---|---|---|---|
| 5,612,241 | 3/1997 | Arima | 438/241 |
| 5,631,182 | 5/1997 | Suwanai et al. | 438/241 |
| 5,731,234 | 3/1998 | Chen | 438/241 |

FOREIGN PATENT DOCUMENTS

| | | |
|---|---|---|
| 62-238661 | 10/1987 | Japan . |
| 6-61451 | 3/1994 | Japan . |
| 6-61486 | 3/1994 | Japan . |
| 9-69616 | 3/1997 | Japan . |

*Primary Examiner*—Chandra Chaudhari
*Attorney, Agent, or Firm*—Armstrong, Westerman, Hattori, McLeland & Naughton

[57] ABSTRACT

A semiconductor device comprises a semiconductor substrate; a transfer transistor including a gate electrode formed on the semiconductor substrate through a gate insulation film, and a first diffused layer formed in the semiconductor substrate on both sides of the gate electrode; an insulation film which covers an upper surface of the transfer transistor and in which a contact hole reaching the first diffused layer is opened; a capacitor formed on the insulation film and connected to the first diffused layer through the contact hole; a second diffused layer formed in the semiconductor substrate below the contact hole and being the same conduction type as the first diffused layer; and a third diffused layer formed in the semiconductor substrate below the contact hole, formed extending to a region which is deeper than the first and the second diffused layers, and having the same conduction type as the first diffused layer. The semiconductor device of this structure can solve both problems of unstable impurity diffusion from the storage electrode into the semiconductor substrate, which results from an interface state, and mitigation of the electric field mitigation in the storage node, whereby the DRAM can have improved data retention characteristics.

25 Claims, 43 Drawing Sheets

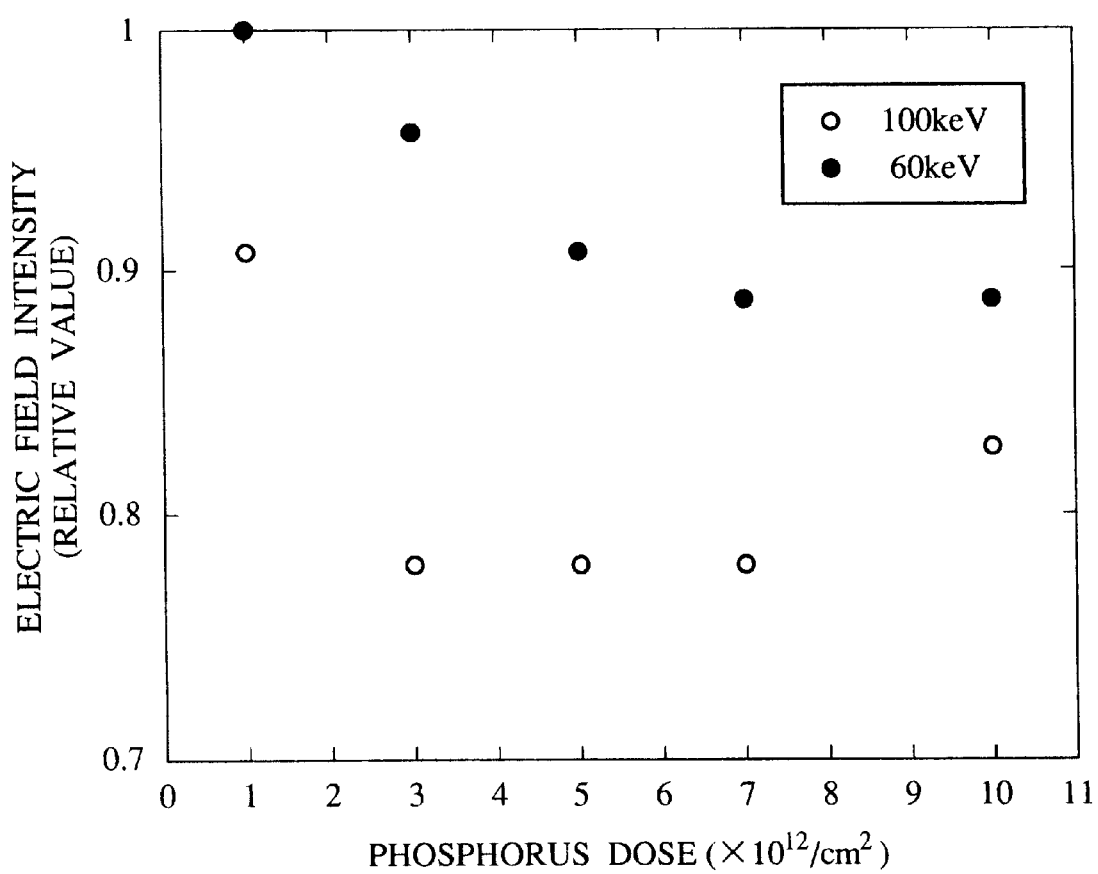

MEMORY CELL REGION     PERIPHERAL CIRCUIT REGION
                       Nch-MOSFET    Pch-MOSFET

MEMORY CELL REGION     PERIPHERAL CIRCUIT REGION

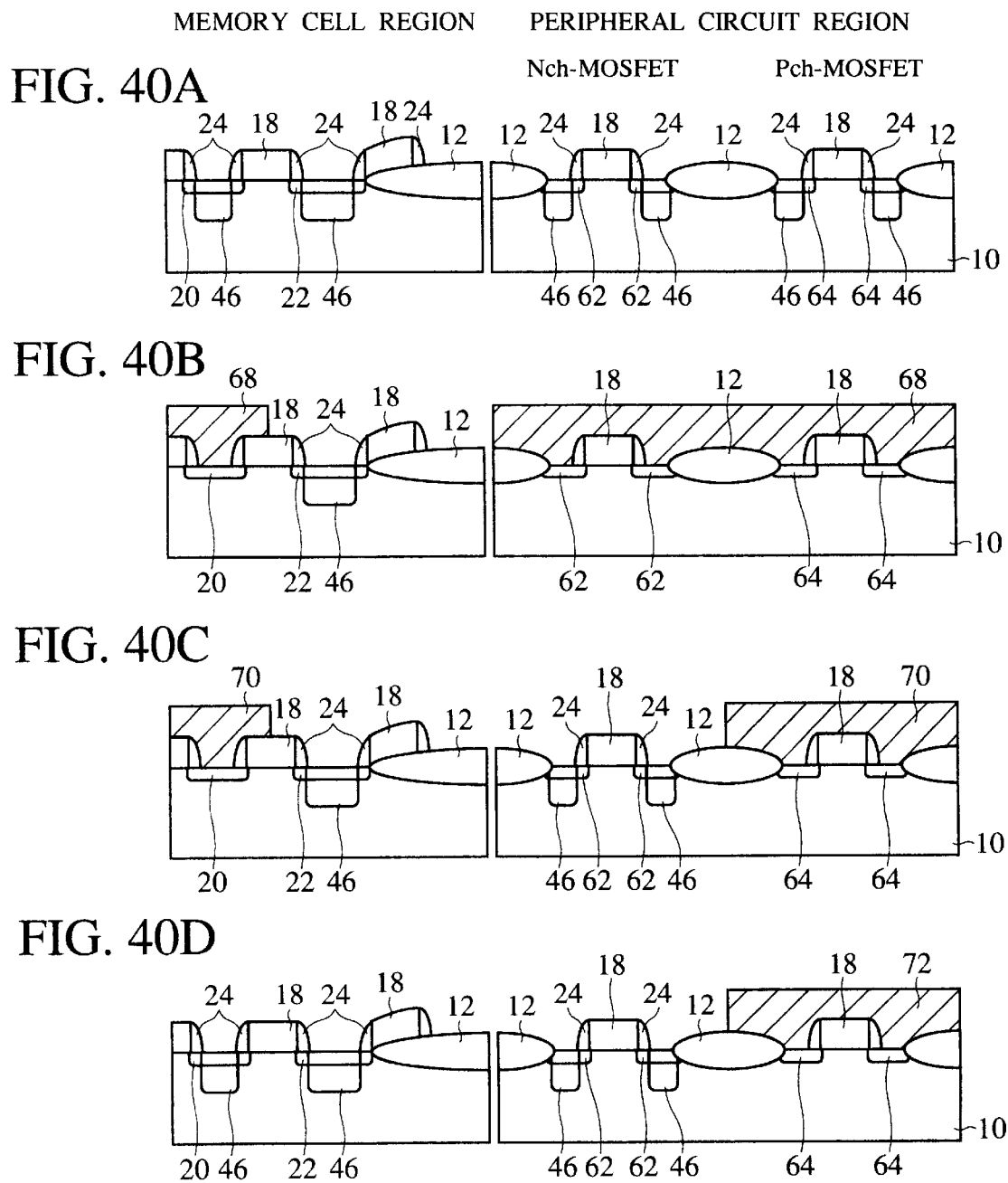

METHOD OF MAKING A DRAM WITH A TRANSFER TRANSISTOR

BACKGROUND OF THE INVENTION

The present invention relates to a semiconductor device and a method for fabricating the semiconductor device.

A DRAM (Dynamic Random Access Memory) is a semiconductor memory device comprising cells each including one transistor and one capacitor and which can be large-scaled and highly integrated, and various structures of the DRAM have been conventionally proposed.

The general structure of the DRAM will be explained with reference to FIG. 41. FIG. 41 is a sectional view of the general DRAM cell.

A cell of the DRAM is constituted by one MOSFET (Metal Oxide Semiconductor Field Effect Transistor), and one capacitor. The capacitor is constituted by a storage electrode 128, a dielectric film 130 and an opposed electrode 132. The storage electrode 128 is connected to the source/drain diffused layer 112 of the MOSFET. A bit line 120 is connected to the source/drain diffused layer 110.

A charge stored in the capacitor is outputted to the bit line by turning on the MOSFET and is amplified by a sense amplifier (not shown) to be judged a signal "1" or "0".

However, a charge stored in the capacitor decreases by leak current mainly due to the p-n junction. Accordingly, the so-called refresh operations of rewriting a signal of the cell at a certain time interval are necessary. With a short data retention time of the cell, frequent refresh operations are necessary with a result of large electric power consumption. Thus, it is important for the DRAM that a large interval between the refresh operations, i.e., respective cells have a long data retention time.

Then, a method for fabricating the general DRAM will be explained with reference to FIGS. 42A–42D and 43A–43C. FIGS. 42A–42D and 43A–43C are sectional views of the general DRAM in the steps of the method for fabricating the same, which shown the method.

First, a device isolation film 102 of a thick oxide film is formed on a p-type silicon substrate 100 by LOCOS (LOCal Oxidation of Silicon) to define an active region 104. A p-well may be formed in the silicon substrate 100 before or after the device isolation film 102 is formed.

Then, a gate oxide film 106 is formed in the active region 104 by thermal oxidation, and then a conducting layer of a laminated film structure of, e.g., polycrystalline silicon and metal silicide which is to be a gate electrode 108 is grown and is patterned to form the gate electrode of a MOSFET. The gate electrode 108 also constitutes a word line.

Subsequently, an n-type diffused layer which is to be a source/drain diffused layer 110, 112 is formed by ion implantation. For example, phosphorus (P) ions are implanted at 30 keV acceleration energy and a $2 \times 10^{13}$ cm$^{-2}$ dose (FIG. 42A).

Then, an insulation film is grown on the entire surface and is etched by RIE (Reactive Ion Etching) to form a spacer 114 on the side walls of the gate electrode 108 (FIG. 42B).

Next, an insulation film 116 is formed on the entire surface, and a contact hole 118 is formed on one of the source/drain diffused layer 110. The insulation film 116 functions as an inter-layer insulation film.

Subsequently, a bit line 120 connected to the source/drain diffused layer 110 through the contact hole 118 is formed (FIG. 42C).

Then an insulation film 122 is formed on the silicon substrate (FIG. 42D), and a storage electrode contact hole 124 is opened on the other source/drain diffused layer 112 (FIG. 43A). The insulation film 122 functions as an inter-layer insulation film.

Next, with the insulation film 122 as a mask, n-type impurity ions are implanted in the silicon substrate immediately below the storage electrode contact hole 124 to form a diffused layer 126.

Subsequently, a storage electrode 128 connected to the source/drain diffused layer 112 through the storage electrode contact hole 124, a dielectric film 130 and an opposed electrode 132, and a capacitor constituted by the storage electrode 128, the dielectric film 130 and the opposed electrode 132 is formed.

Thus, a memory cell comprising one transistor and one capacitor is formed.

Then, an insulation film 134, a metal interconnection 136, a cover insulation film 138, etc. are formed, and the DRAM shown in FIG. 41 is formed.

The capacitor formed thus stacked on the MOSFET is called a stacked capacitor.

Techniques for implanting n-type impurity ions into the substrate immediately below the storage electrode contact hole 124 after the storage electrode contact hole 124 is opened are described in, e.g., Japanese Laid-Open Patent Application No. 06-61451 and Japanese Laid-Open Patent Application No. 09-69616.

In Japanese Laid-Open Patent Application No. 06-61451, in the contact between the storage electrode 128 and the silicon substrate 100, the impurity diffusion is unstable from the storage electrode 128 into the silicon substrate 100, depending on a state of the interface, with a result that a data retention time becomes short. As means for solving this problem, the technique of implanting in advance impurity ions in the silicon substrate 100 in the storage electrode contact hole 124. This corresponds to the diffused layer 126 in the method for fabricating a semiconductor device shown in FIGS. 42A–42D and 43A–43C.

Japanese Laid-Open Patent Application No. 09-69616 discloses the technique of retaining an impurity concentration low below the storage node by an impurity implanted through the storage electrode contact hole 124 to make a concentration gradient blunt, whereby an electric filed intensity at the junction is mitigated to obtain improved data retention characteristics. It is already known in, e.g., Japanese Laid-Open Patent Application No. 06-61486 that an electric field of the storage node is mitigated to thereby obtain improved data retention characteristics.

Japanese Laid-Open Patent Application No. 62-238661 discloses the art of forming an n-type diffused layer of a low concentration below a heavily doped n-type diffused layer.

However, the above-described conventional semiconductor device structures and the method for fabricating the same are insufficient in the following points to make the data retention time of the capacitor long.

Firstly, by simply implanting ions through the storage electrode contact hole 124 the above-described two problems, i.e., the unstable impurity diffusion from the storage electrode 128 into the substrate due to interface states, and the electric field mitigation of the storage node cannot be solved.

Secondly, the technique of implanting ions through the storage electrode contact hole 124 cannot mitigate the electric field only immediately below the storage electrode contact hole 124. However, junction leak, which causes decrease of a data retention time can occur in all the diffused layer. Accordingly, decrease of the junction leak only immediately below the storage electrode contact hole as in the above-described conventional semiconductor device fabrication method is still insufficient.

Japanese Laid-Open Patent Application No. 62-238661 discloses a lightly doped n-type diffused layer is provided but does not detail its arrangement. If the lightly doped n-type diffused layer is provided by photolithography using a resist film as a mask, the lightly doped n-type diffused layer is displaced due to displacement or other causes of the photolithography, which rather causes device disuniformity.

SUMMARY OF THE INVENTION

An object of the present invention is to provide a semiconductor device and method for fabricating the same which can satisfy both requirements of solving the unstable impurity diffusion from the storage electrode into the semiconductor substrate caused by interface states and of mitigating the electric field of the storage node.

The above-described object is achieved by a semiconductor device comprising: a semiconductor substrate; a transfer transistor including a gate electrode formed on the semiconductor substrate through a gate insulation film, and a first diffused layer formed in the semiconductor substrate on both sides of the gate electrode; an insulation film which covers an upper surface of the transfer transistor and in which a contact hole reaching the first diffused layer is opened; a capacitor formed on the insulation film and connected to the first diffused layer through the contact hole; a second diffused layer formed in the semiconductor substrate below the contact hole and being the same conduction type as the first diffused layer; and a third diffused layer formed in the semiconductor substrate below the contact hole, formed extending to a region which is deeper than the first and the second diffused layers, and having the same conduction type as the first diffused layer. The semiconductor device of this structure can solve both problems of unstable impurity diffusion from the storage electrode into the semiconductor substrate, which results from an interface state, and mitigation of the electric field mitigation in the storage node, whereby the DRAM can have improved data retention characteristics.

In the above-described semiconductor device, it is preferable that the third diffused layer is less heavily doped than the first diffused layer.

In the above-described semiconductor device, it is preferable that a part of the contact hole is passed through a device isolation film. A gap between the contact hole and the device isolation film is made small, and the DRAM can be accordingly small-sized. On the other hand, however, the contact hole is often opened on the device isolation film due to, e.g., lithographic displacement or others. According to the present invention, even in a case that the contact hole is passed through the device isolation film, because of the second and the third diffused layers, increase of leak current between the storage electrode and the semiconductor substrate can be prevented.

In the above-described semiconductor device, it is preferable that the second diffused layer and the third diffused layer are diffused layers is formed by ion implantation.

The above-described object is also achieved by a semiconductor device comprising: a semiconductor substrate; a transfer transistor including a gate electrode formed on the semiconductor substrate through a gate insulation film, and a first diffused layer formed in the semiconductor substrate on both sides of the gate electrode; a spacer which covers a side wall of the gate electrode; an insulation film which covers an upper surface of the transfer transistor and in which a contact hole reaching the first diffused layer is opened; a capacitor formed on the insulation film and connected to the first diffused layer through the contact hole; and a second diffused layer formed in alignment with the gate electrode and the spacer, formed in the semiconductor substrate in a region where the capacitor and the first diffused layer are connected to each other, formed extending to a region which is deeper than the first diffused layer, and having the same conduction type as the first diffused layer. The semiconductor device of this structure can mitigate an electric field in the storage node, and the DRAM can have improved data retention characteristics.

The above-described object is also achieved by a semiconductor device comprising: a semiconductor substrate; a transfer transistor including a gate electrode formed on the semiconductor substrate through a gate insulation film, and a first diffused layer formed in the semiconductor substrate on both sides of the gate electrode; an insulation film which covers an upper surface of the transfer transistor and in which a contact hole reaching the first diffused layer is opened; a capacitor formed on the insulation film and connected to the first diffused layer through the contact hole; and a second diffused layer formed in alignment with the gate electrode, formed in the semiconductor substrate in a region where the capacitor and the first diffused layer are connected to each other and formed extending to a region which is deeper than the first diffused layer, and having the same conduction type as the first diffused layer. The semiconductor device of the structure can mitigate an electric field in the storage node, whereby the DRAM can have improved data retention characteristics.

In the above-described semiconductor device, the second diffused layer can improve data retention characteristics as long as the second diffused layer is formed on the side of at least the storage node. However, the second diffused layer may be formed in the semiconductor substrate on both sides of the gate electrode, whereby the fabrication process of the semiconductor device can be simple.

In the above-described semiconductor device, it is preferable that the first diffused layer is formed in alignment with the gate electrode.

In the above-described semiconductor device, it is preferable that the device further comprises: an n-channel transistor including a gate electrode formed on the semiconductor substrate through a gate insulation film; a spacer covering a side wall of the gate electrode; a third diffused layer formed in the semiconductor substrate on both sides of the gate electrode; and a fourth diffused layer formed in alignment with the gate electrodes and the spacer and being more heavily doped than the first and the second diffused layers, and the n-channel transistor being formed in a peripheral circuit region adjacent to a memory cell region of the semiconductor substrate where a memory cell including the transfer transistor and the capacitor is formed; a p-channel transistor including a gate electrode formed on the semiconductor substrate through a gate insulation film; a spacer covering a side wall of the gate electrode; and a fifth diffused layer formed in the semiconductor substrate on both sides of the gate electrode, and the p-channel transistor being formed in the peripheral circuit region. The semiconductor device of the structure can optimize characteristics of the transistor formed in the peripheral circuit region, and those of the transfer transistor independently of each other.

In the above-described semiconductor device, it is preferable that the n-channel transistor further comprises a sixth diffused layer which is formed in alignment with the gate electrode and the spacer and having an impurity distribution which is substantially the same as the second diffused layer. Because the sixth diffused layer having substantially the same impurity distribution as the second diffused layer for mitigating an electric field in the storage node is formed in the n-channel transistor, an electric field in the source/drain diffused layer of the n-channel transistor can be also mitigated. Resultantly leak current of the n-channel transistor can be reduced.

In the above-described semiconductor device, it is preferable that the n-channel transistor further comprises a sixth diffused layer which is formed in alignment with the gate electrode and having an impurity distribution which is substantially the same as the second diffused layer. Because the sixth diffused layer having substantially the same impurity distribution as the second diffused layer for mitigating an electric field in the storage node is formed in the n-channel transistor, an electric field in the source/drain diffused layer of the n-channel transistor can be also mitigated. Resultantly, leak current of the n-channel transistor can be reduced.

In the above-described semiconductor device, it is preferable that the p-channel transistor further comprises a seventh diffused layer which is formed in alignment with the gate electrode and the spacer and having an impurity distribution which is substantially the same as the second diffused layer. Because the seventh diffused layer having substantially the same impurity distribution as the second diffused layer for mitigating an electric field in the storage node is formed in the p-channel transistor, it is not necessary to form a photoresist as a mask in the ion implantation step of forming the second diffused layer. The second diffused layer can be formed without increasing lithography steps.

In the above-described semiconductor device, it is preferable that the second diffused layer is not more heavily doped than the first diffused layer.

In the above-described semiconductor device, it is preferable that the second diffused layer is formed by doping phosphorus to the semiconductor substrate. The use phosphorus, whose atomic mass is relatively small, as an impurity for the ion implantation enables the second diffused layer to be formed, depressing damage to the semiconductor substrate, and accordingly the semiconductor device can have reduced leak current.

In the above-described semiconductor device, it is preferable that the contact hole is formed in self-alignment with the gate electrode. The structure of the semiconductor device is usable in forming the contact hole by self-alignment.

In the above-describe semiconductor device, it is preferable that the device further comprises: a third diffused layer formed in the semiconductor substrate below the contact hole and having the same conduction type as the first diffused layer. The structure of the semiconductor device can solve unstable impurity diffusion from the storage electrode to the semiconductor substrate due to an interface state.

In the above-described semiconductor device, it is preferable that the device further comprises: a device isolation region formed of an insulation film buried in a trench formed in the semiconductor substrate. The device isolation region formed by the trench isolation method can have a large film thickness independent of a device isolation gap, whereby in the ion implantation steps of forming the deep diffused layers for the electric field mitigation, a thickness of the device isolation film can be easily controlled so that implanted ions cannot pass through.

The above-described object is also achieved by a method for fabricating a semiconductor device comprising: a gate electrode forming step of forming a gate electrode on a semiconductor device through a gate insulation film; a first ion implantation step of implanting ions into the semiconductor substrate with the gate electrode as a mask to form a first diffused layer in the semiconductor substrate on both sides of the gate electrode; an insulation film forming step of forming an insulation film on the entire surface of the semiconductor substrate; a contact hole forming step of forming a contact hole which reaches the first diffused layer in the insulation film; a second ion implantation step of implanting ions into the semiconductor substrate immediately below the contact hole with the insulation film as a mask to form a second diffused layer of the same conduction type as the first diffused layer; a third ion implantation step of implanting ions into the semiconductor substrate immediately below the contact hole with the insulation film as a mask to form a third diffused layer formed extending to a region which is deeper than the first and the second diffused layers, and having the same conduction type as the first diffused layer; and a capacitor forming step of forming a capacitor connected to the first diffused layer through the contact hole. The method for fabricating a semiconductor device can reduce unstable impurity diffusion from the storage electrode into the semiconductor substrate caused by an interface state, and an electric field in the storage node can be mitigated. The DRAM can have accordingly improved data retention characteristics.

In the above-described method for fabricating a semiconductor device, it is preferable that in the second implantation step and the third ion implantation step, phosphorus ions are implanted to form the second diffused layer and the third diffused layer. The use phosphorus, whose atomic mass is relatively small, as an impurity for the ion implantation enables the second diffused layer to be formed, depressing damage to the semiconductor substrate, and accordingly the semiconductor device can have reduced leak current.

In the above-described method for fabricating a semiconductor device, it is preferable that in the third ion implantation step, ions are implanted at a smaller dose than in the first ion implantation step.

The effects of the present invention are conspicuous especially in a case that in the contact hole forming step a part of the contact hole is opened passed through the device isolation region. A gap between the contact hole and the device isolation region is made small, whereby the DRAM can be small-sized. However, it is the more often a case that the contact hole is opened on the device isolation region by, e.g., lithographic displacement. According to the present invention, even in a case that the contact hole is formed, passed through the device isolation film, because of the second and the third diffused layers, increase of leak current from the storage electrode to the semiconductor substrate can be prevented.

The above-described object is also achieved by a method for fabricating a semiconductor device comprising: a gate electrode forming step of forming a gate electrode on a semiconductor substrate through a gate insulation film; a first ion implantation step of implanting ions into the semiconductor substrate with the gate electrode as a mask to form a first diffused layer in the semiconductor substrate on both sides of the gate electrode; a spacer forming step of forming a spacer on a side wall of the gate electrode; a second ion implantation step of implanting ions in the semiconductor substrate with the gate electrode and the spacer as a mask to form a second diffused layer which is formed extending to a region which is deeper than the first diffused layer and has the same conduction type as the first diffused layer; an insulation film forming step of forming an insulation film on the entre surface of the semiconductor substrate; a contact hole forming step of forming a contact hole which reaches the first diffused layer in the insulation film; and a capacitor forming step of forming a capacitor connected to the first diffused layer through the contact hole. The method for fabricating a semiconductor device can mitigate an electric field in the storage node and improve data retention characteristics of the DRAM.

The above-described object is also achieved by a method for fabricating a semiconductor device comprising: a gate electrode forming step of forming a gate electrode on a semiconductor substrate through a gate insulation film; a first ion implantation step of implanting ions into the semiconductor substrate with the gate electrode as a mask to form a first diffused layer in the semiconductor substrate on both sides of the gate electrode; a second ion implantation step of implanting ions into the semiconductor substrate with the gate electrode as a mask to form a second diffused layer formed extending to a region which is deeper than the first diffused layer and having the same conduction type as the first diffused layer; an insulation film forming step of forming an insulation film on the entire surface of the semiconductor substrate; a contact hole forming step of forming a contact hole which reaches the first diffused layer in the insulation film; and a capacitor forming step of forming a capacitor connected to the first diffused layer through the contact hole. The method for fabricating a semiconductor device can mitigate an electric field in the storage node and improve data retention characteristics of the DRAM.

In the above-described method for fabricating a semiconductor device the second diffused layer is formed on the side of, e.g., the storage node in the second ion implantation step, whereby data retention characteristics can be improved. It is possible that the second diffused layer is formed in the semiconductor substrate on both sides of the gate electrode, which allows the semiconductor device fabrication process to be simplified.

In the above-described method for fabricating a semiconductor device, it is preferable that the method further comprises before the insulation film forming step, a third ion implantation step of implanting ions into an n-channel transistor forming region of a peripheral circuit region at a large dose than in the first ion implantation step and the second ion implantation step with a gate electrode of the n-channel transistor and a spacer formed on a side wall of the gate electrode to form a third diffused layer which is more heavily doped than the first and the second diffused layers. The method for fabricating a semiconductor device can optimize characteristics of the n-channel transistor formed in the peripheral circuit region, and characteristics of the transfer transistor independently of each other.

In the above-described method for fabricating a semiconductor device, it is preferable that in the second ion implantation step, ion implantation is performed with the gate electrode of the n-channel transistor and the spacer formed on the side wall of the gate electrode as a mask to form in the n-channel transistor forming region a fourth diffused layer having substantially the same impurity distribution as the second diffused layer. By forming also in the n-channel transistor the fourth diffused layer having substantially the same impurity distribution as the second diffused layer for mitigating an electric field in the storage node, an electric field in the source/drain diffused layer of the n-channel transistor can be mitigated. This can reduce leak current of the n-channel transistor.

In the above-described method for fabricating a semiconductor device, it is preferable that in the second ion implantation step, ion implantation is performed with the gate electrode of the n-channel transistor as a mask to form in the n-channel transistor forming region a fourth diffused layer having substantially the same impurity distribution as the second diffused layer. By forming also in the n-channel transistor the fourth diffused layer having substantially the same impurity distribution as the second diffused layer for mitigating an electric field in the storage node, an electric field in the source/drain diffused layer of the n-channel transistor can be mitigated. This can reduce leak current of the n-channel transistor.

In the above-described method for fabricating a semiconductor device, it is preferable that the method further comprises before the insulation forming step, a fourth ion implantation step of implanting ions into a p-channel transistor forming region of the peripheral circuit region with a gate electrode of the p-channel transistor and a spacer formed on a side wall of the gate electrode as a mask to form a fifth diffused layer, and wherein in the second ion implantation step, ion implantation is performed with the gate electrode of the p-channel transistor and the spacer formed on the side wall of the gate electrode as a mask to form in the p-channel transistor forming region a sixth diffused layer having substantially the same impurity distribution as the second diffused layer. By forming also in the p-channel transistor the sixth diffused layer having substantially the same impurity distribution as the second diffused layer for mitigating an electric field in the storage node, it is not necessary to form a photoresist as a mask in the ion implantation step of forming the second diffused layer, which enables the second diffused layer to be formed without increasing lithography steps.

In the above-described method for fabricating a semiconductor device, it is preferable that in the second ion implantation step, the ion implantation is performed at a smaller dose than in the first ion implantation step.

In the above-described method for fabricating a semiconductor device, it is preferable that in the second ion implantation step, phosphorus ions are implanted to form the second diffused layer. By implanting phosphorus ions, whose atomic mass is relatively small, in the second ion implantation step, increase of leak current due to damages by the implantation is depressed while an electric field in the storage node can be mitigated.

In the above-described method for fabricating a semiconductor device, it is preferable that in the contact hole forming step, the contact hole is opened in self-alignment with the gate electrode. The method for fabricating a semiconductor device is applicable to a case that the contact hole is opened by self-alignment.

In the above-described method for fabricating a semiconductor device, it is preferable that the method further comprises after the contact hole forming step, a fifth ion implantation step of implanting ions into the semiconductor substrate immediately below the contact hole with the insulation film as a mask to form a seventh diffused layer having the same conduction type as the first diffused layer. The method for fabricating a semiconductor device can solve unstable impurity diffusion from the storage electrode into the semiconductor substrate due to an interface state.

In the above-described method for fabricating a semiconductor device, it is preferable that the method further comprises before the gate electrode forming step, a device isolation region forming step of forming a trench in the semiconductor substrate in a device isolation region, and burying an insulation film in the trench to form a device isolation film of the insulation film buried in the trench. The device isolation film formed by the trench isolation method can have a large film thickness independent of a device isolation gap, whereby in the ion implantation steps of forming the deep diffused layers for the electric field mitigation, a thickness of the device isolation film can be easily controlled so that implanted ions cannot pass through.

BRIEF DESCRIPTION OF THE DRAWINGS

FIG. 5 is a graph of relationships between ion implantation energy and dose, and electric field intensities in the semiconductor substrate.

FIGS. 40A–40D are sectional views of the semiconductor device according to one variation of the eleventh embodiment in the steps of the method for fabricating the same, which show the method.

DETAILED DESCRIPTION OF THE INVENTION

[A First Embodiment]

The semiconductor device and the method for fabricating the same according to a first embodiment of the present invention will be explained with reference to FIGS. 1, 2A–2B, 3A–3D, 4A–4C, 5, 6 and 7.

Figure 1:
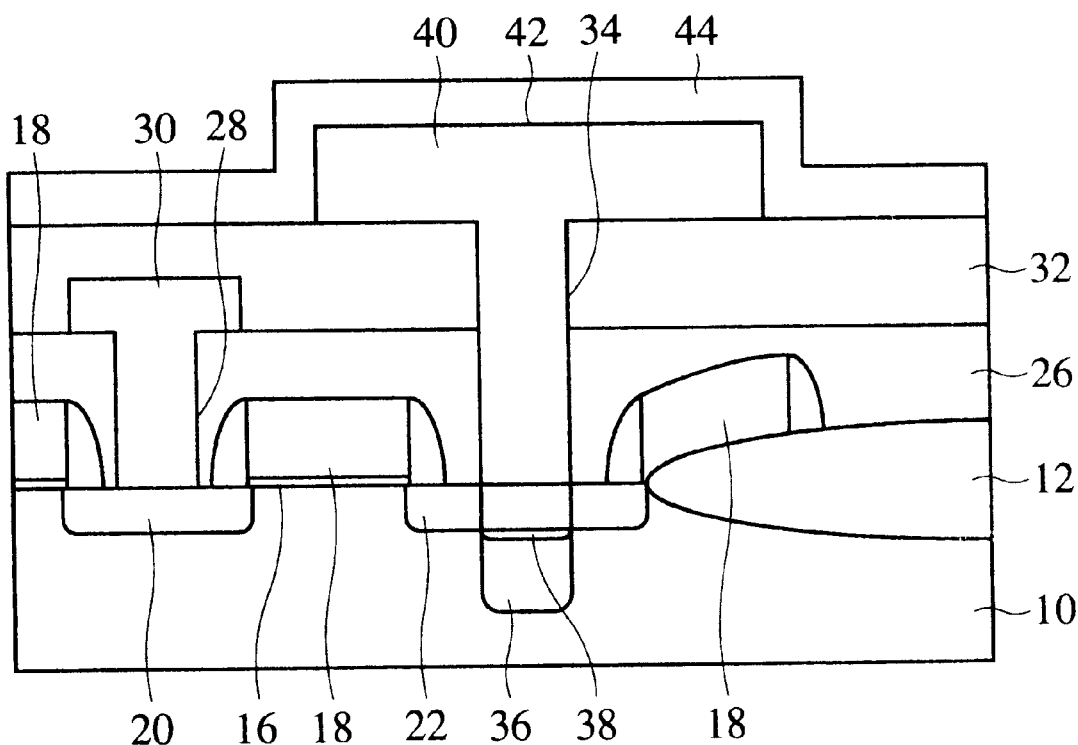
FIG. 1 is a diagrammatic sectional view of the semiconductor device according to a first embodiment, which shows a structure thereof.
Figure 2A:
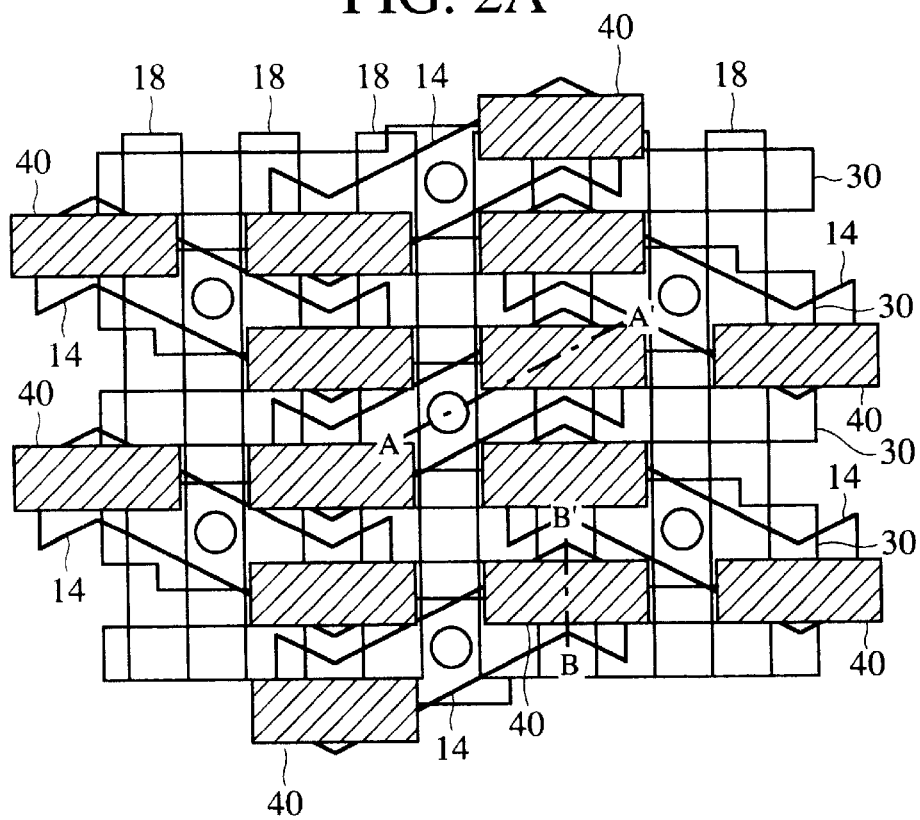
FIGS. 2A and 2B are plan views of the semiconductor device according to the first embodiment, which show the structure thereof.
Figure 2B:
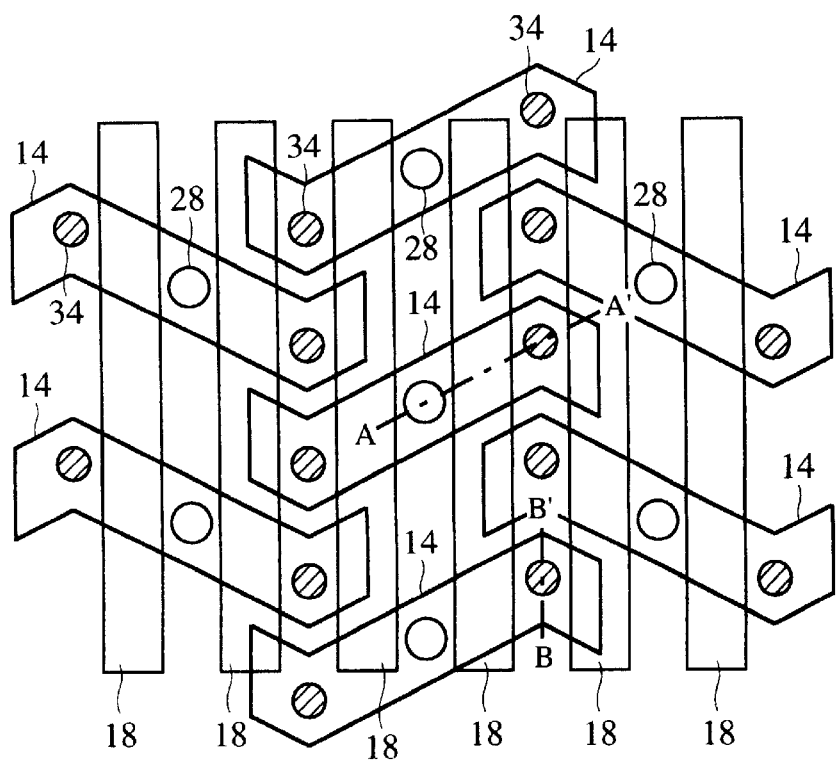
Figure 6:
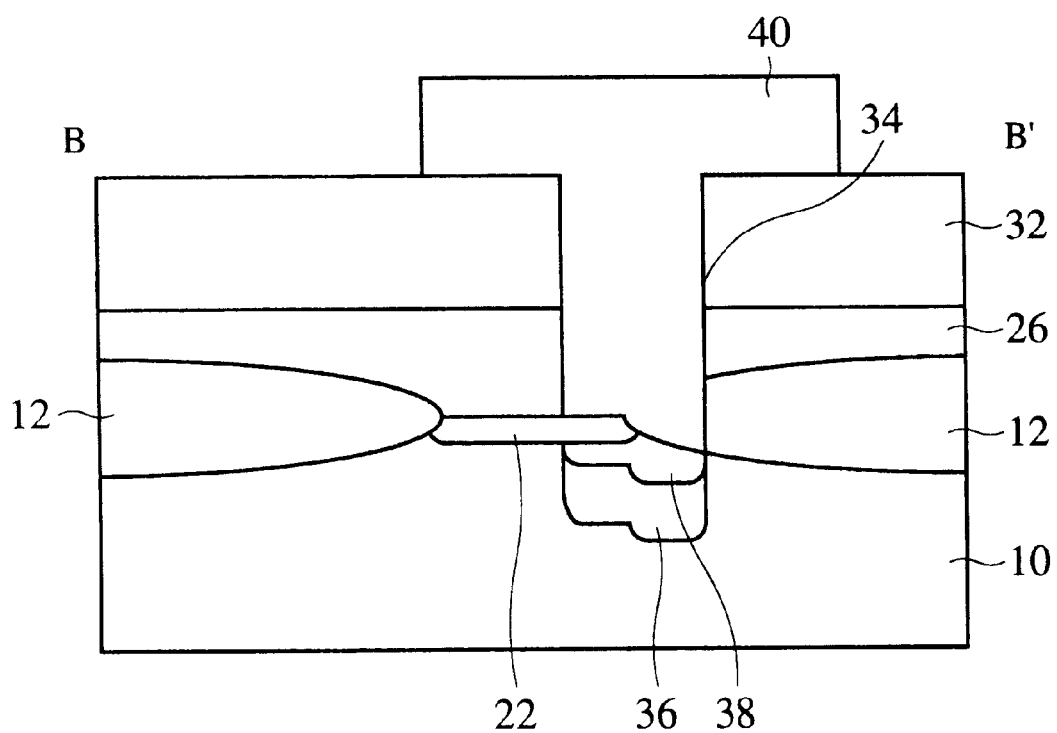
FIG. 6 is a view explaining effects of the method for fabricating the semiconductor device according to the first embodiment of the present invention.
Figure 7:
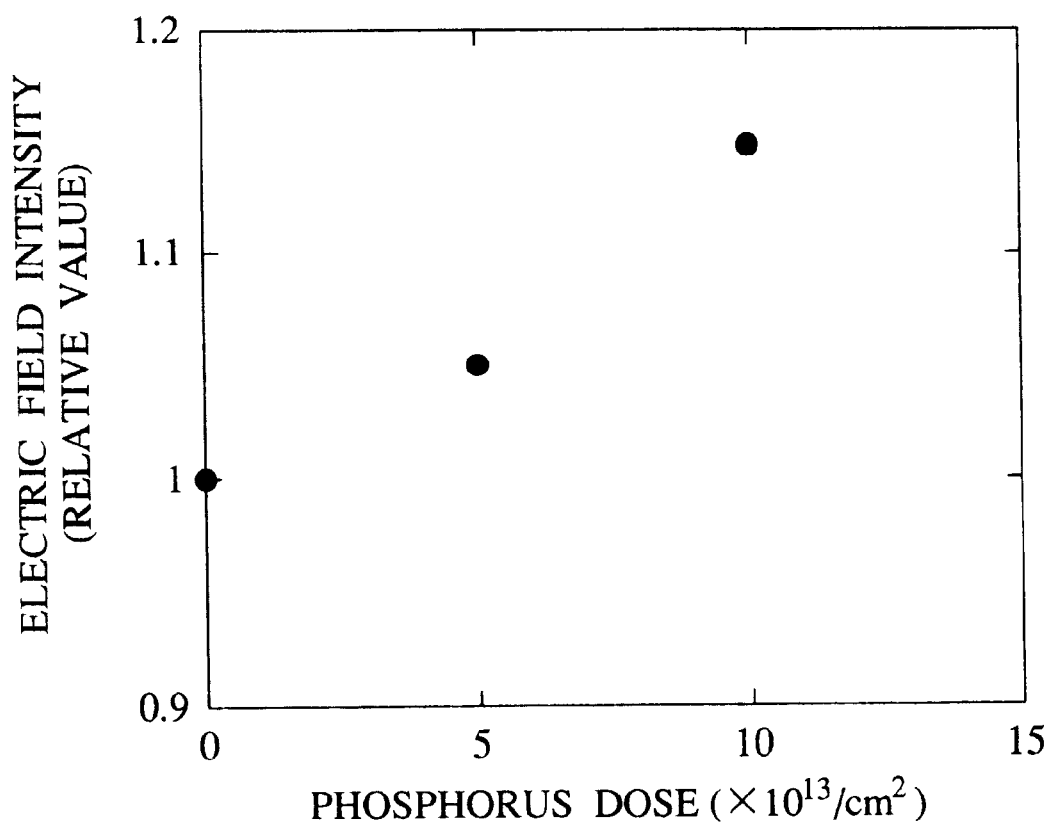
FIG. 7 is a graph of relationships between ion implanted phosphorus doses and electric field intensities.

FIG. 1 is a diagrammatic sectional view of the semiconductor device according to the present embodiment, which shows a structure thereof. FIGS. 2A and 2B are plan views of the semiconductor device according to the present embodiment, which show the structure thereof. FIGS. 3A–3D and 4A–4C are sectional views of the semiconductor device according to the present embodiment in the steps of the method for fabricating the same, which show the method. FIG. 5 is a graph showing relationships between ion implantation energies and doses, and electric field intensities in the semiconductor substrate. FIG. 6 is a view explaining effects of the semiconductor device and the method for fabricating the same according to the present embodiment. FIG. 7 is a graph showing relationships between implanted phosphorus doses and electric field intensities.

First, the structure of the semiconductor device according to the present embodiment will be explained with reference to FIGS. 1 and 2A–2B.

A device isolation film 12 for defining an active region 14 is formed on a silicon substrate 10. A gate electrode 18 is formed on the silicon substrate in the active region 14 through a gate insulation film 16. A source/drain diffused layers 20, 22 are formed in a device region, separate from each other on both sides of the gate electrode 18. Thus, a MOSFET comprising a gate electrode 18, and source/drain diffused layers 20, 22 is formed. The MOSFET functions as a transfer transistor of a DRAM, and the gate electrode 18 functions as a word line which is a gate electrode of a number of transfer transistors arranged vertically as viewed in the drawing (FIG. 2A).

An insulation film 26 which functions as an inter-layer insulation film is formed on the silicon substrate 10 with the MOSFET formed on. A contact hole 28 for exposing the source/drain diffused layer 20 is opened in the insulation film 26. A bit line 30 is formed on the insulation film 26, connected to the source/drain diffused layer 20 through the contact hole 28.

An insulation film 32 which functions as an inter-layer insulation film is formed on the insulation film 26. A storage electrode contact hole 34 for exposing the source/drain diffused layer 22 is formed in the insulation films 26, 32. A storage electrode 40 is formed on the insulation film 32, connected to the source/drain diffused layer 22 through the storage electrode contact hole 34. An opposed electrode 44 is formed on the storage electrode 40 through a dielectric film 42. Thus, a capacitor comprising the storage electrode 40, the dielectric film 42 and the opposed electrode 44 is formed.

Thus, the DRAM is constituted by memory cells each comprising one MOSFET and one capacitor.

The semiconductor device according to the present embodiment is characterized in that a structure of diffused layers provided in the region where the storage electrode 40 and the source/drain diffused layer 22 is connected to each other.

That is, the semiconductor device according to the present embodiment is characterized in that a diffused layer 38 for compensating possible insufficient impurity diffusion from the storage electrode 40 into the silicon substrate 10 and a diffused layer 36 for mitigating electric fields in the storage node are formed in the silicon substrate in the region where the storage electrode 40 and the source/drain diffused layer 22 are connected to each other.

The diffused layer 38 acts to prevent decrease of a data retention time when solid phase diffusion from the storage electrode 40 into the silicon substrate 10 is unstable, and is disposed on substantially the same level of depth as the source/drain diffused layer 22. A dose of ion implantation is approximately $5 \times 10^{12} - 5 \times 10^{14}$ cm$^{-2}$.

The diffused layer 36 for mitigating an electric field of the storage node is formed at a deeper level than the source/drain diffused layer 22 and a concentration of the diffused layer 36 is lower than that of the source/drain diffused layer 22 for the purpose thereof.

Two kinds of diffused layers 36, 38 are thus provided in the contact region between the storage electrode 40 and the source/drain diffused layer 22, whereby the semiconductor device can meet both requirements of restraining the influences of unstable impurity diffusion from the storage electrode 40 into the silicon substrate 10 caused by interface states and mitigating an electric field at the storage node.

Then, the method for fabricating the semiconductor device according to the present embodiment will be detailed.

First, the device isolation film 12 is formed on the p-type silicon substrate 10 by, e.g., LOCOS method to define the active region 14. A p-well may be formed in the silicon substrate 10 before or after the device isolation film 12 is formed.

Then, the gate insulation film 16 of a silicon oxide film is formed in the active region 14 by thermal oxidation method.

Subsequently, a conducting layer to be the gate electrode, e.g., a laminated film of a polycrystalline silicon film and a metal silicide film, is formed on the gate insulation film 16 by, e.g., CVD method and is patterned to form the gate electrode 18 of the transfer transistor. The gate electrode 18 also functions as a word line which functions as a gate electrode of a number of transfer transistors arranged vertically of the drawing.

Figure 3A:
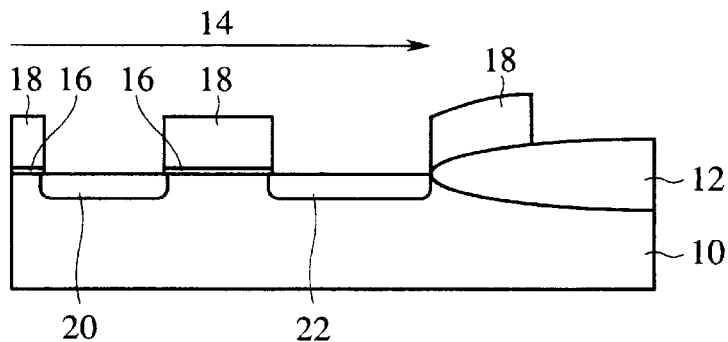
FIGS. 3A–3D and 4A–4C are sectional views of the semiconductor device according to the first embodiment in the steps of the method for fabricating the same, which show the method.

Then, donor ions are implanted with the gate electrode 18 and the device isolation film 12 as a mask to form an n-type diffused layer in a region which is to be the source/drain diffused layers 20, 22. In the ion implantation, P (phosphorus) ions, for example, are implanted at a 30 keV acceleration energy and a $2 \times 10^{13}$ cm$^{-2}$ dose (FIG. 3A).

The impurity as implanted is not sufficiently activated and later requires a heat treatment. Accordingly, to be strict, the source/drain diffused layers 20, 22 are not formed immediately after the ion implantation, but for the convenience of explanation, in the specification of the present application the region immediately after the ion implantation is called also the source/drain diffused layer. This is the same with the other impurity diffused layers.

Figure 3B:
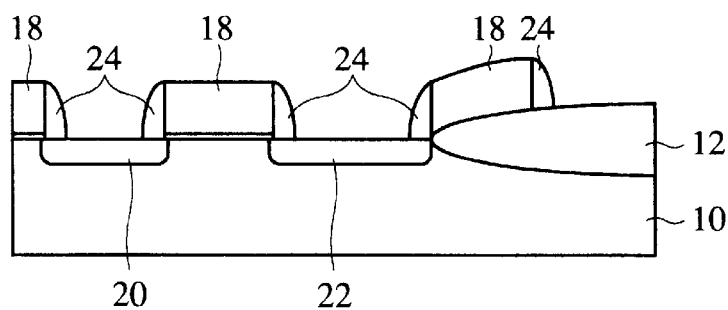

Then, an insulation film is formed on the entire surface of the silicon substrate 10 by, e.g., CVD method and is etched by RIE (Reactive Ion Etching) to form a spacer 24 on the side walls of the gate electrode 18 (FIG. 3B).

Subsequently, the insulation film 26 is formed by, e.g., CVD method. The insulation film 26 functions as an inter-layer insulation film.

Then, the contact hole 28 for exposing the source/drain diffused layer 20 is opened in the insulation film 26 by the usual lithography and etching techniques.

Figure 3C:
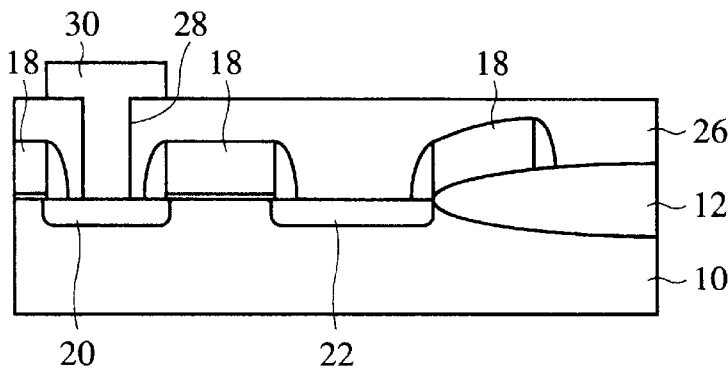

Next, a conducting film is deposited on the insulation film and patterned to form the bit line 30 connected to the source/drain diffused layer 20 through the contact hole 28 (FIG. 3C).

Figure 3D:
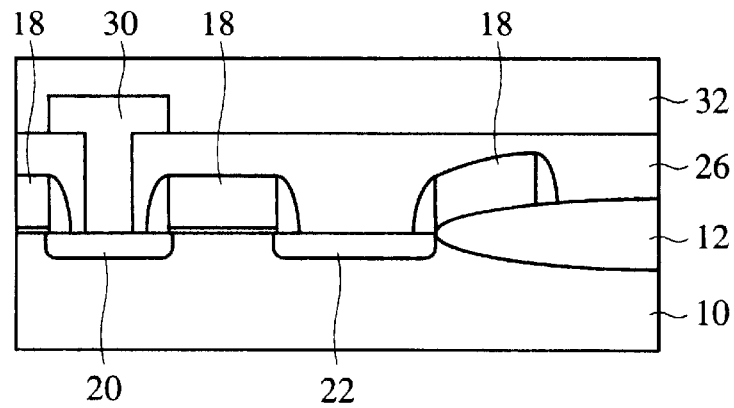

Then, the insulation film 32 is formed on the entire surface by, e.g., CVD method (FIG. 3D). The insulation film 32 functions as an inter-layer insulation film.

Figure 4A:
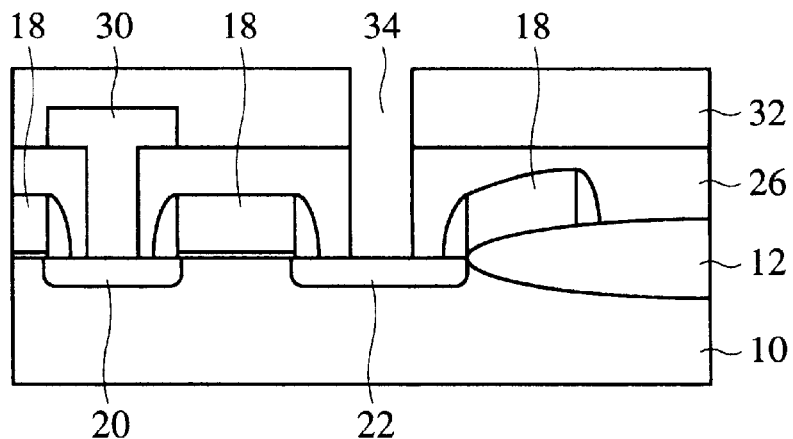

Subsequently, the storage electrode contact hole 34 for exposing the source/drain diffused layer 22 is opened in the insulation films 32, 26 by the usual lithography and etching techniques (FIG. 4A).

Figure 4B:
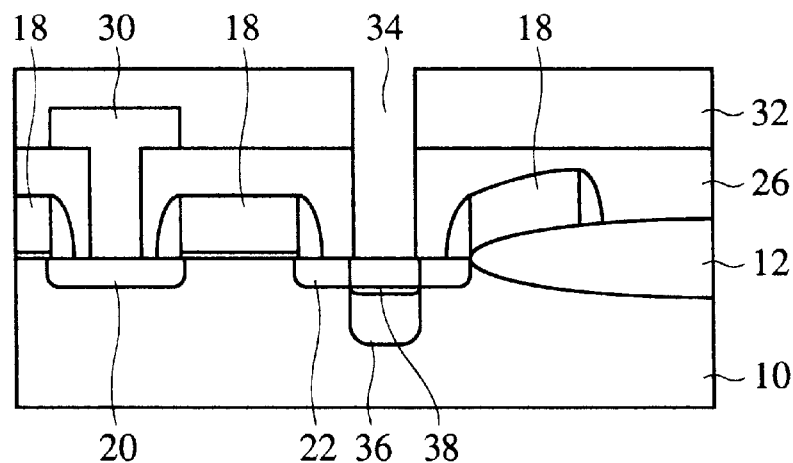

Then, n-type impurity ions are implanted in the substrate immediately below the contact hole 34 with the insulation film 32 as a mask to form the diffused layers 36, 38. The diffused layers 36, 38 are formed under conditions different from each other (FIG. 4B).

It is possible that the resist film used in opening the contact hole 34 is left to be used as the mask for the ion implantation.

The first ion implantation for forming the diffused layer 36 is performed by implanting, e.g., phosphorus ions at a 100 keV acceleration energy and a $5\times10^{12}$ cm$^{-2}$ dose. The second ion implantation for forming the diffused layer 38 is performed by implanting, e.g., phosphorus ions at 30 keV acceleration energy and a $5\times10^{13}$ cm$^{-2}$ dose. The first and the second ion implantation may be replaced by each other.

Here, the ground for determining the ion implantation will be detailed.

FIG. 5 shows maximum electric field intensities in the silicon substrate 10 immediately below the contact hole 34 in cases that phosphorus ions were implanted in the silicon substrate 10 through the storage electrode contact hole 34 respectively at 60 keV acceleration energy and 100 keV acceleration energy. The source/drain diffused layers 20, 22 was formed by implanting phosphorus ions at 30 keV acceleration energy and a $2\times10^{13}$ cm$^{-2}$ dose. The electric fields were computed by simulation model. The electric field intensities are indicated by relative values with respect to an electric field intensity indicated by 1 of a case that the ion implantation was not performed.

In FIG. 5, it is found that a 3 to $7\times10^{12}$ cm$^{-2}$ dose at energy as high as about 100 keV is necessary to mitigate the electric field The electric field mitigation is not sufficient at about 60 keV acceleration energy. The purpose of mitigating the electric field is achieved by broadening the distribution of the diffused layers, and to this end, higher acceleration energy and a smaller dose than those of the ion implanting conditions for forming the source/drain diffused layers 20, 22 are necessary.

The first ion implantation is performed by implanting phosphorus ions at 100 keV acceleration energy and a $5\times10^{12}$ cm$^{-2}$ dose, whereby the electric field can be mitigated.

When phosphorus ions are implanted at 100 keV, a projection range Rp of the ions is about 0.12 μm, and a standard deviation ARP was about 0.05 μm. Accordingly, the phosphorus ions are not substantially implanted in the surface of the silicon substrate 10, i.e., in the region which is to be the interface between the storage electrode and the silicon substrate 10. If a dose of the first ion implantation is increased to sufficiently maintain a sufficient concentration in the interface, the electric field mitigating effect is deteriorated as shown in FIG. 5.

In the present embodiment, the second ion implantation is further performed by implanting phosphorus ions at 30 keV acceleration energy and a $5\times10^{13}$ cm$^{-2}$ dose. Thus, the phosphorus ions are sufficiently implanted in the region which is to be the interface between the storage electrode and the silicon substrate 10, whereby even when the impurity diffusion from the storage electrode is unstable, a data retention time does not decrease.

It is preferable that the acceleration energy for the second ion implantation is substantially the same as that for the ion implantation for forming the source/drain diffused layers 20, 22. When the implantation energy is too low, it is difficult to obtain a beam current because of characteristics of the implantation apparatus, and there is a risk that the electric field mitigating effect owing to the first ion implantation may be nullified when the implantation energy is too high.

Especially, the second ion implantation is significant when the storage electrode contact hole 34 is opened on the device isolation film 12 as shown in FIG. 6 due to the lithographic displacement or other causes.

In the case described in Japanese Laid-Open Patent Application No. 09-69616 that the first ion implantation alone is performed, the source/drain diffused layers 20, 22 is not present immediately below the storage electrode contact hole 34 opened in the device isolation film 12, and when the impurity diffusion from the storage electrode 40 into the silicon substrate 10 is insufficient, no p-n junction is formed, and large leak current take places. Here it is significant that the second ion implantation is performed to thereby form in advance the n-type diffused layer immediately below the storage electrode contact hole 34 opened in the device isolation film 12.

In the case described in Japanese Laid-Open Patent Application No. 06-61451 that the second ion implantation alone is performed, as shown in FIG. 5, the electric field mitigating effect cannot be obtained due to low acceleration energy. That is, FIG. 5 shows that the electric field mitigating effect is low even at 60 keV acceleration energy. It is presumed that at further low energy the electric field mitigating effect will be substantially absent.

What is a more serious problem is the possibility that the second ion implantation may make the electric field more intense. This is because in the second ion implantation ions are implanted under conditions which allow the vicinity of the surface of the silicon substrate 10 to be heavily doped, with a result that the source/drain diffused layers 20, 22 becomes heavily doped, and this makes the electric field more intense.

This will be explained with reference to FIG. 7. FIG. 7 is a graph showing maximum electric field intensity in a case that phosphorus ions were implanted in the silicon substrate 10 through the storage electrode contact hole 34 at 30 keV acceleration energy. The electric fields were computed by simulation model. The electric field intensities are indicated by relative values with respect to an electric field intensity indicated by 1 of the case that the ion implantation was not performed. In this calculation, the impurity diffusion from the storage electrode into the substrate is not considered. This is because this ion implantation is actually effective in a location where the diffusion from the storage electrode into the substrate is insufficient.

In FIG. 7, it is found that the phosphorus ion implantation at 30 keV acceleration energy increases the electric field with increases of the dose. That is, the disadvantage that the ion implantation for solving unstable impurity diffusion from the storage electrode causes the electric field increases occurs. To solve this disadvantage, relatively high energy ion implantation is necessary for the electric field mitigation.

The present invention is the first to have made it clear that, as described above, the first ion implantation and the second ion implantation are not so effective singly but are effective in combination to increase a data retention time.

It is preferable the first and the second ion implantation uses phosphorus rather than arsenic (As). This is because arsenic, the atomic mass is large, tends to have crystal defects due to the ion implantation, and there is a possibility that adversely the leak current will increases.

After the diffused layers 36, 38 are thus formed, a polycrystalline silicon film doped with phosphorus by, e.g., CVD method is deposited and patterned to form the storage electrode 40 connected to the source/drain diffused layer 22 through the storage electrode contact hole 34.

Figure 4C:
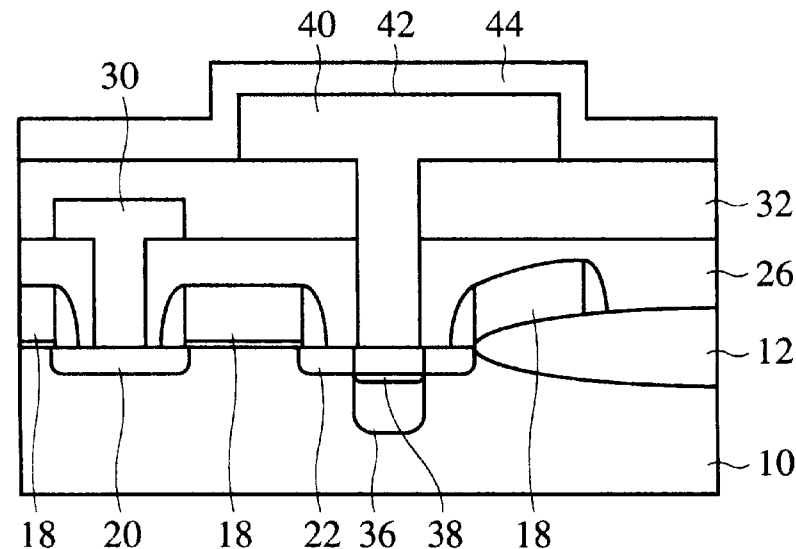

Then, the opposed electrode 44 is formed through the dielectric film 42, and the capacitor comprising the storage electrode 40, the dielectric film 42 and the opposed electrode 44 is formed (FIG. 4C). The capacitor shown in FIG. 4C is a capacitor formed, stacked on the MOSFET, the so-called stacked capacitor.

Then, an insulation film, metal interconnection, a cover insulation film, etc. are formed to form the DRAM comprising memory cells each including one transistor and one capacitor.

As described above, according to the present embodiment, the diffused layer 38 which compensates possible insufficient impurity diffusion from the storage electrode 40 into the silicon substrate 10, and the diffused layer 36 which mitigates the electric field are formed in the storage node, whereby the DRAM can have a longer data retention time. As results, the DRAM can have smaller electric power consumption, etc.

[A Second Embodiment]

The semiconductor device and the method for fabricating the same according to a second embodiment of the present invention will be explained with reference to FIGS. 8, 9A–9D and 10A–10C. The same members of the second embodiment as those of the semiconductor device and the method for fabricating the same according to the first embodiment are represented by the same reference numbers not to repeat or to simplify their explanation.

Figure 8:
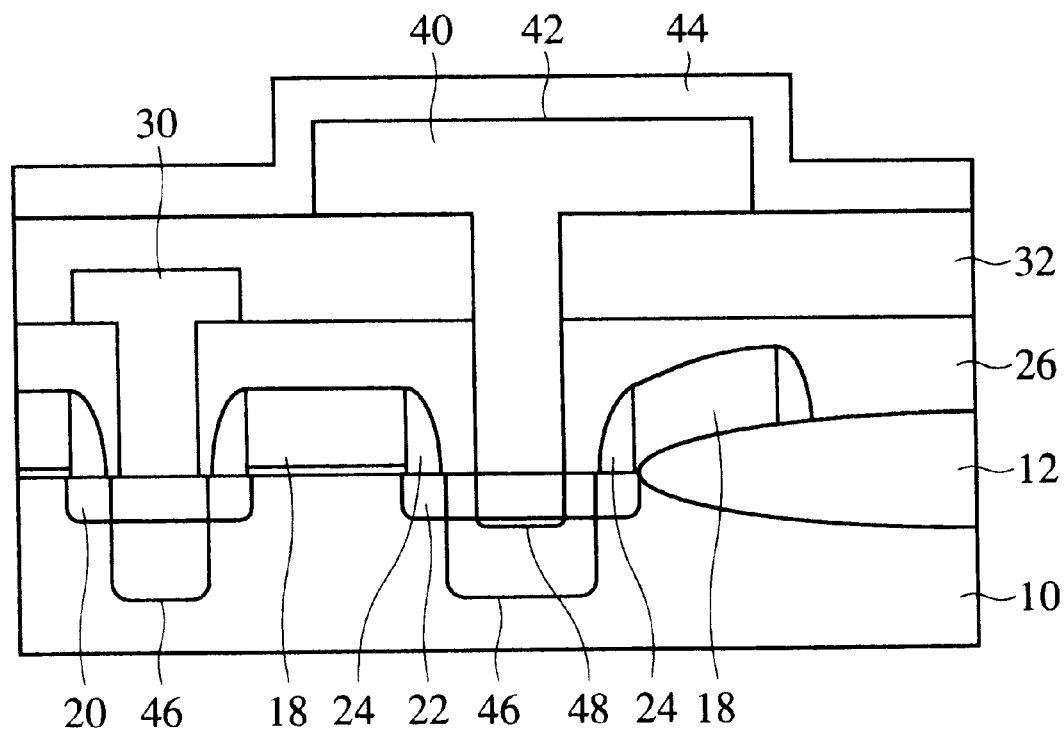
FIG. 8 is a diagrammatic sectional view of the semiconductor device according to a second embodiment of the present invention, which shows a structure thereof.

FIG. 8 is diagrammatic sectional view of the semiconductor device according to the present embodiment, which shows a structure thereof. FIGS. 9A–9D and 10A–10C are sectional views of the semiconductor device in the steps of the method for fabricating the semiconductor device, which show the method.

In the first embodiment, the diffused layers 36, 38 are formed through the storage electrode contact hole 34 to thereby compensate possible insufficient impurity diffusion from the storage electrode 40 into the silicon substrate 10 and mitigate an electric field in the storage node.

However, in the semiconductor device and the method for fabricating the same according to the first embodiment, because the diffused layers 36, 38 are formed by the ion implantation through the storage electrode contact hole 34, the diffused layers 36, 38 are formed only immediately below the storage electrode contact hole 34. In this case, the electric field is mitigated only immediately below the storage electrode contact hole 34, and from the viewpoint of mitigating the electric field it is preferable to form the diffused layer in a wider region.

The semiconductor device and the method for fabricating the same according to the present embodiment can compensate possible insufficient impurity diffusion from a storage electrode 40 into a silicon substrate 10 and effectively mitigate the electric field in the storage node.

As shown in FIG. 8, the semiconductor device according to the present embodiment is characterized in that a diffused layer 46 for mitigating the electric field is formed with a spacer 24 as a mask, and a diffused layer 48 for compensating possible insufficient impurity diffusion from the storage electrode 40 into the silicon substrate 10 is formed with the storage electrode contact hole 34 as a mask.

Then, the semiconductor device and the method for fabricating the same according to the present embodiment will be detailed in accordance with the fabrication steps.

Figure 9A:
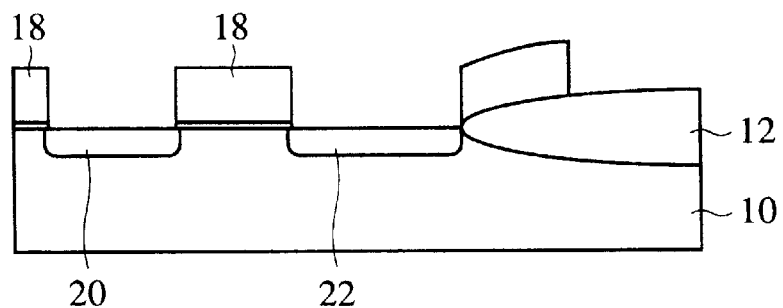
FIGS. 9A–9D and 10A–10C are sectional views of the semiconductor device according to the second embodiment in the steps of the method for fabricating the same, which show the method.

First, in the same way as in the method for fabricating the semiconductor device according to, e.g., the first embodiment shown in FIG. 3A, a transfer transistor is formed on a silicon substrate 10 (FIG. 9A).

Figure 9B:
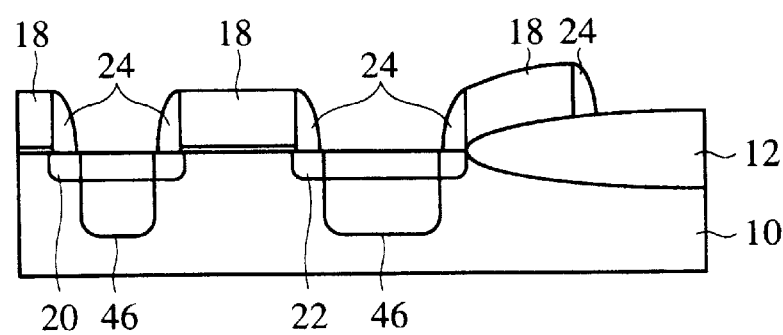

Then, an insulation film is grown on the entire surface of the silicon substrate 10 by, e.g., CVD method and is etched by RIE to form the spacer 24 on the side walls of a gate electrode 18 (FIG. 9B).

Subsequently, phosphorus ions are implanted with a device isolation film 12, the gate electrode 18 and the spacer 24 as a mask to form a diffused layer 46 in the silicon substrate 10. In this ion implantation phosphorus ions are implanted at, e.g., 100 keV acceleration energy and a $5 \times 10^{12}$ $cm^{-2}$ dose. This ion implantation produces the effect of mitigating the electric field in the storage node and corresponds to the first ion implantation in the first embodiment.

The ion implantation conditions were determined based on the computation results of the electric fields shown in FIG. 5, in cases of the ion implantation through the storage electrode contact hole 34. From the viewpoint of the electric field mitigating effect it is preferable that the ion implantation is performed in a lower concentration than a source/diffused layer 22. Effects of the acceleration energy and the dose are the same as those of the first ion implantation for forming the diffused layer 36 in the first embodiment.

The diffused layer 46 for mitigating the electric field is thus formed immediately after the spacer 24 is formed, whereby the electric field is mitigated in the entire region of the diffused layer surrounded by the spacer 24 on the side walls of the gate electrode 18. Accordingly, a longer data retention time can be obtained than in the semiconductor device according to the first embodiment.

Then, an insulation film 26 is formed on the entire surface by, e.g., CVD method. The insulation film 26 functions as an inter-layer insulation film.

Then, a contact hole 28 for exposing the source/drain diffused layer 20 is opened in the insulation film 26 by the usual lithography and etching techniques.

Figure 9C:
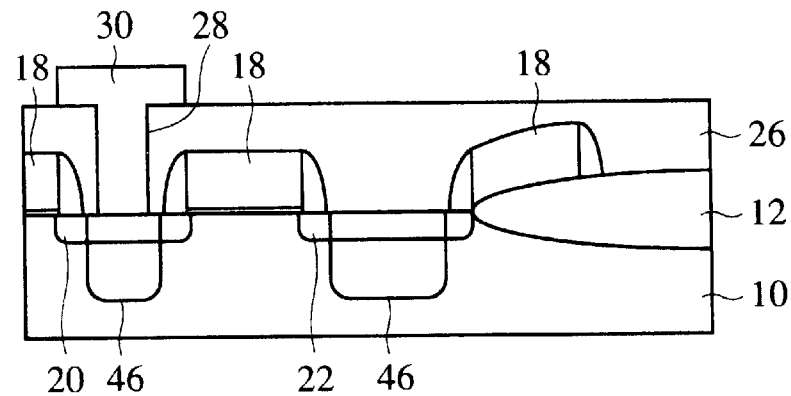

Subsequently, a conducting film is deposited on the insulation film 26 and patterned to form a bit line 30 connected to the source/drain diffused layer 20 through the contact hole 28 (FIG. 9C).

Figure 9D:
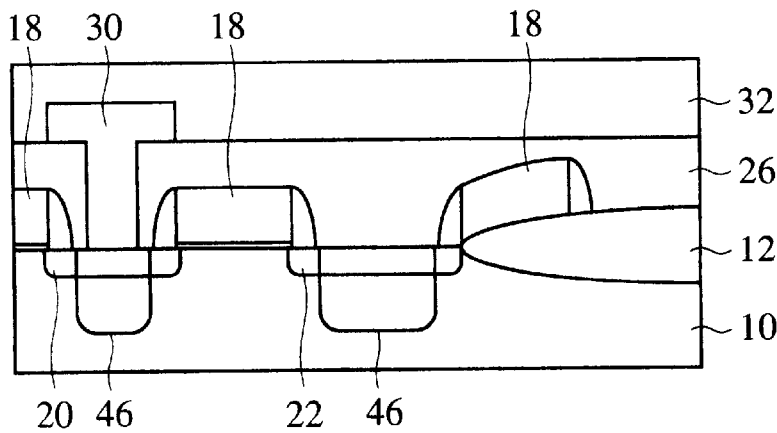

Then, an insulation film 32 is formed on the entire surface by, e.g., CVD method (FIG. 9D). The insulation film 32 functions as an inter-layer insulation film.

Figure 10A:
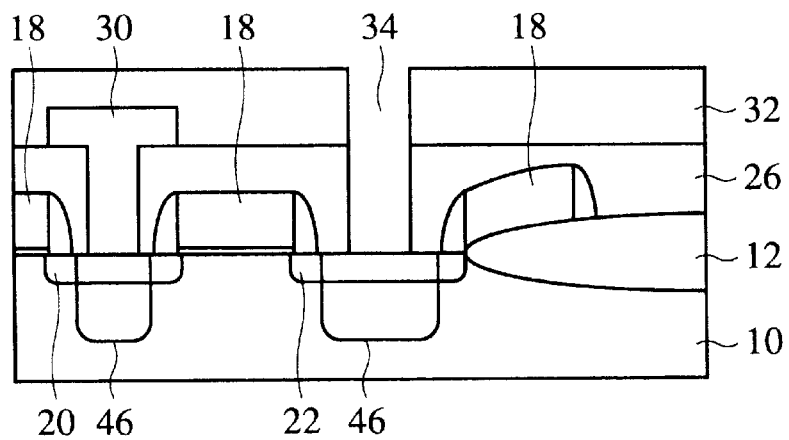

Then, a storage electrode contact hole 34 for exposing the source/drain diffused layer 22 is opened in the insulation film 32 and the insulation film 26 by the usual lithography and etching techniques (FIG. 10A).

Figure 10B:
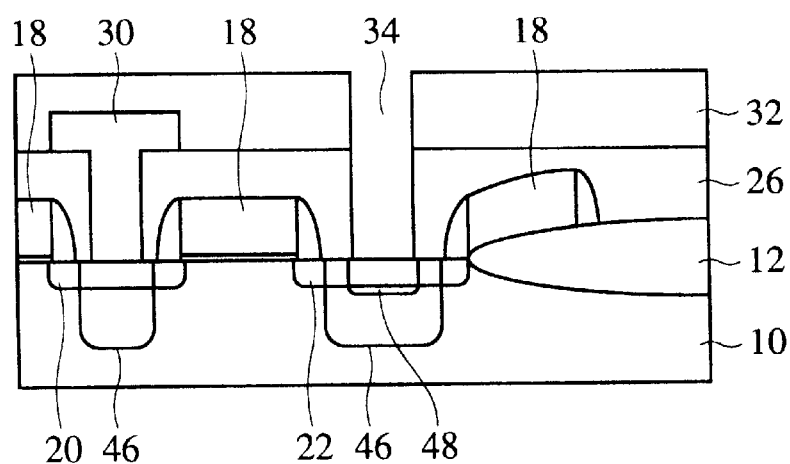

Next, n-type impurity ions are implanted into the substrate immediately below the contact hole 34 with the insulation film 34 as a mask to form a diffused layer 48 (FIG. 10B).

The ion implantation for forming the diffused layer 48 is performed as a countermeasure to the case that the storage electrode contact hole 34 is formed on a region where the impurity diffusion from the storage electrode 40 into the silicon substrate 10 is insufficient, especially on the device isolation film 12, and corresponds to the second ion implantation of the first embodiment. Effects of the acceleration energy and the dose are the same as those of the second ion implantation of the first embodiment for forming the diffused layer 38.

Figure 10C:
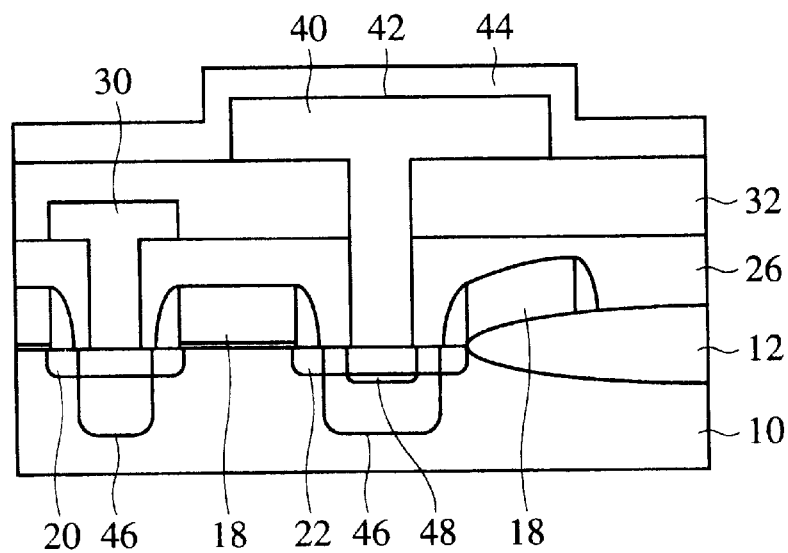

Then, in the same way as in the method for fabricating the semiconductor device according to, e.g., the first embodiment shown in FIG. 4C, a DRAM comprising memory cells each including one transistor and one capacitor is formed (FIG. 10C).

As described above, according to the present embodiment, phosphorus ions are implanted after the spacer 24 is formed on the side walls of the gate electrode 18 to form the diffused layer 46 for mitigating the electric field in the storage node. Accordingly, the electric field is mitigated in all the diffused layer surrounded by the spacer 24 on the side walls of the gate electrode 18, with a result that a longer data retention time can be obtained.

[A Third Embodiment]

The semiconductor device and the method for fabricating the same according to a third embodiment of the present invention will be explained with reference to FIGS. 11, 12A–12D, 13A–13C and 14. The same members of the semiconductor device and the method for fabricating the same according to the present embodiment as those of the semiconductor device and the method for fabricating the same according to the first and the second embodiments are represented by the same reference numbers not to repeat or to simplify their explanation.

Figure 11:
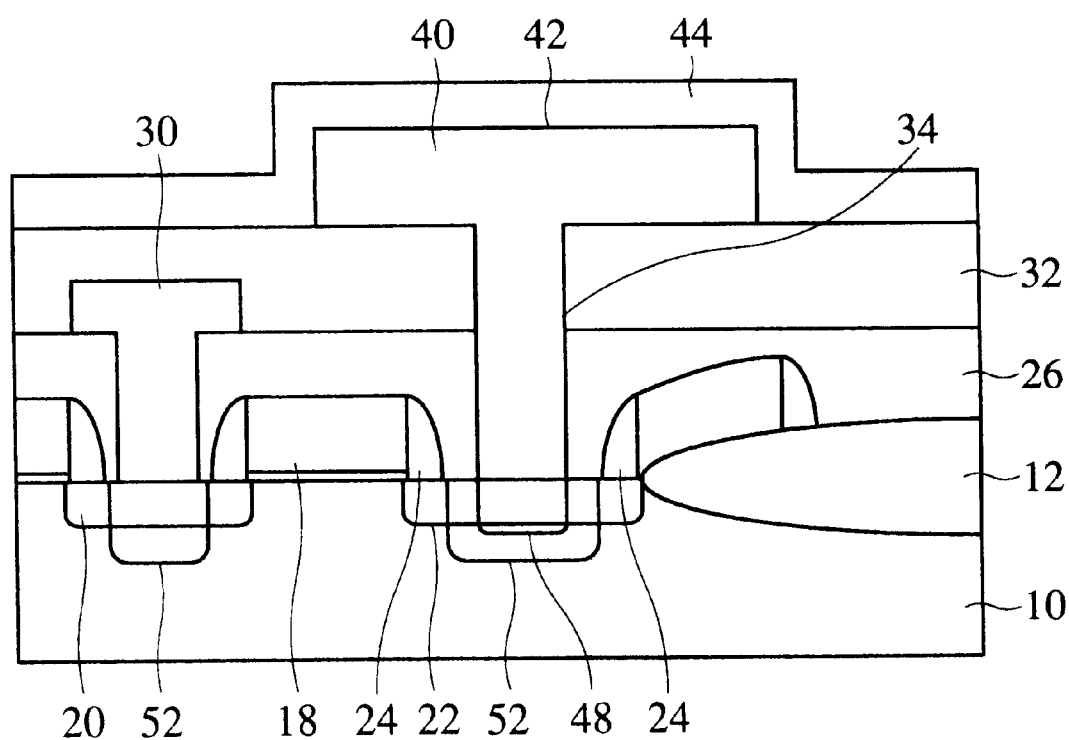
FIG. 11 is a diagrammatic sectional view of the semiconductor device according to a third embodiment of the present invention, which shows a structure thereof.
Figure 14:
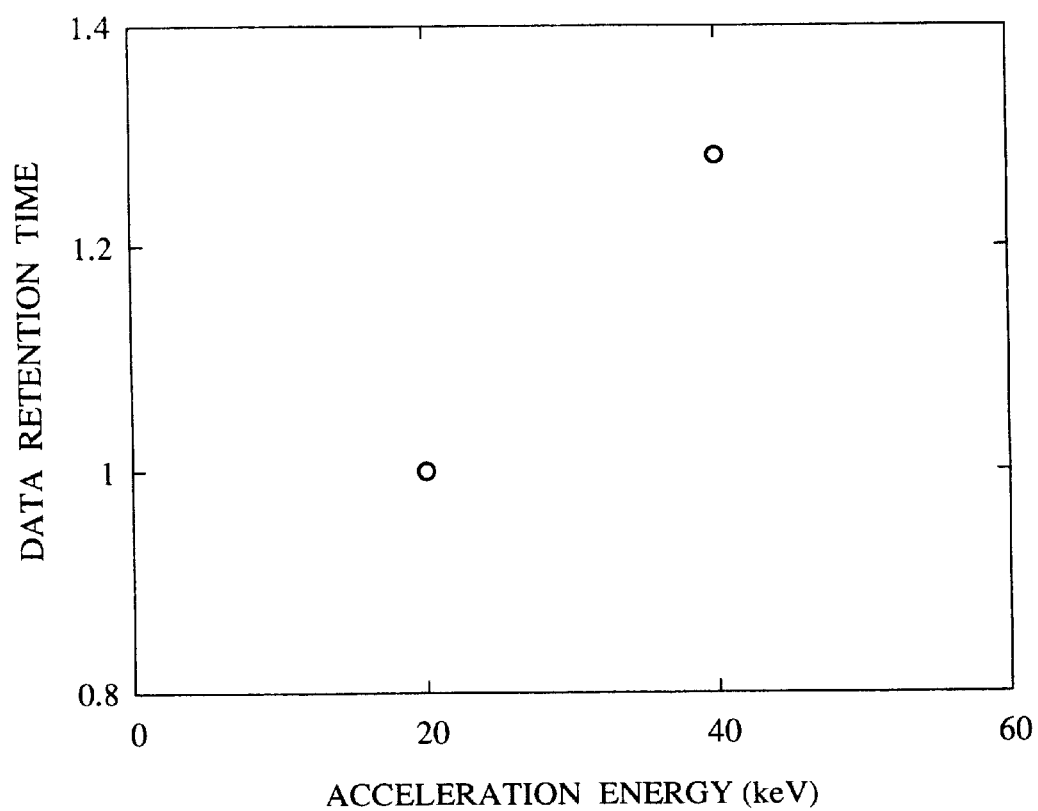
FIG. 14 is a graph of relationships between acceleration energy of phosphorus ion implantation for forming the source/drain diffused layer, and data retention time.

FIG. 11 is a diagrammatic sectional view of the semiconductor device according to the present embodiment, which shows a structure thereof. FIGS. 12A–12D and 13A–13C are sectional views of the semiconductor device according to the present embodiment in the steps of the method for fabricating the same, which explain the method. FIG. 14 is a graph showing relationships between acceleration energy for implanting phosphorus ions for forming a source/drain diffused layer and data retention time.

The semiconductor device according to the present embodiment has the same basic structure as the semiconductor device according to the second embodiment, but is characterized in that the diffused layer 46 of the second embodiment is replaced by a diffused layer 52 which is more heavily doped than the diffused layer 46.

Then, the semiconductor device and the method for fabricating the same according to the present embodiment will be detailed in accordance with the steps of the method for fabricating the same.

First, a transfer transistor including a gate electrode 18 having the side walls covered with a spacer 24 is formed in the same way as in the method for fabricating the semiconductor device according to, e.g., the second embodiment shown in FIGS. 9A to 9B.

Figure 12A:
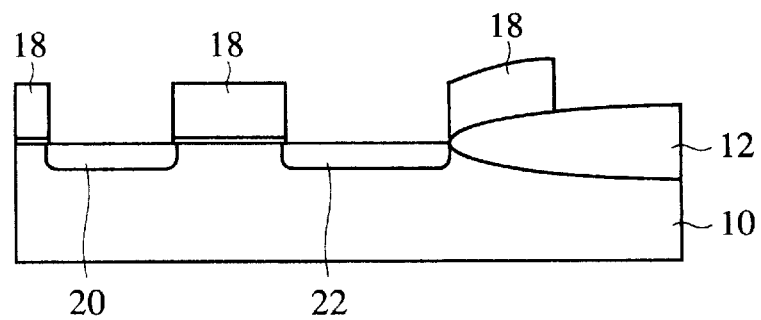
FIGS. 12A–12D and 13A–13C are sectional views of the semiconductor device according to the third embodiment in the steps of the method for fabricating the same, which show the method.
Figure 12B:
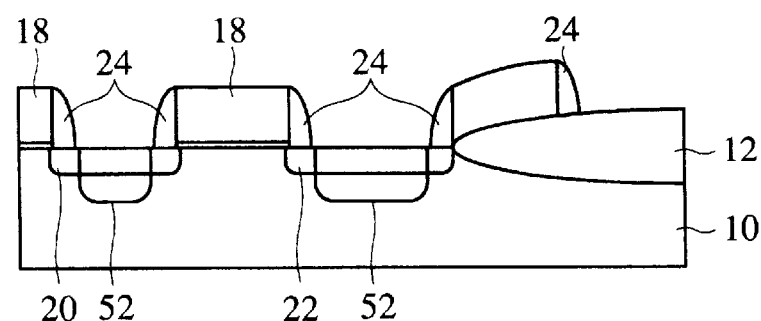
Figure 12C:
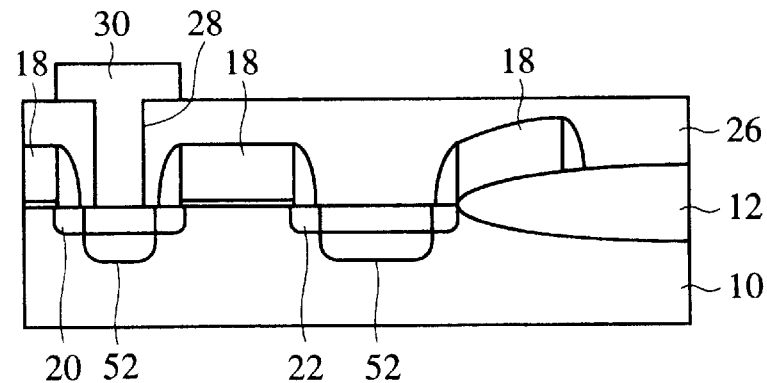
Figure 12D:
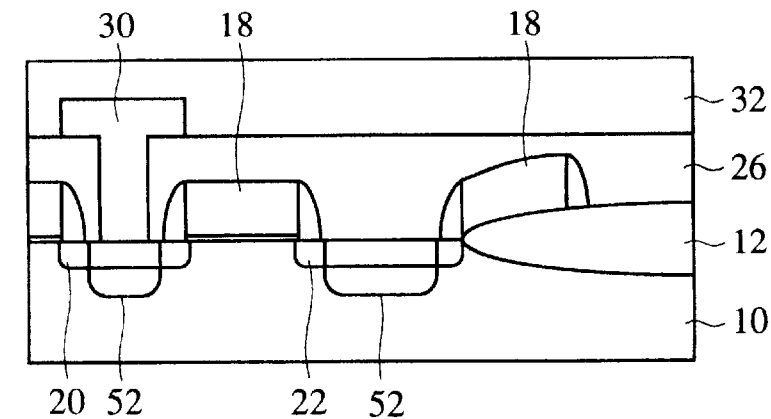
Figure 13A:
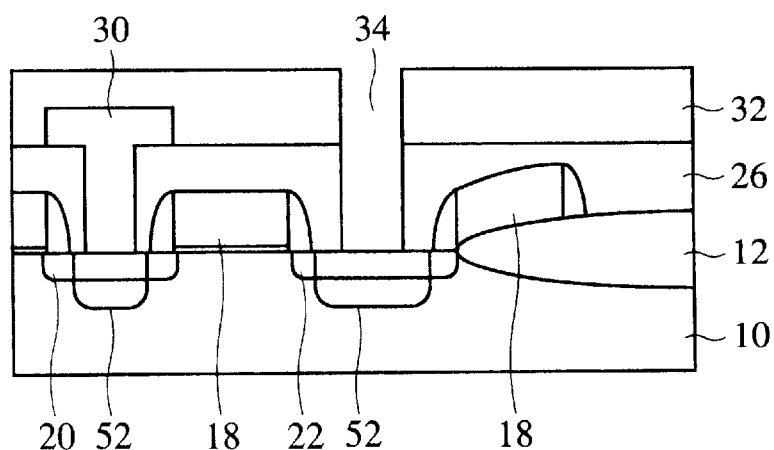
Figure 13B:
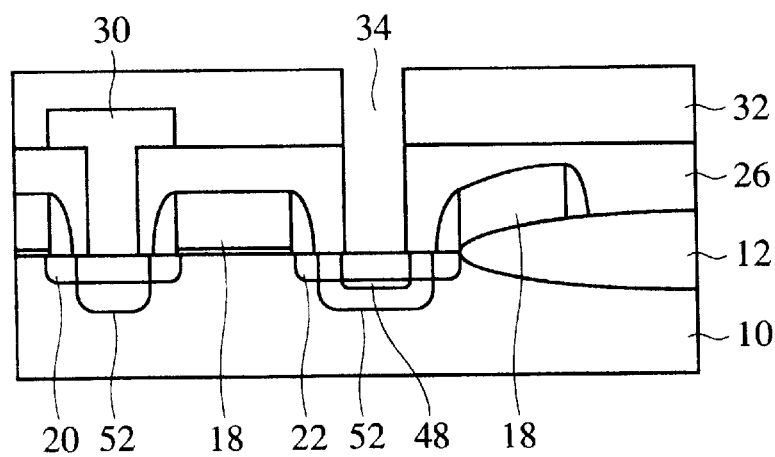
Figure 13C:
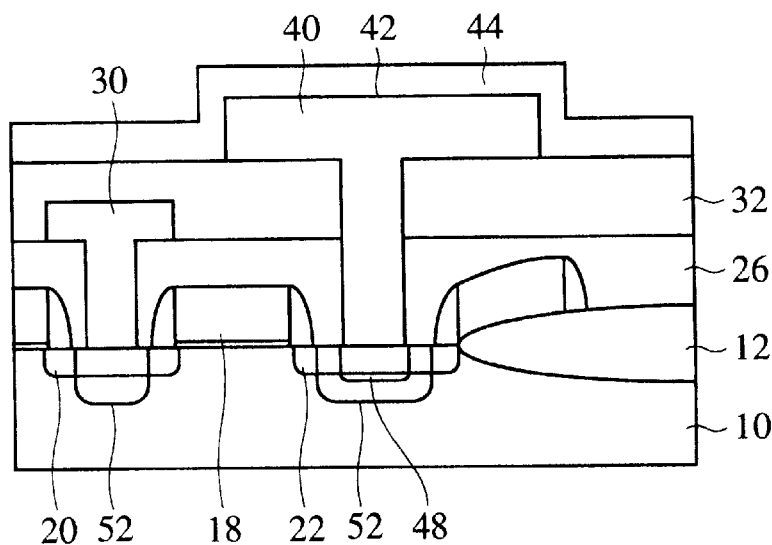

Then, phosphorus ions are implanted with a device isolation film 12, the gate electrode 18 and the spacer 24 as a mask to form a diffused layer 52 on a silicon substrate 10 (FIG. 12A to 12B). This phosphorus ion implantation is performed at, e.g., 40 keV implantation energy and a $1 \times 10^{13}$ cm$^{-2}$ dose.

Here, effects of providing the diffused layer 52 will be explained.

FIG. 14 shows data retention times plotted with respect to acceleration energy of implanting phosphorus ions for forming a source/drain diffused layers 20, 22 of a MOSFET. On the vertical axis, data retention times of the MOSFET are taken in relative values with respect to a data retention time of one of a number of cells having a shortest data retention time indicated by 1 of a case at 20 keV acceleration energy.

This graph shows that longer data retention times can be obtained with higher energy for implanting phosphorus ions for forming the source/drain diffused layers 20, 22. Reasons for this are not clear, but it is considered that the diffused layer is formed deep at high acceleration energy, and a depletion layers is formed on a deep level nearer to the substrate rather than in the surface of the substrate which is considered to have more frequently defects.

However, it is not allowed to make the acceleration energy higher as required for implanting ions for forming the source/drain diffused layers 20, 22. This is because the MOSFET of a cell has such a small channel length that the source/drain diffused layer is required to be shallow so as to prevent the short channel effect.

Thus, in the present embodiment, in the ion implantation for forming the source/drain diffused layers 20, 22 after forming the gate electrode 18, phosphorus ions are implanted at 30 keV acceleration energy and a $2 \times 10^{13}$ cm$^{-3}$ dose as have conventionally been, so that the source/drain diffused layers 20, 22 is formed shallow. Then, phosphorus ions are implanted at 40 keV acceleration energy and a $1 \times 10^{13}$ cm$^{-2}$ with the gate electrode 18 and the spacer 24 as a mask to form the diffused layer 52.

By this ion implantation the deep diffused layer 52 can be formed, and a longer data retention time can be expected. On the other hand, the diffused layer 52 is formed away from the end of the gate electrode 18 by an amount of the spacer 24, which little influences the short channel effect of the MOSFET. A dose of this ion implantation is preferably a little smaller than the dose for forming the source/drain diffused layers 20, 22. When the dose is too large, the short channel effect of the MOSFET is much influenced, and the purpose of forming the depletion layer deep nearer to the substrate is hindered when the dose is too small.

The diffused layer 52 is thus formed, whereby the short channel effect of the MOSFET is depressed while the diffused layer can be formed deep. A longer retention time can be expected.

In both the second and the third embodiments, phosphorus ions are implanted after the spacer 24 is formed. The second and the third embodiments have the conditions for the ion implantation different from each other but are the same in that the ion implantation is performed at higher energy than the ion implantation for forming the source/drain diffused layers 20, 22 after the gate electrode 18 is formed.

It is preferable both in the second and the third embodiments that phosphorus ions are implanted in the ion implantation following the formation of the spacer 24. The use of arsenic rather induces crystal defects, and adversely data retention time reduction is caused.

It is possible that in a combination of the second and the third embodiments the diffused layer 46 and the diffused layer 52 are formed after the spacer 24 is formed, by twice ion implantation in which phosphorus ions are implanted at 100 keV acceleration energy and a $5 \times 10$ cm$^{-2}$ and at 40 keV acceleration energy and a $1 \times 10^{13}$ cm$^{-2}$ dose. Thus, the two effects of the electric field mitigation and the deep diffused layer can be concurrently expected.

After the diffused layer 52 is thus formed, a DRAM comprising memory cells each including one transistor and one capacitor is formed (FIG. 12C–FIG. 13C) in the same way as in the method for fabricating the semiconductor device according to, e.g., the second embodiment shown in FIGS. 9C to 10C.

As described above, according to the present embodiment, the spacer 24 is formed on the side walls of the gate electrode 18, and then the diffused layer 52 is formed by phosphorus ion implantation, whereby a longer data retention time can be obtained.

[A Fourth Embodiment]

The semiconductor device and the method for fabricating the same according to a fourth embodiment of the present invention will be explained with reference to FIGS. 15, 16A–16D and 17A–17C. The same members of the present embodiment as those of the semiconductor device and the method for fabricating the same according to the first to the third embodiments are represented by the same reference numbers not to repeat or to simplify their explanation.

Figure 15:
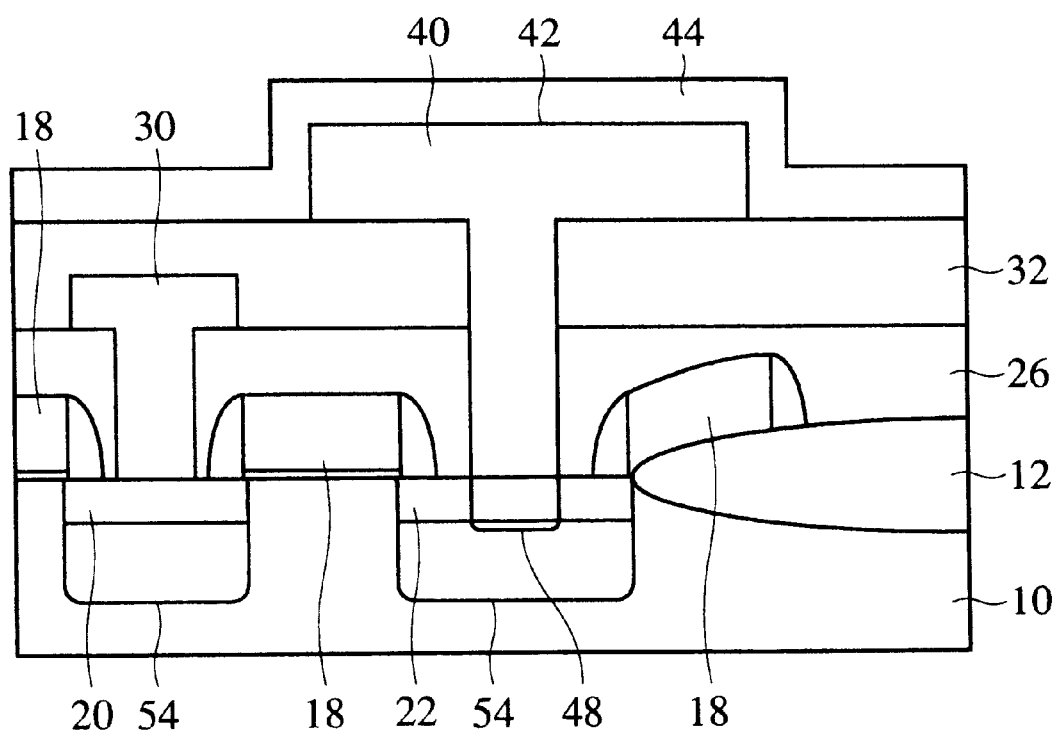
FIG. 15 is a diagrammatic sectional view of the semiconductor device according to a fourth embodiment of the present invention, which shows a structure thereof.

FIG. 15 is a diagrammatic sectional view of the semiconductor device according to the present embodiment, which shows a structure thereof. FIGS. 16A–16D and 17A–17C are sectional views of the semiconductor device according to the present embodiment in the steps of the method for fabricating the same, which explain the method.

The semiconductor device according to the present embodiment is characterized in that, as shown in FIG. 15, the diffused layer 54 is formed for mitigating an electric field in a storage node is formed deep in a source/drain diffused layers 20, 22.

The semiconductor device and the method for fabricating the same according to the present embodiment will be detailed in accordance with the fabrication steps.

First, in the same way as in the method for fabricating the semiconductor device according to, e.g., the second embodiment shown in FIG. 9A a transfer transistor is formed on a silicon substrate 10.

Then, ion implantation is performed with a gate electrode 18, a device isolation film 12 as a mask to form an n-type diffused layer which is to be a source/drain layers 20, 22. In the ion implantation, phosphorus ions, for example, are implanted at 30 keV acceleration energy and a $2 \times 10^{13}$ cm$^{-2}$ dose.

Figure 16A:
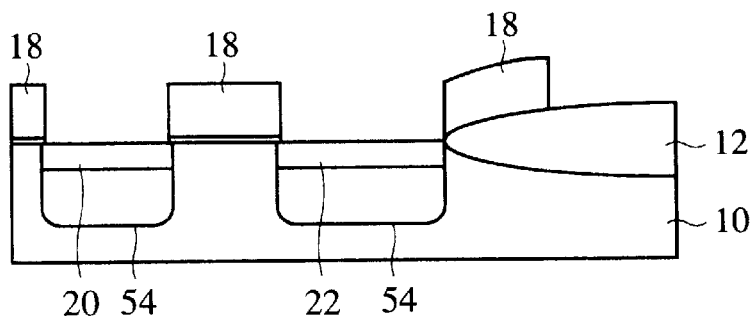
FIGS. 16A–16D and 17A–17C are sectional views of the semiconductor device according to the fourth embodiment in the steps of the method for fabricating the same, which show the method.

Subsequently, ion implantation is further performed with the gate electrode 18 and the device isolation film 12 as a mask to form an n-type diffused layer 54 for the electric field mitigation (FIG. 16A). The diffused layer 54 is formed by implanting, e.g., phosphorus ions at 100 keV acceleration energy and a $5 \times 10^{12}$ cm$^{-2}$ dose. The diffused layer 54 is for the electric field mitigation, and is deeper and is not more heavily doped than the source/drain diffused layers 20, 22. Conditions for forming the diffused layer 54 are the same as those of forming the diffused layer 36 in the first embodiment.

Either of the ion implantation for forming the source/drain diffused layers 20, 22 and that for forming the diffused layer 54 may be first.

Figure 16B:
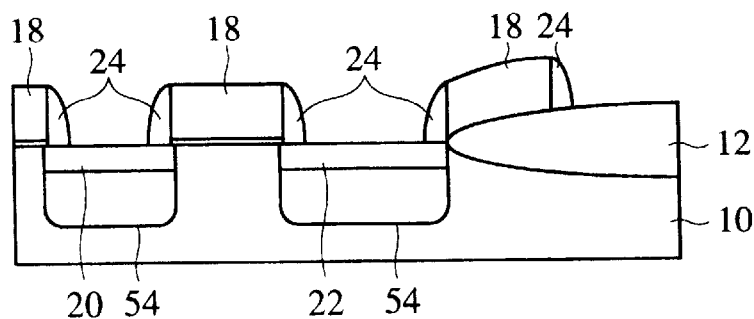
Figure 16C:
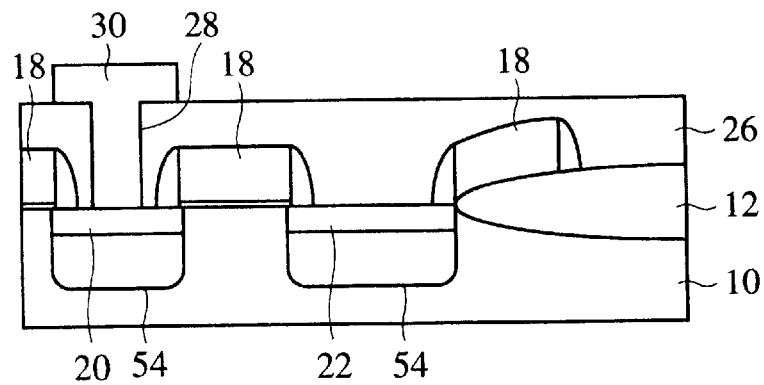
Figure 16D:
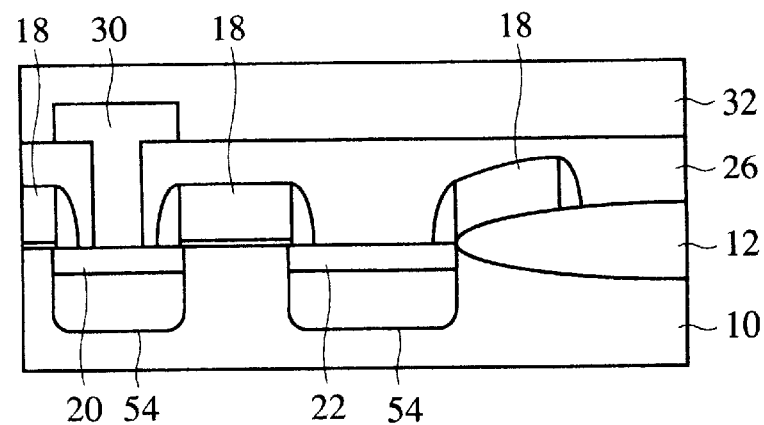

Then, an insulation film is formed on the entire surface of the silicon substrate by, e.g., CVD method and etched by RIE to form a spacer 24 on the side walls of the gate electrode 18 (FIG. 16B).

After the diffused layer 54 is thus formed, a DRAM comprising memory cell each including one transistor and one capacitor is formed (FIG. 16C to FIG. 17C) in the same way as in the method for fabricating the semiconductor device according to, e.g., the second embodiment shown in FIGS. 9C to 10C.

As described above, according to the present embodiment, the diffused layer 54 is provided, whereby the electric field can be mitigated in all the diffused layer in the storage node. Accordingly, the effect is expected to be higher than in the semiconductor device according to the first and the second embodiments. However, the provision of the diffused layer 54 produces the effect of the electric field mitigation, but on the other hand there is a risk that the short channel effect of the MOSFET may occur. In consideration of a degree of the influence, the semiconductor device according to the present embodiment, and that according to the first and the second embodiments can be selected.

[A Fifth Embodiment]

The semiconductor device and the method for fabricating the same according to a fifth embodiment of the present invention will be explained with reference to FIGS. 18, 19A–19D, 20A–20C and 21A–21B. The same reference numbers of the present embodiment as those of the semiconductor device and the method for fabricating the same according to the first to the fourth embodiments are represented by the same reference numbers not to repeat or to simplify their explanation.

Figure 18:
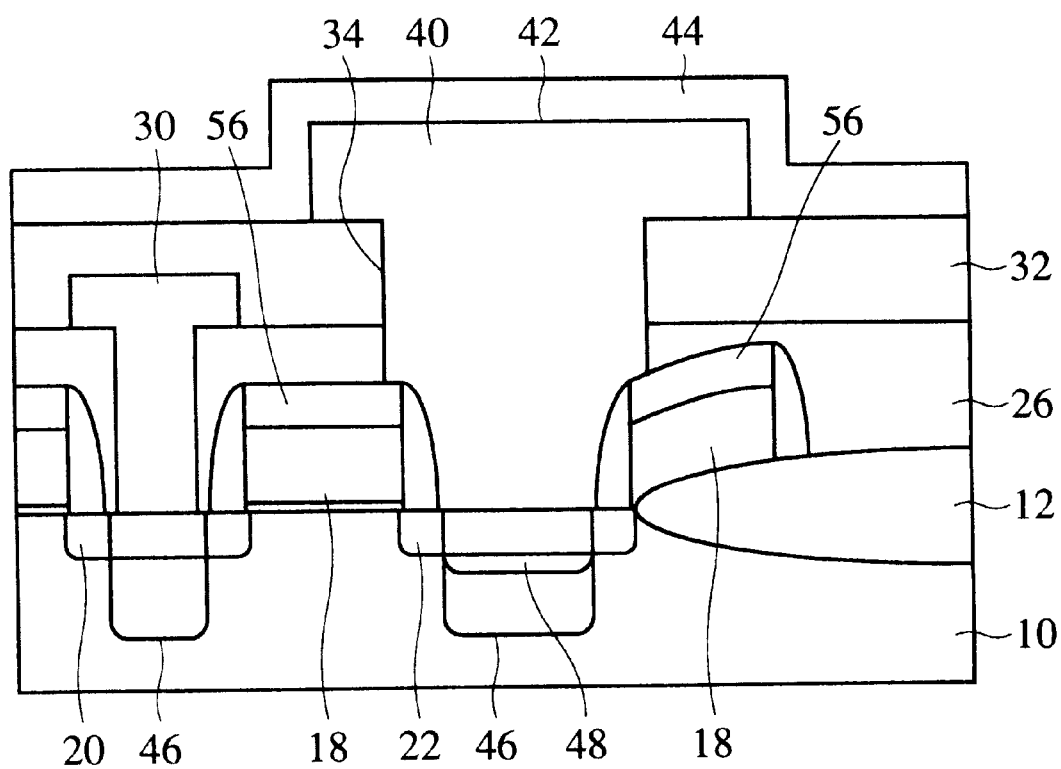
FIG. 18 is a diagrammatic sectional view of the semiconductor device according to a fifth embodiment of the present invention, which shows a structure thereof.

FIG. 18 is a diagrammatic sectional view of the semiconductor deice according to the present embodiment, which shows a structure thereof. FIGS. 19A–19D and 20A–20C are sectional views of the semiconductor device according to the present embodiment in the steps of the method for fabricating the same, which explain the method. FIGS. 21A and 21B are views explaining the effects of the semiconductor device and the method for fabricating the same according to the present embodiment.

The semiconductor device according to the present embodiment is the same as the semiconductor device according to the second embodiment in the basic fabrication steps, but is characterized in that, as shown in FIG. 18, a storage electrode contact hole 34 for connecting a storage electrode 40 and a source/drain diffused layer 22 to each other is opened by self-alignment with respect to the gate electrode 18.

Next, the semiconductor device and the method for fabricating the same according to the present embodiment will be detailed in accordance with the fabrication steps.

First, a device isolation film 12 is formed on a p-type silicon substrate 10 by, e.g., LOCOS method to define an active region 14.

Then, a gate insulation film 16 of a silicon oxide film is formed by thermal oxidation in the active region 14.

Subsequently, a conducting film to be the gate electrode, e.g., a laminated film of a polycrystalline silicon film and a metal silicide film, and an insulation film for covering the gate electrode, e.g., a silicon nitride film are sequentially grown by, e.g., CVD method.

Then, the laminated film of the conducting film and the insulation film is patterned to form the gate electrode 18 of the transfer transistor, the upper surface of which is covered with an insulation film 56.

Figure 19A:
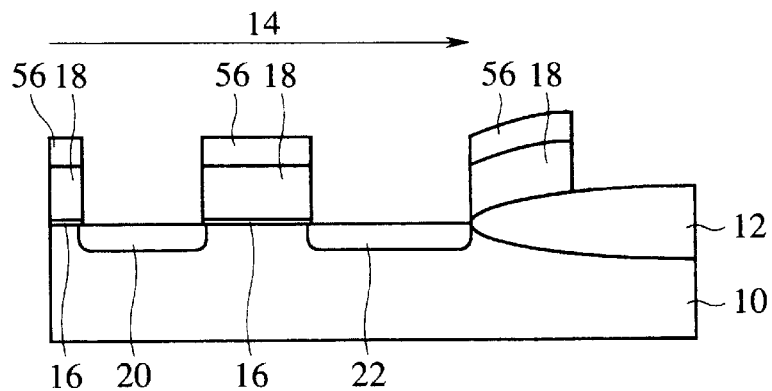
FIGS. 19A–19D and 20A–20C are sectional views of the semiconductor device according to the fifth embodiment in the steps of the method for fabricating the same, which show the method.

Then, ion implantation is performed with the gate electrode 18, the insulation film 56 and the device isolation film 12 as a mask to form an n-type diffused layer in a region where the source/drain diffused layers 20, 22 is to be formed. In the ion implantation, for example phosphorus ions are implanted at 30 keV acceleration energy and a $2 \times 10^{13}$ cm$^{-3}$ dose (FIG. 19A).

Subsequently, an insulation film is grown on the entire surface of the silicon substrate 10 by, e.g., CVD method and etched by RIE to form a spacer 24 on the side walls of the gate electrode 18 and the insulation film 56. The spacer 24 is formed of, e.g., a silicon nitride film. Thus, the gate electrode 18 is covered with the insulation film 56 and the spacer 24, of a silicon nitride film.

The insulation film 56 and the spacer 24 are used as a stopper for opening a storage electrode contact hole 34 in a later step, and is formed of a material having etching selectivity with respect to an inter-layer insulation film to be formed above.

Figure 19B:
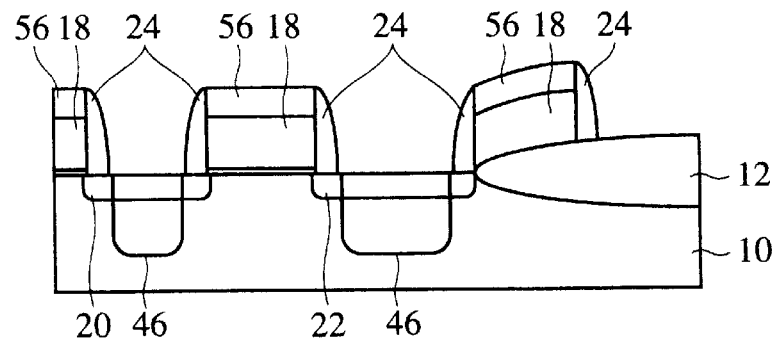

Then, phosphorus ions are implanted with the device isolation film 12, the gate electrode 18, the insulation film 56 and the spacer 24 as a mask to form a diffused layer 46 in the silicon substrate 10 (FIG. 19B). In this ion implantation phosphorus ions are implanted at, e.g., 100 keV acceleration energy and a $5 \times 10^{12}$ cm$^{-2}$ dose. This ion implantation produces the effect of mitigating an electric field in the storage node and corresponds to the first ion implantation of the first embodiment.

Then, an insulation film 26 is formed on the entire surface by, e.g., CVD method. The insulation film 26 functions as an inter-layer insulation film and is formed of, e.g., a silicon oxide film, such as a BPSG (Boro-Phospho-Silicate Glass) film.

Subsequently, a contact hole 28 for exposing the source/drain diffused layer 20 is opened in the insulation film 26 by the usual lithography and etching techniques.

Figure 19C:
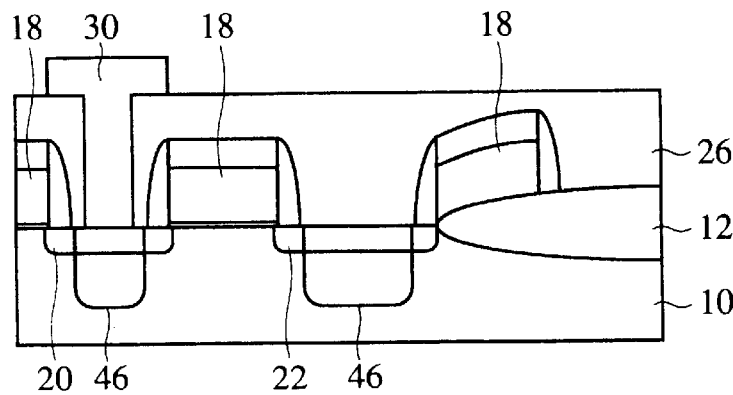
Figure 19D:
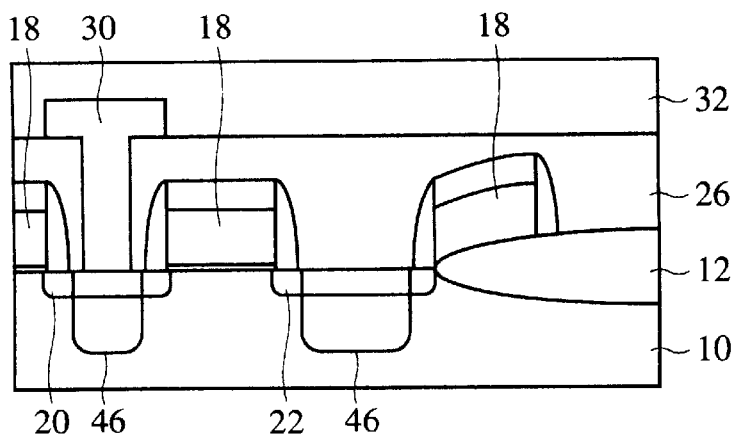

Then, a conducting film is deposited on the insulation film 26 and patterned to form a bit line 30 connected to the source/drain diffused layer 20 through the contact hole 28 (FIG. 19C).

Then, an insulation film 32 is formed on the entire surface by, e.g., CVD method (FIG. 9D). The insulation film 32 functions as an inter-layer insulation film and is formed of, e.g., a silicon oxide film, e.g., a BPSG film.

Figure 20A:
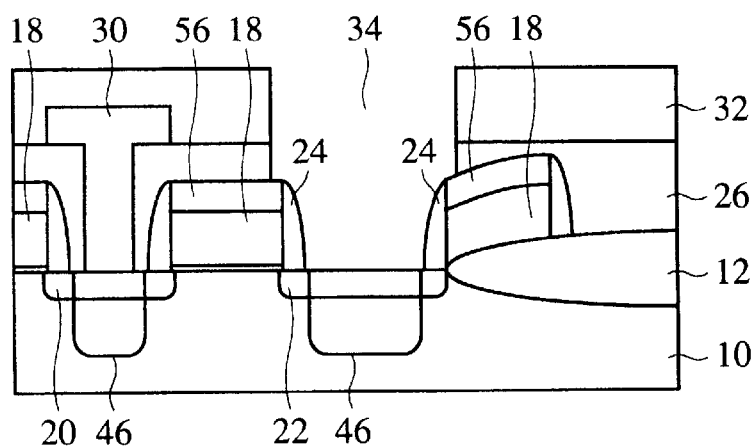
Figure 21A:
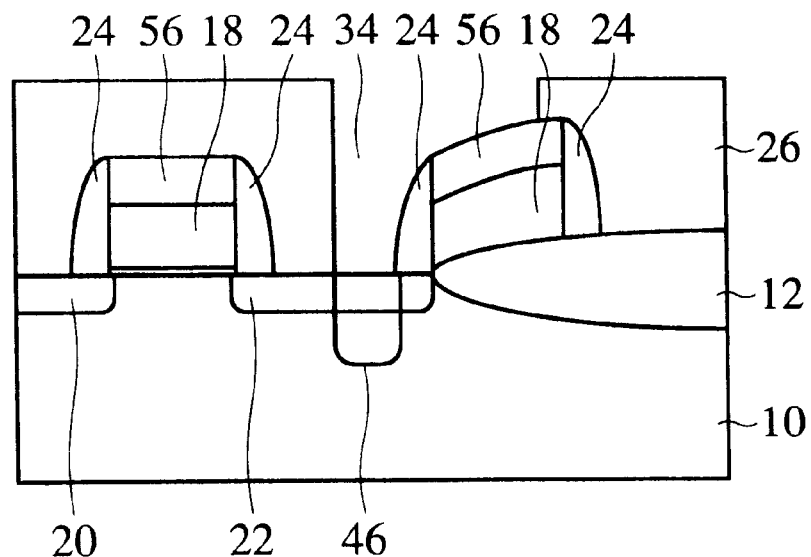
FIG. 21A and 21B are views explaining effects of the semiconductor device according to the fifth embodiment and the method for fabricating the same.
Figure 21B:
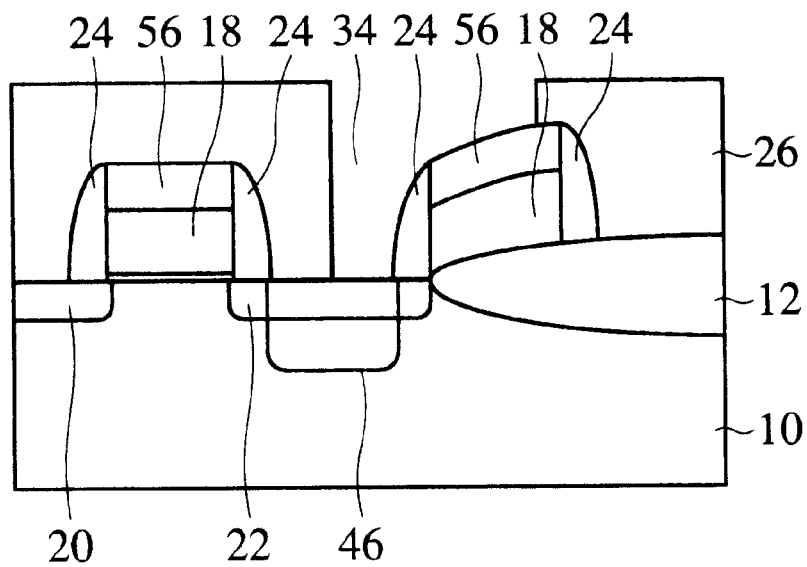

Subsequently, a storage electrode contact hole 34 for exposing the source/drain diffused layer 22 is opened in the insulation film 32 and the insulation film 26 by the usual lithography and etching techniques (FIG. 20A). The etching for opening the storage electrode contact hole 34 is performed under a condition that the silicon oxide film is etched at a higher etching rate than the silicon nitride film.

Even in a case that lithographical displacement occurs or the storage electrode contact hole 34 has a large diameter with the end of the storage electrode contact hole 34 is extended over the gate electrode 18, the insulation film 56 of a silicon nitride film and the spacer 24 are not substantially etched by the etching for opening the storage electrode contact hole 34, and accordingly the gate electrode 18 protected by the insulation film 56 and the spacer 24 never short-circuits with a storage electrode 40 which is to be formed in a later step.

Figure 20B:
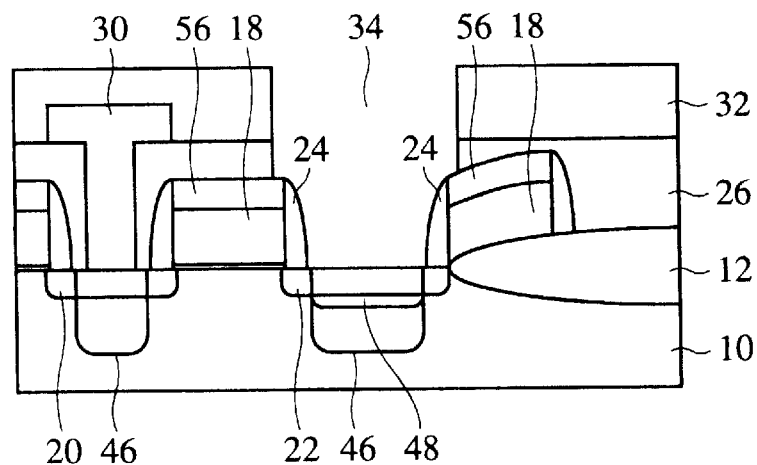
Figure 20C:
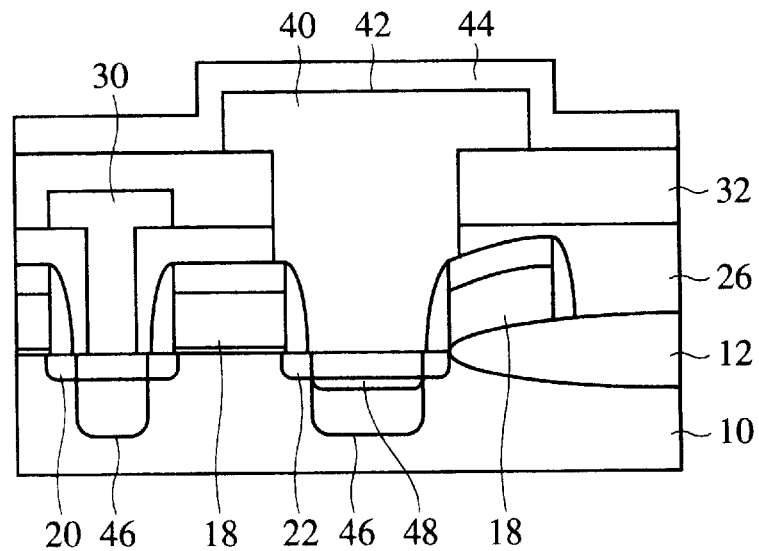

Then, n-type impurity ions are implanted into the substrate immediately below the contact hole 34 with the insulation films 32, 56, the gate electrode 18 and the spacer 24 as a mask to form a diffused layer 48 (FIG. 20B).

The ion implantation for forming the diffused layer 48 is a countermeasure to a possible case that a region where the impurity diffusion from the storage electrode 40 into the silicon substrate 10 is insufficient, especially the storage electrode contact hole 34 is displaced and opened on the device isolation film 12 and corresponds to the second ion implantation of the first embodiment. Effects of the implantation energy and dose are the same as those of the second ion implantation of the first embodiment.

Then, a DRAM comprising memory cells each including one transistor and one capacitor is formed (FIG. 20C) in the same way as the method for fabricating the semiconductor device according to, e.g., the second embodiment shown in FIG. 10C.

The present embodiment is different from the conventional art in that in the former the phosphorus ion implantation for the electric field mitigation is performed after the spacer 24 is formed. In forming the storage electrode contact hole 34 by self-alignment as in the present embodiment, as long as FIG. 20A goes, it seems that the ion implantation after the spacer 24 is formed and the ion implantation after the storage electrode contact 34 is opened as in the conventional art result in the same structure, i.e., the same width of the region where the electric field is mitigated.

It will be explained with reference to FIGS. 21A and 21B that the present invention is, however, different from the conventional art.

FIGS. 21A and 21B show cases that the storage electrode contact hole 34 is opened, displaced.

In the semiconductor device according to the present embodiment shown in FIG. 21B, the storage electrode contact hole 34 is opened by self-alignment, and even when displacement occurs, the problem that the storage electrode 40 and the gate electrode 18, which will be formed later, short-circuit with each other does not take place. In the semiconductor device according to the present embodiment, the ion implantation for the electric field mitigation is performed after the spacer 24 is formed, and the electric field mitigation effect can be expected over a wide range irrespective of presence or absence of the displacement of the storage electrode contact hole 34.

On the other hand, when as in the conventional are shown in FIG. 21A, the ion implantation for the electric field mitigation is performed after the storage electrode contact hole 34 is opened, an actually implanted region is narrow, and the electric field mitigation is effective only the narrow region.

Thus, by using the method for fabricating the semiconductor device according to the present embodiment, the electric field can be effective mitigated even when storage electrode contact hole 34 is opened, displaced due to lithographic displacement.

As described above, according to the present embodiment, even when the storage electrode contact hole 34 is formed by self-alignment with respect to the gate electrode 18, the ion implantation for the electric field mitigation is performed after the spacer 24 is formed, and the electric field mitigating effect can be expected over a wide rage irrespective of presence or absence of displacement.

The semiconductor device and the method or fabricating the same according to the present embodiment may be combined with the third embodiment. That is, in the structure in which the storage electrode contact hole 34 is formed by self-alignment with the gate electrode 18, the ion implantation for forming the deep diffused layer may be performed after the spacer 24 is formed by, for example, implanting phosphorus ions at 40 keV acceleration energy and a $1 \times 10^{13}$ cm$^{-2}$. Thus, the effects produced by the third embodiment can be obtained.

[A Sixth Embodiment]

The semiconductor device and the method for fabricating the same according to a sixth embodiment of the present invention will be explained with reference to FIGS. 22, 23A–23D and 24A–24C. The same members of the present embodiment as those of the semiconductor device according to the first to the fifth embodiment of the present invention and the method for fabricating the semiconductor device are represented by the same reference numbers not to repeat or to simplify their explanation.

Figure 22:
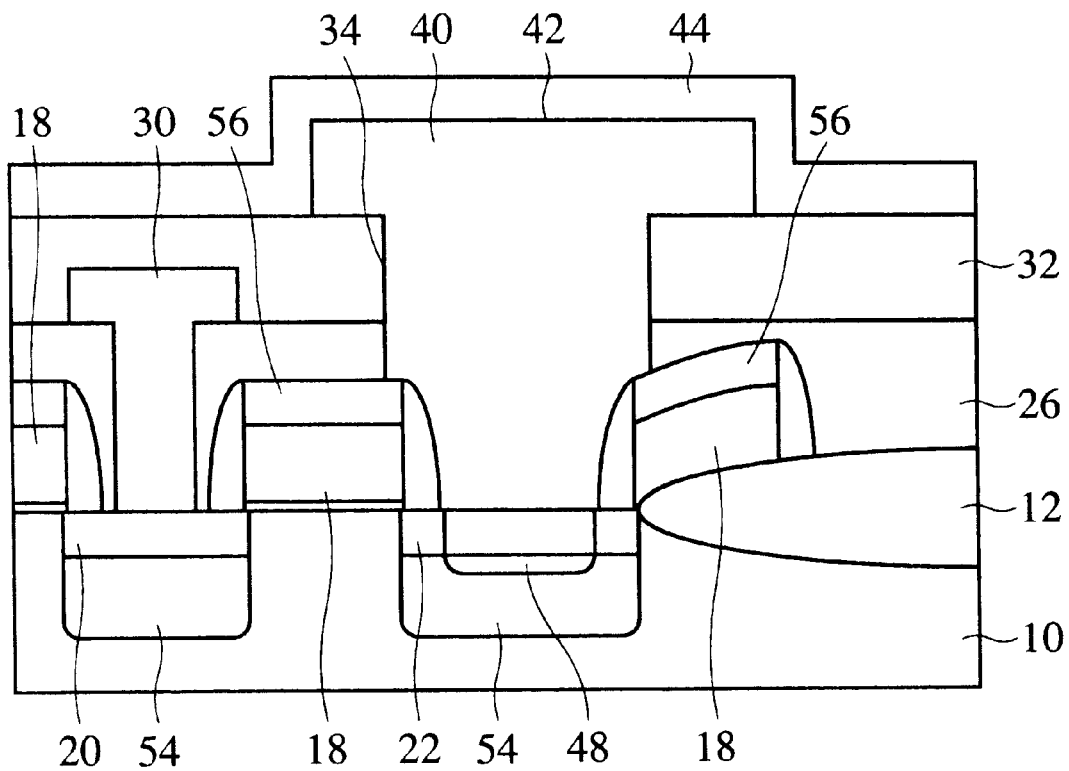
FIG. 22 is a diagrammatic sectional view of the semiconductor device according to a sixth embodiment of the present invention, which shows a structure thereof.

FIG. 22 is a diagrammatic sectional view of the semiconductor device according to the present embodiment, which shows a structure thereof. FIGS. 23A–23D and 24A–24C are sectional views of the semiconductor device according to the present embodiment in the steps of the method for fabricating the same, which explain the method.

The semiconductor device according to the preset embodiment is fabricated by the same basic fabrication steps as the semiconductor device according to the fourth embodiment and is characterized in that, as shown in FIG. 22, a storage electrode contact hole 34 for connecting a storage electrode 40 and a source/drain diffused layer 22 to each other is opened by self-alignment with a gate electrode 18.

Next, the semiconductor device according to the present embodiment will be detailed in accordance with the steps of the method for fabricating the same.

First, in the same way as in the method for fabricating the semiconductor device according to, e.g., the fifth embodiment shown in FIG. 19A, a gate electrode 18 of a transfer transistor having the upper surface covered with an insulation film 56 is formed on a silicon substrate 10.

Then, ion implantation is performed with the gate electrode 18, the insulation film 56 and the device isolation film 12 as a mask to form an n-type diffused layer which is to be a source/drain layers 20, 22. In the ion implantation, for example, phosphorus ions are implanted at 30 keV acceleration energy and a $2 \times 10^{13}$ cm$^{-2}$ dose.

Figure 23A:
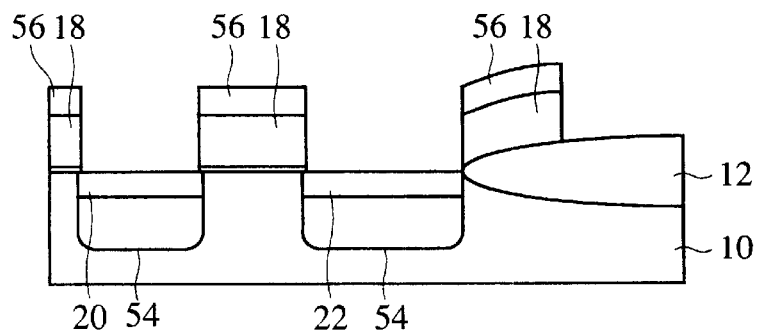
FIGS. 23A–23D and 24A–24C are sectional views of the semiconductor device according to the sixth embodiment in the steps of the method for fabricating the same, which show the method.

Subsequently, ion implantation is further performed with the gate electrode 18, the insulation film 56 and the device isolation film 12 as a mask to form an n-type diffused layer 54 for the electric field mitigation (FIG. 23A). The diffused layer 54 is formed by implanting, e.g., phosphorus ions at 100 keV acceleration energy and a $5 \times 10^{12}$ cm$^{-2}$ dose. The diffused layer 54 is for the electric field mitigation, and is deeper and is not more heavily doped than the source/drain diffused layers 20, 22. The ion implantation for forming the diffused layer 54 is performed under the same conditions as those for forming the diffused layer 36 of the first embodiment.

Figure 23B:
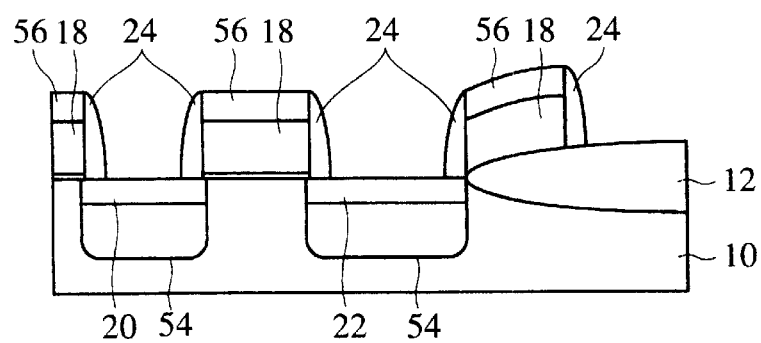

Then, an insulation film is formed on the entire surface of the silicon substrate 10 by, e.g., CVD method and is etched by RIE to form a spacer 24 on the side walls of the gate electrode 18 and the insulation film 56 (FIG. 23B). The spacer 24 is formed of, e.g., a silicon nitride film. The gate electrode 18 is covered with the insulation film 56 and the spacer 24, of a silicon nitride film.

The insulation film 56 and the spacer 24 are films to be used as a stopper for opening a storage electrode contact hole 34 in a later step and is formed of a material having etching selectivity with respect to an inter-layer insulation film to be formed above.

Then, an insulation film 26 is formed on the entire surface by, e.g., CVD method. The insulation film 26 functions as an inter-layer insulation film and is formed of, e.g., a silicon oxide film, such as BPSG film.

Subsequently, a contact hole 28 for opening the source/drain diffused layer 20 is opened in the insulation film 26 by the usual lithography and etching techniques.

Figure 23C:
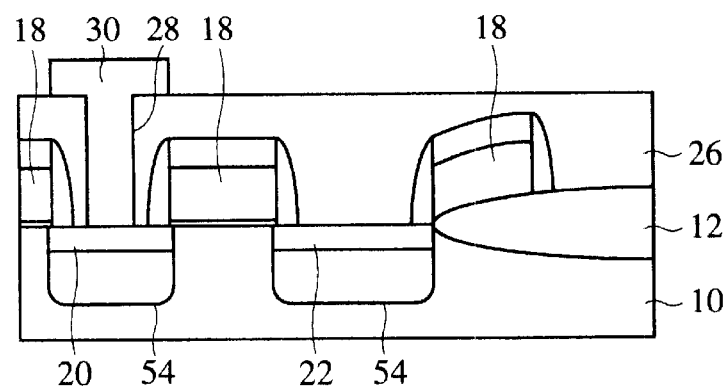

Then, a conducting film is deposited on the insulation film 26 and patterned to form a bit line 30 connected to the source/drain diffused layer 20 through the contact hole 28 (FIG. 23C).

Figure 23D:
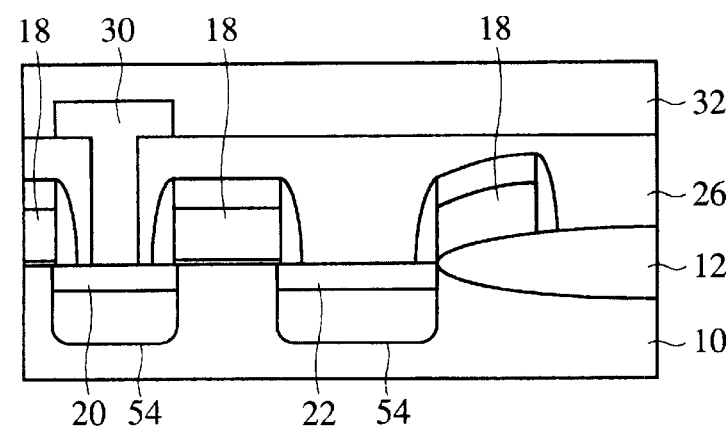

Next, an insulation film 32 is formed on the entire surface by, e.g., CVD method (FIG. 23D). The insulation film 32 functions as an inter-layer insulation film and is formed of a silicon oxide film, such as a BPSG film.

Figure 24A:
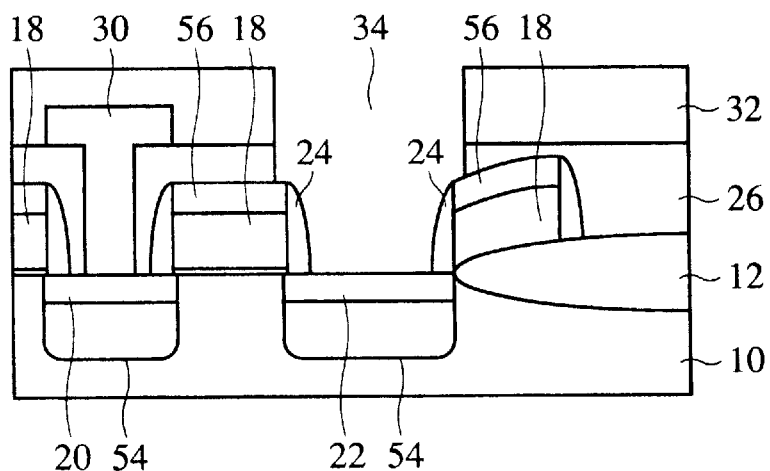

Subsequently, a storage electrode contact hole 34 for exposing the source/drain diffused layer 22 is opened in the insulation film 32 and the insulation film 26 by the usual lithography and etching techniques (FIG. 24A). The etching for opening the storage electrode contact hole 34 is performed at a higher etching rate of the silicon oxide film than that of the silicon nitride film.

Even in a case that lithographical displacement occurs or the storage electrode contact hole 34 has a large diameter with the end of the storage electrode contact hole 34 is extended over the gate electrode 18, the insulation film 56 of a silicon nitride film and the spacer 24 are not substantially etched by the etching for opening the storage electrode contact hole 34, and accordingly the gate electrode 18 protected by the insulation film 56 and the spacer 24 never short-circuits with a storage electrode 40 which is to be formed in a later step.

Figure 24B:
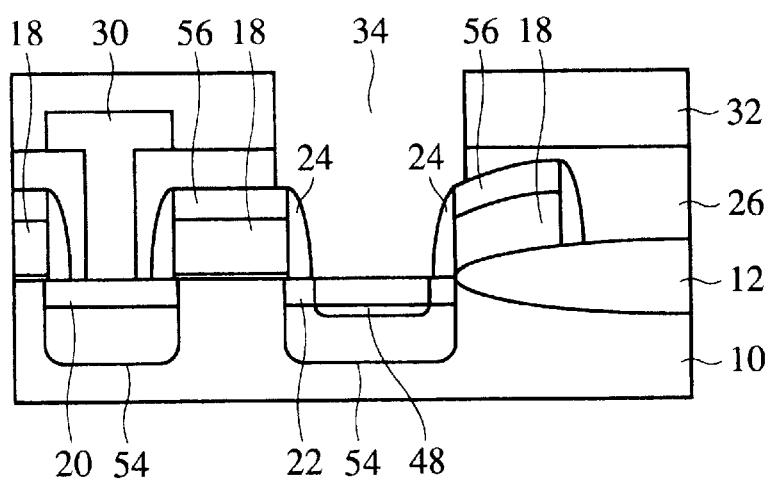
Figure 24C:
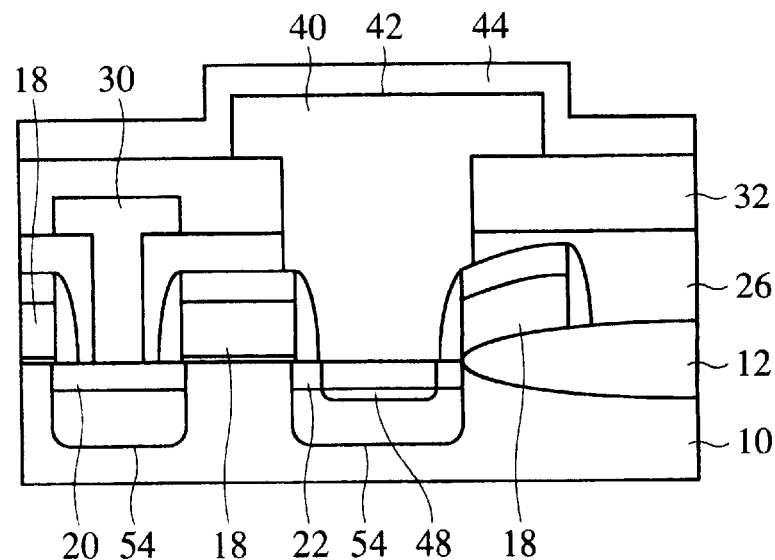

Then, n-type impurity ions are implanted in the substrate immediately below the storage electrode contact hole 34 with the insulation films 32, 56, the gate electrode 18 and the spacer 24 as a mask to form a diffused layer 48 (FIG. 24B).

The ion implantation for forming the diffused layer 48 is a countermeasure to a possible case that a region where the impurity diffusion from the storage electrode 40 into the silicon substrate 10 is insufficient, especially the storage electrode contact hole 34 is displaced and opened on the device isolation film 12 and corresponds to the second ion implantation of the first embodiment. Effects of the implantation energy and dose are the same as those of the second ion implantation of the first embodiment.

Figure 17A:
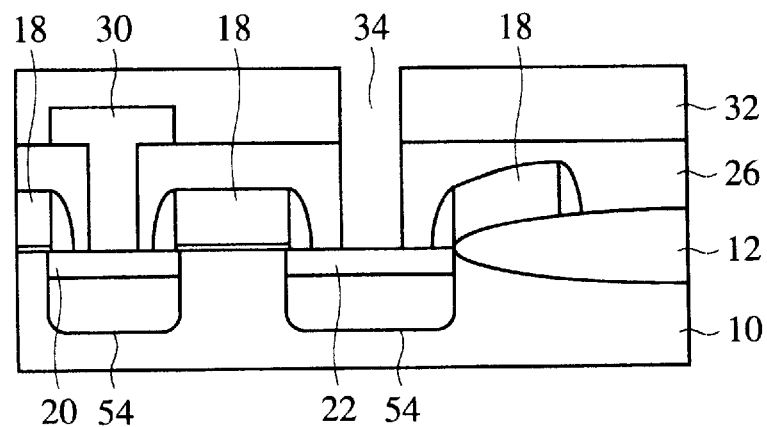
Figure 17B:
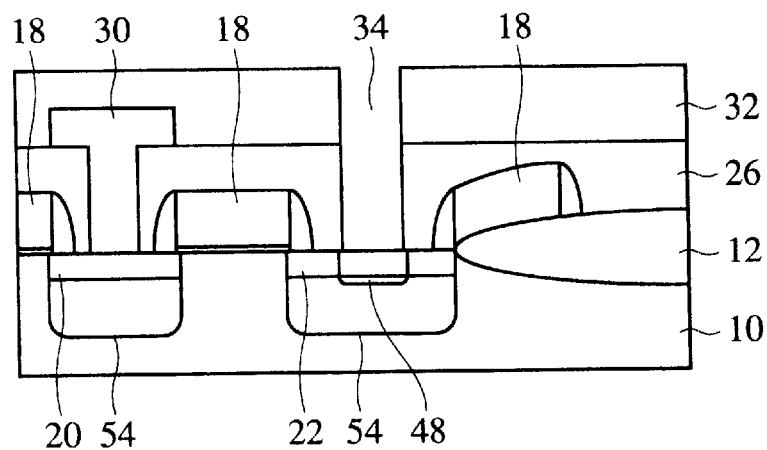
Figure 17C:
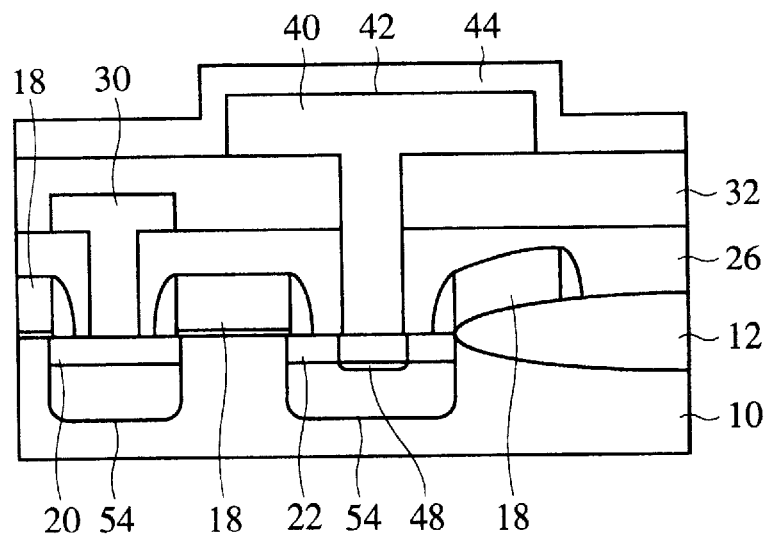

A DRAM comprising memory cells each including one transistor and one capacitor is formed (FIG. 20C) in the same way as the method for fabricating the semiconductor device according to, e.g., the fourth embodiment shown in FIG. 17C.

As described above, according to the present embodiment, the ion implantation for the electric field mitigation is performed after the gate electrode 18 is formed, whereby the electric filed can be mitigated in all the diffused layer of the storage node. Accordingly, a longer data retention time can be obtained.

[A Seventh Embodiment]

The semiconductor device and the method for fabricating the same according to a seventh embodiment will be explained with reference to FIGS. 25A–25B, 26, 27A–27D and 28A–28C. The same members of the present embodiment as those of the semiconductor device and the method for fabricating the semiconductor device are represented by the same reference numbers not to repeat or to simplify their explanation.

Figure 25A:
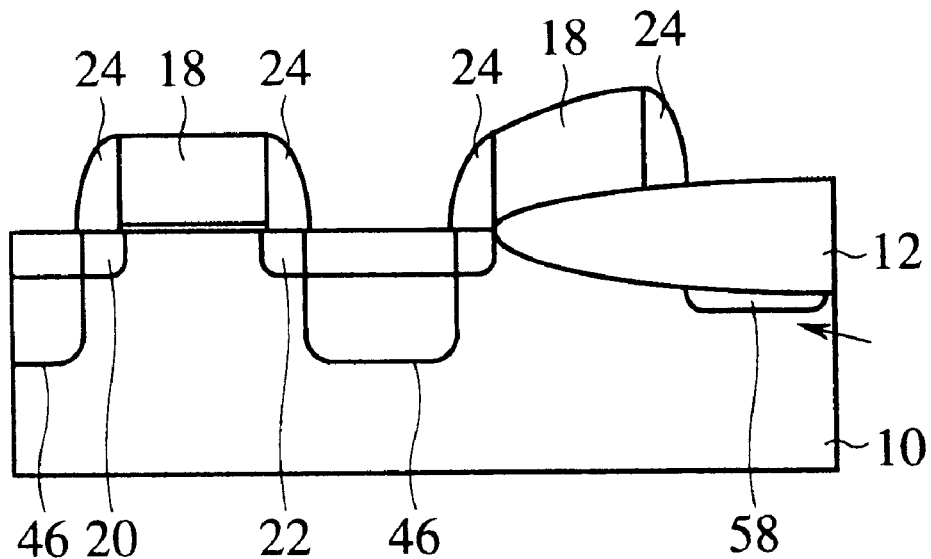
FIGS. 25A and 25B are views explaining problems of the semiconductor device and the method for fabricating the same according to the second to the sixth embodiments of the present invention.
Figure 25B:
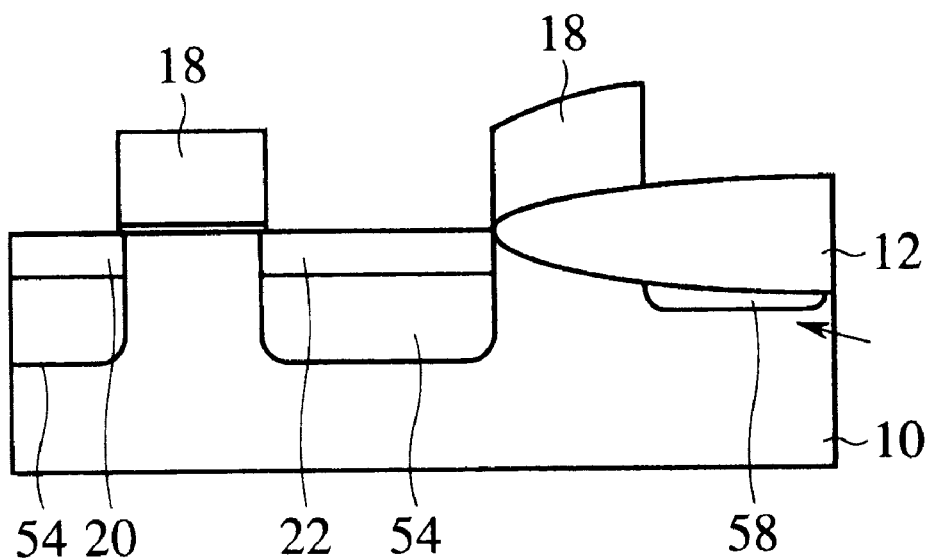
Figure 26:
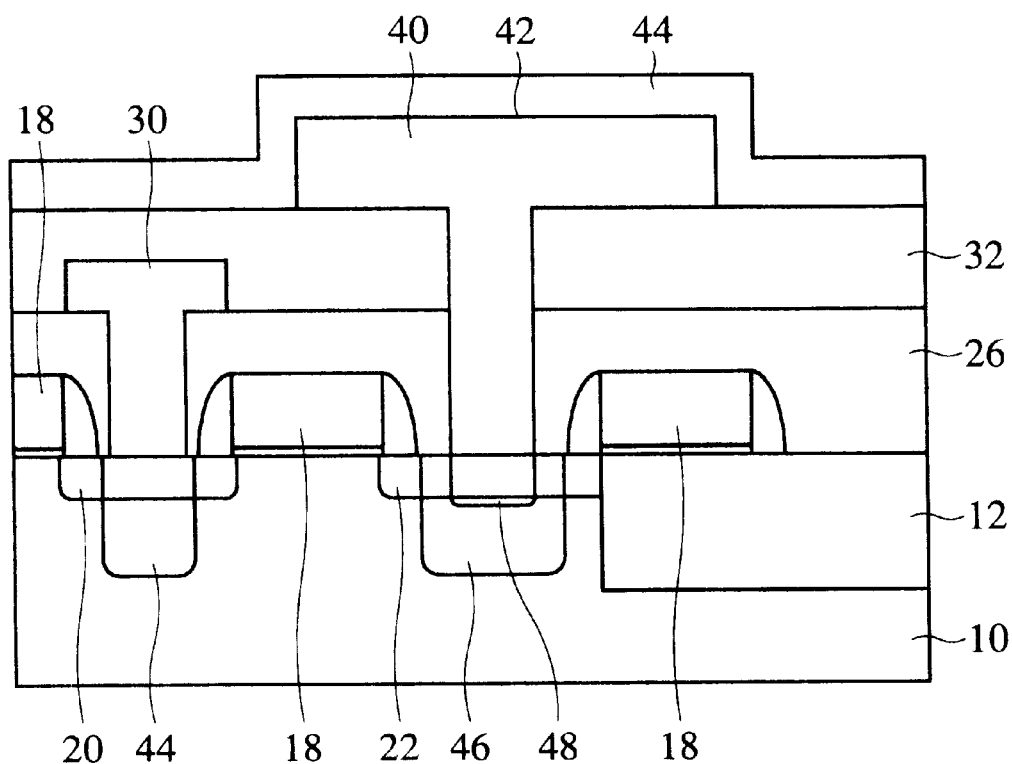
FIG. 26 is a diagrammatic sectional view of the semiconductor device according to a seventh embodiment of the present invention, which shows a structure thereof.

FIGS. 25A and 25B are views explaining problems of the semiconductor device and the method for fabricating the same according to the second to the sixth embodiments. FIG. 26 is a diagrammatic sectional view of the semiconductor device according to the present embodiment, which shows a structure thereof. FIGS. 27A–27D and 28A–28C are sectional views of the semiconductor device according to the present embodiment in the steps of the method for fabricating the same, which explain the method.

In the semiconductor device and the method for fabricating the same according to the above-described second to the sixth embodiments, phosphorus ions are implanted after the spacer 24 or the gate electrode 18 is formed, for the purpose of the electric field mitigation and the deep diffused layer. It has been shown above that it is very effective for the purpose of the electric field mitigation to implant phosphorus ions at a relatively high energy of about 100 keV.

However, to perform the ion implantation at such relatively high energy the following points must be considered.

FIG. 25A shows a sectional view of the semiconductor device in the case that the ion implantation for the electric field mitigation is performed after the spacer 24 is formed, and FIG. 25B shows a sectional view of the semiconductor device in the case that the ion implantation for the electric field mitigation is performed after the gate electrode 18 is formed.

Phosphorus ions often pass through the device isolation film 12 when acceleration energy of the phosphorus ions is high, or the device isolation film 12 is thin. When the phosphorus ions pass through the device isolation film, a diffused layer 58 having an opposite conduction-type to the silicon substrate 10 is formed immediately below the device isolation film. Accordingly, problems that the device isolation becomes incorrect, and leak current occurs between adjacent cells take place.

To hinder these problems, it is proposed to thicken the device isolation film 12, but in device isolation by the usual LOCOS method, as the device isolation film 12 is thicker, a bird's beak length is increased, which makes micronization impossible. That is, there is a possibility that as the micronization advances in future, acceleration energy of the ion implantation for the electric field mitigation is restricted by the leak current between adjacent cells, and the sufficient electric field mitigation effect cannot be expected.

It is also a problem that as with the case of the device isolation film 12, the implanted ions may pass through the gate electrode 18. However, it can cope with this problem that the gate electrode 18 or the insulation film 56 on the gate electrode 18 is thickened.

The semiconductor device and the method for fabricating the same according to the present embodiment can prevent the leak current between adjacent cells by the ion implantation for the electric field mitigation.

The semiconductor device and the method for fabricating the same according to the present embodiment is characterized in that the trench isolation method is used as a device isolation method.

That is, the semiconductor device according to the present embodiment is characterized in that the device isolation film 12 is formed of a silicon oxide film buried in a trench formed in a silicon substrate 10.

The semiconductor device and the method for fabricating the same according to the present embodiment will be detained in accordance with the fabrication steps of the method.

First, a region of the silicon substrate 10 which is to be a device isolation region is etched to form a trench of, e.g., an about 0.4 µm-depth.

Then, an insulation film is deposited on the entire surface by, e.g., CVD method and has the surface substantially flat by, e.g., CMP (Chemical Mechanical Polishing) method to leave the insulation film only in the trench. Thus, the device isolation film 12 is formed buried in the trench.

Subsequently, a gate insulation film 16 of a silicon oxide film is formed in an active region 14 by thermal oxidation.

Then, a conducting layer, e.g., a laminated film of a polycrystalline silicon film and a metal silicide film, which is to be the gate electrode is grown on the gate insulation film 16 by, e.g., CVD method and is patterned to form the gate electrode 18 of a transfer transistor.

Figure 27A:
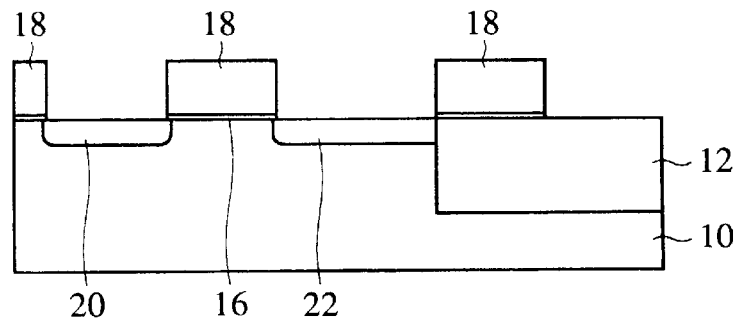
FIGS. 27A–27D and 28A–28C are sectional views of the semiconductor device according to the seventh embodiment in the steps of the method for fabricating the same, which show the method.

Then, an n-type diffused layer is formed in a region to be a source/drain diffused layers 20, 22 with the gate electrode 18 and the device isolation film 12 as a mask. In the ion implantation, for example, phosphorus ions are implanted at 30 keV acceleration energy and a $2\times10^{13}$ cm$^{-2}$ dose (FIG. 27A).

Figure 27B:
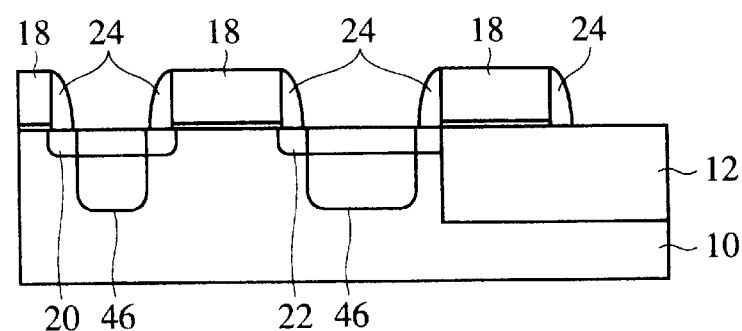

Then, an insulation film is grown on the entire surface of the silicon substrate 10 by, e.g., CVD method and is etched by RIE to form a spacer 24 on the side walls of the gate electrode 18 (FIG. 27B).

Subsequently, phosphorus ions are implanted with the device isolation film 12, the gate electrode 18 and the spacer 24 as a mask to form a diffused layer 46 in the silicon substrate 10. In this ion implantation, phosphorus ions are implanted, e.g., at 100 keV acceleration energy and a $5\times10^{12}$ cm$^{-2}$ dose. This ion implantation produces the effect of mitigating an electric field in the storage node and corresponds to the first ion implantation of the first embodiment.

Here, in the ion implantation for forming the diffused layer 46 for the electric field mitigation phosphorus ions are implanted at a relatively high energy, 100 keV acceleration energy, but in the semiconductor device according to the present embodiment, because the device isolation film 12 is buried in the sufficiently deep trench of an bout 0.4 µm depth, the implanted phosphorus ions never pass through the device isolation film 12 to be implanted in the silicon substrate 10 immediately below the device isolation film 12.

Then, an insulation film 26 is formed on the entire surface by, e.g., CVD method. The insulation film 26 functions as an inter-layer insulation film.

Then, a contact hole 28 for exposing the source/drain diffused layer 20 is opened in the insulation film 26 by the usual lithography and etching techniques.

Figure 27C:
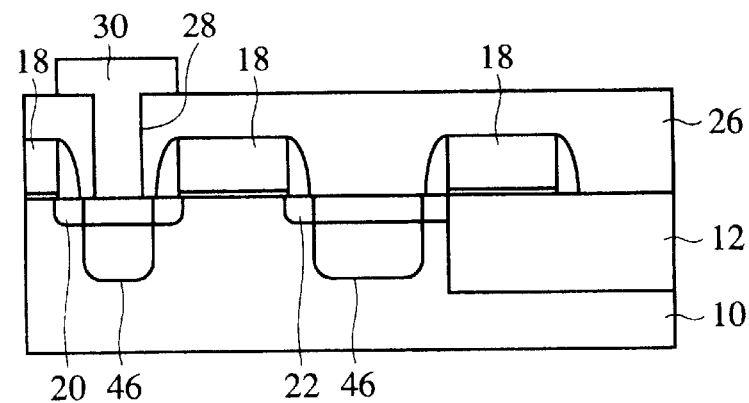

Subsequently, a conducting film is deposited on the insulation film and patterned to form a bit line 30 connected to the source/drain diffused layer 20 through the contact hole 28 (FIG. 27C).

Figure 27D:
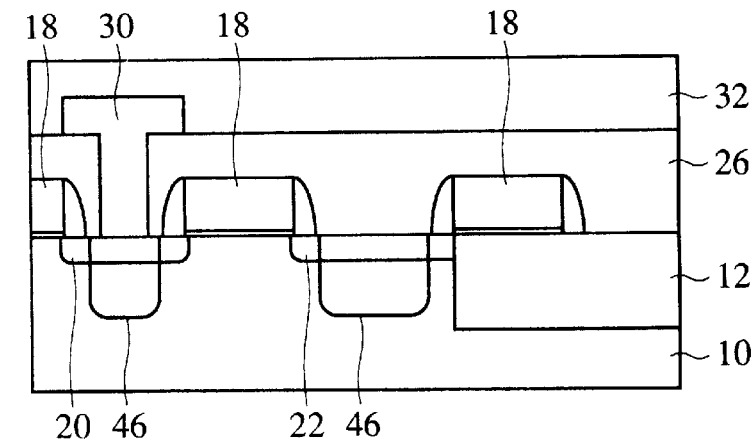

Then, an insulation film 32 is formed on the entire surface by, e.g., CVD method (FIG. 27D). The insulation film 32 functions as an inter-layer insulation film.

Figure 28A:
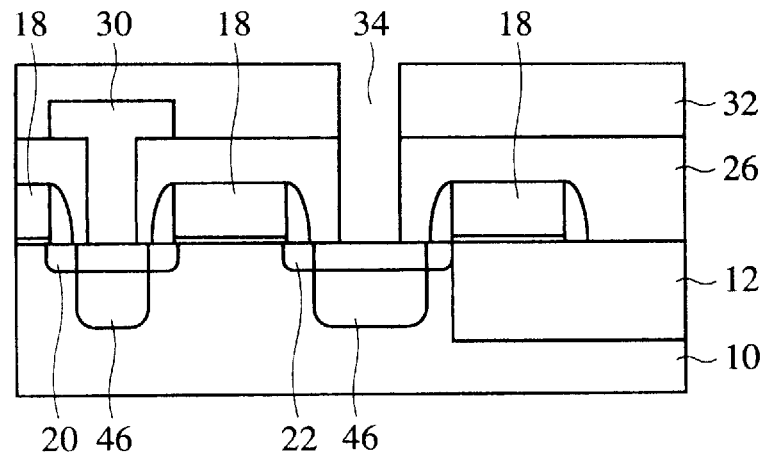

Then, a storage electrode contact hole 34 for exposing the source/drain diffused layer 22 is opened in the insulation film 32 and the insulation film 26 by usual lithography and etching techniques (FIG. 28A).

Figure 28B:
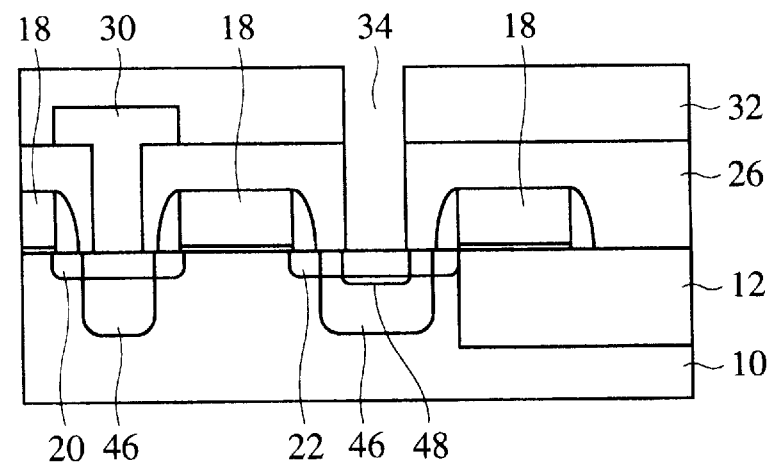
Figure 28C:
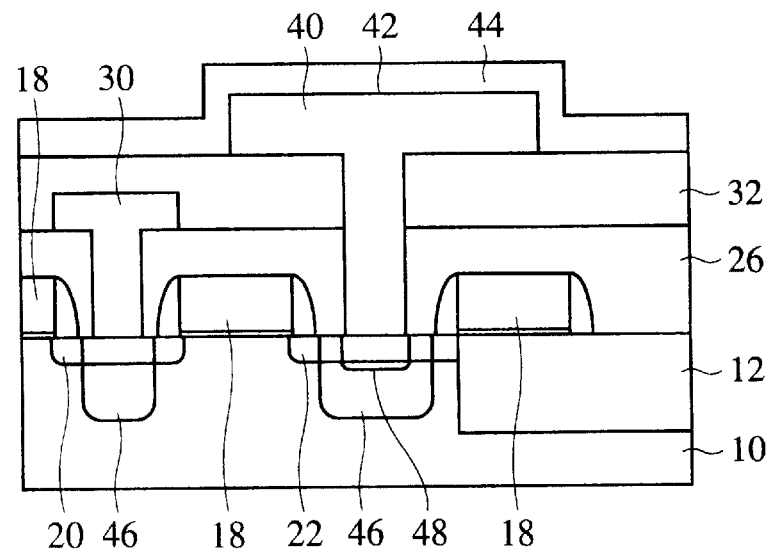

Subsequently, n-type impurity ions are implanted in the substrate immediately below the storage electrode contact hole 34 with the insulation film 32 as a mask to form a diffused layer 48 (FIG. 28B). For example, phosphorus ions are implanted at 30 keV acceleration energy and a $5\times10^{13}$ cm$^{-2}$.

The ion implantation for forming the diffused layer 48 is a countermeasure to a possible case that a region where the impurity diffusion from the storage electrode 40 into the silicon substrate 10 is insufficient, especially the storage electrode contact hole 34 is displaced and opened on the device isolation film 12 and corresponds to the second ion implantation of the first embodiment.

A DRAM comprising memory cells each including one transistor and one capacitor is formed (FIG. 28C) in the same way as the method for fabricating the semiconductor device according to, e.g., the second embodiment shown in FIG. 10C.

As described above, according to the present embodiment, the trench isolation method is used to form the device isolation film 12, whereby energy of the ion implantation for the electric field mitigation can be set without considering the risk that the implanted ions may pass through the device isolation film 12. In other words, energy of the ion implantation for the electric field mitigation can be so set that the electric field mitigation effect can be sufficient, and a depth of the trench is so set that the implanted ions do not pass through the device isolation film 12 to the substrate immediately therebelow. To make a trench deeper never hinders micronization of the device, and accordingly the present embodiment can be easily micronized in comparison with cases using the device isolation films formed by LOCOS method.

[An Eighth Embodiment]

The semiconductor device and the method for fabricating the same according to an eighth embodiment of the present invention will be explained with reference to FIGS. 29, 30A–30D and 31A–31C. The same members of the present embodiment as those of the semiconductor device and the method for fabricating the same according to the first to the seventh embodiments are represented by the same reference numbers not to repeat or to simplify their explanation.

Figure 29:
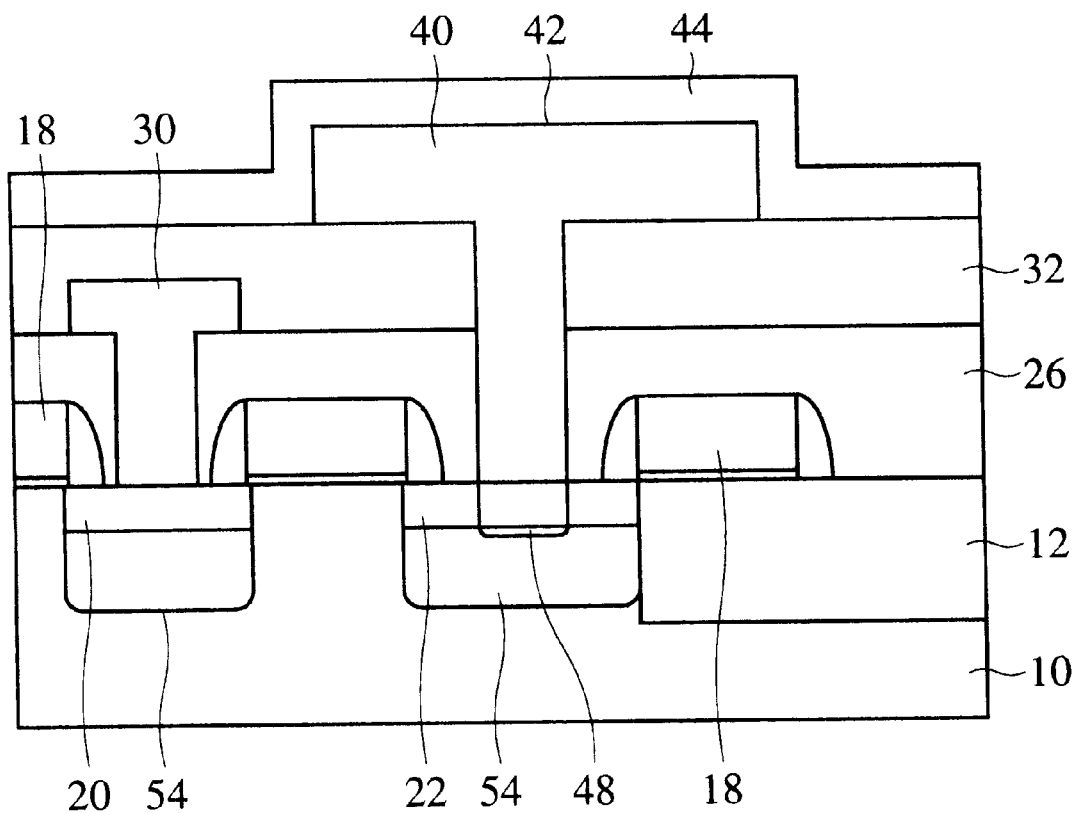
FIG. 29 is a diagrammatic sectional view of the semiconductor device according to an eighth embodiment of the present invention, which shows a structure thereof.

FIG. 29 is a diagrammatic sectional view of the semiconductor device according to the present embodiment, which shows a structure thereof. FIGS. 30A–30D and 31A–31C are sectional views of the semiconductor device according to the present embodiment in the steps of the method for fabricating the same, which show the method.

The semiconductor device according to the present embodiment and the method for fabricating the same are a combination of the semiconductor device and the method for fabricating the same according to the fourth embodiment and the semiconductor device and the method for fabricating the same according to the seventh embodiment.

That is, the semiconductor device according to the present embodiment is characterized in that the semiconductor device according to the fourth embodiment shown in FIG. 15 includes the device isolation film 12 formed by the trench isolation method.

Next, the semiconductor device according to the present embodiment and the method for fabricating the same will be detailed in accordance with the fabrication steps.

First, in the same way as in the method for fabricating the semiconductor device according to, e.g., the seventh embodiment shown in FIG. 27A, a region of a silicon substrate 10, which is to be a device isolation region to form a trench of, e.g. an about 0.4 µm depth.

Next, an insulation film is deposited on the entire surface by, e.g., CVD method and has the surface made substantially flat by, e.g., CMP method to leave the insulation film only in the trench. Thus, a device isolation film 12 is formed, buried in the trench.

Subsequently, a gate insulation film 16 of a silicon oxide film is formed in an active region 14 by thermal oxidation.

Then, a conducting film, e.g., a laminated film of a polycrystalline silicon film and a metal silicide film, which is to be a gate electrode is grown on the gate insulation film 16 by, e.g., CVD method and is patterned to form the gate electrode 18 of a transfer transistor.

Then, ion implantation is performed with the gate electrode 18 and the device isolation film 12 as a mask to form an n-type diffused layer in a region which is to be a source/drain diffused layers 20, 22. In the ion implantation, for example, phosphorus ions are implanted at 30 keV acceleration energy and a $2 \times 10^{13}$ cm$^{-2}$ dose.

Figure 30A:
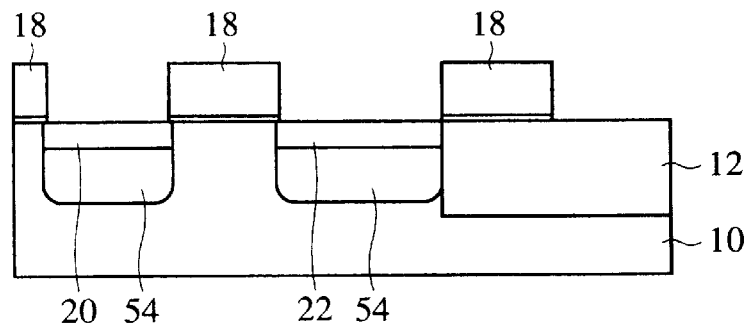
FIGS. 30A–30D and 31A–31C are sectional views of the semiconductor device according to the eighth embodiment in the steps of the method for fabricating the same, which show the method.

Then, ion implantation is further performed with the gate electrode 18 and the device isolation film 12 as a mask to form an n-type diffused layer (FIG. 30A). The diffused layer 54 is formed by implanting, for example, phosphorus ions at 100 keV acceleration energy and a $5 \times 10^{12}$ cm$^{-2}$ dose. The diffused layer 54 is for the electric field mitigation and is deeper and is not more heavily doped than the source/drain diffused layers 20, 22.

Here, in the ion implantation for forming the diffused layer 54 for the electric field mitigation phosphorus ions are implanted at relatively high energy, but in the semiconductor device according to the present embodiment, the device isolation film 12 is buried in the sufficiently deep trench of an about 0.4 µm depth. Accordingly, the implanted phosphorus ions never pass through the device isolation film 12 to be implanted in the silicon substrate immediately below the device isolation film 12.

Figure 30B:
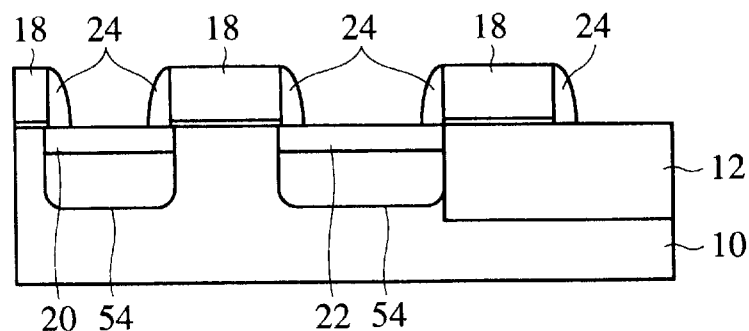

Subsequently, an insulation film is grown on the entire surface of the silicon substrate by, e.g., CVD method and is etched by RIE to form a spacer 24 on the side walls of the gate electrode 18 (FIG. 30B).

Then, an insulation film 26 is formed on the entire surface by, e.g., CVD method. The insulation film 26 functions as an inter-layer insulation film.

Next, a contact hole 28 for exposing the source/drain diffused layer 20 is opened in the insulation film 26 by the usual lithography and etching techniques.

Figure 30C:
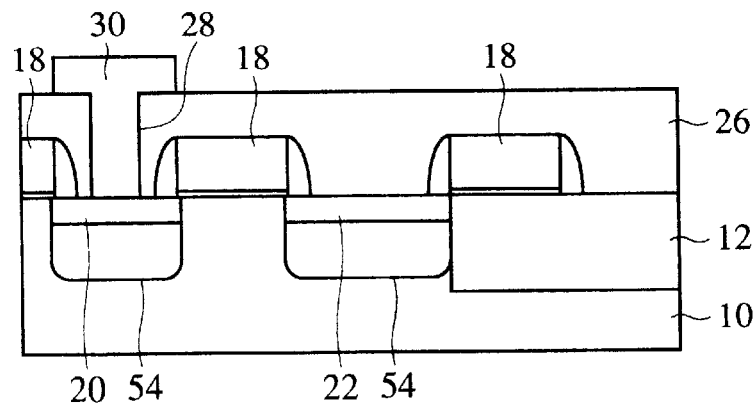

Subsequently, a conducting film is deposited on the insulation film 26 and is patterned to form a bit line 30 connected to the source/drain diffused layer 20 through the contact hole 28 (FIG. 30C).

Figure 30D:
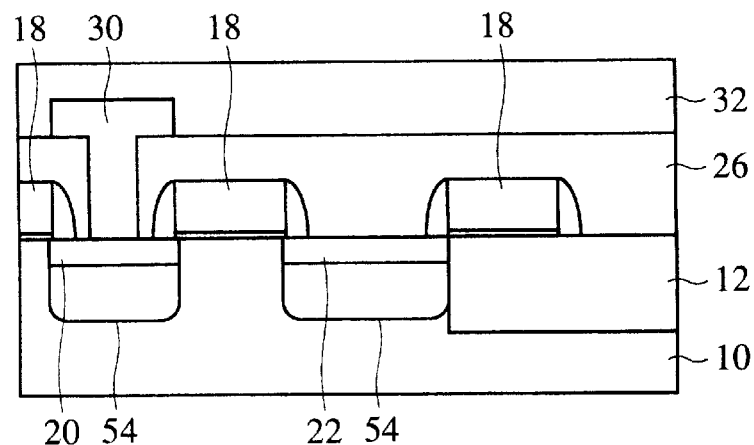

Then, an insulation film 32 is formed on the entire surface by, e.g., CVD method (FIG. 30D). The insulation film 32 functions as an inter-layer insulation film.

Figure 31A:
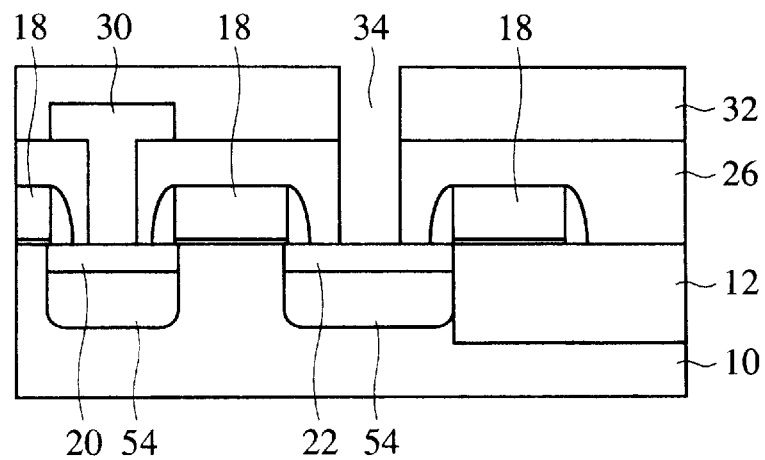

Next, a storage electrode contact hole 34 for exposing the source/drain diffused layer 22 is opened in the insulation film 32 and the insulation film 26 by the usual lithography and etching techniques (FIG. 31A).

Figure 31B:
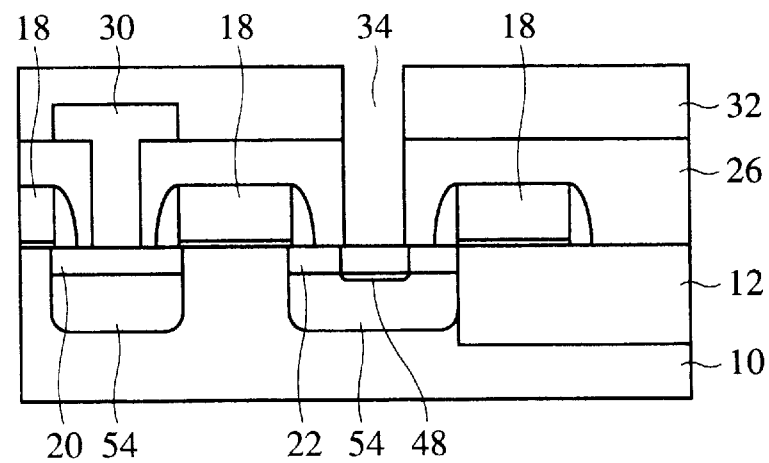
Figure 31C:
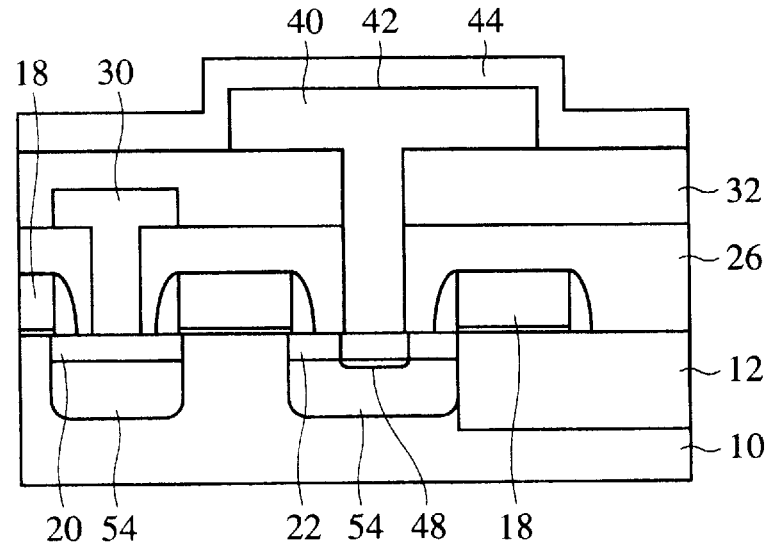

Subsequently, n-type impurity ions are implanted in the substrate immediately below the contact hole 34 with the insulation film 34 as a mask (FIG. 31B). For example, phosphorus ions are implanted at 30 keV acceleration energy and a $5 \times 10^{13}$ cm$^{-2}$ dose.

The ion implantation for forming the diffused layer 48 is a countermeasure to a possible case that a region where the impurity diffusion from the storage electrode 40 into the silicon substrate 10 is insufficient, especially the storage electrode contact hole 34 is displaced and opened on the device isolation film 12 and corresponds to the second ion implantation of the first embodiment.

A DRAM comprising memory cells each including one transistor and one capacitor is formed (FIG. 31C) in the same way as the method for fabricating the semiconductor device according to, e.g., the second embodiment shown in FIG. 17C).

As described above, according to the present embodiment, the trench isolation method is used to form the device isolation film 12, whereby energy of the ion implantation for the electric field mitigation can be set without considering the risk that the implanted ions may pass through the device isolation film. According to the present embodiment, the electric field can be mitigated in all the diffused layer in the storage node.

[A Ninth Embodiment]

The semiconductor device and the method for fabricating the same according to a ninth embodiment of the present invention will be explained with reference to FIGS. 32, 33A–33D and 34A–34C. The same reference numbers of the present embodiment as those of the semiconductor device and the method for fabricating the same according to the first to the eighth embodiments are represented by the same reference numbers not to repeat or to simplify their explanation.

Figure 32:
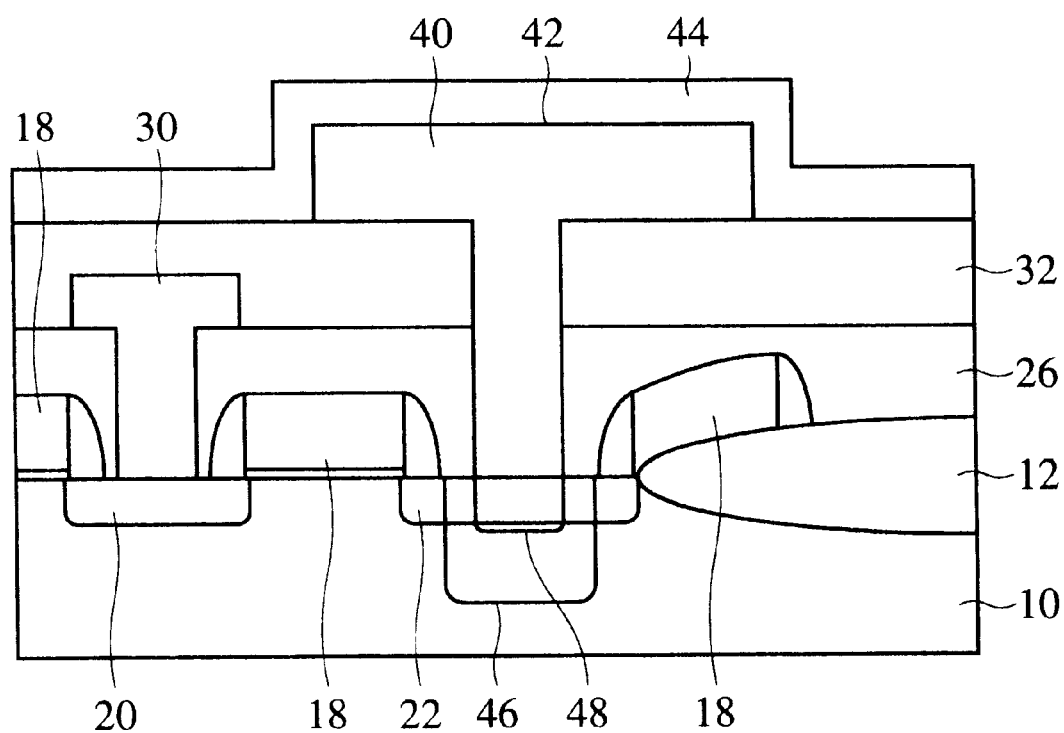
FIG. 32 is a diagrammatic sectional view of the semiconductor device according to a ninth embodiment of the present invention, which shows a structure thereof.

FIG. 32 is a diagrammatic sectional view of the semiconductor device according to the present embodiment, which shows a structure thereof. FIGS. 33A–33D and 34A–34C are sectional views of the semiconductor device according to the present embodiment in the steps of the method for fabricating the same, which explain the method.

In the semiconductor device according to the second embodiment, which is shown in FIG. 8, the diffused layer 46 for mitigating the electric field in the storage node is formed in the contact region for connecting the bit line 30 and the source/drain diffused layer 20 to each other.

However, the electric field mitigation and the deep diffused layer are for improving data retention characteristics, and it is sufficient that the diffused layer 46 is provided only in the storage node. On the other hand, the ion implantation for forming the diffused layer 46 is performed at relatively high acceleration energy, and there is a possibility that the short channel effect of the MOSFET will be worsened.

Here, the present embodiment can prevent influence on the short channel effect of the MOSFET while mitigating the electric field in the storage node.

That is, as shown in FIG. 32, the semiconductor device according to the present embodiment is characterized in that a diffused layer 46 is formed only in a region where a source/diffused layer 22 is formed.

Then, the semiconductor device according to the present embodiment and the method for fabricating the same will be detailed in accordance with the fabrication steps.

Figure 33A:
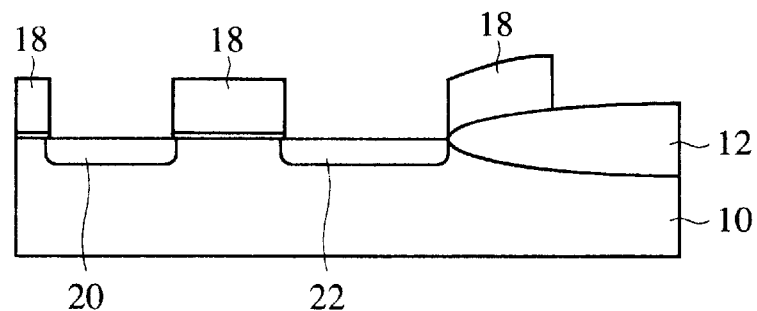
FIGS. 33A–33D and 34A–34C are sectional views of the semiconductor device according to the ninth embodiment in the steps of the method for fabricating the same, which show the method.
Figure 33B:
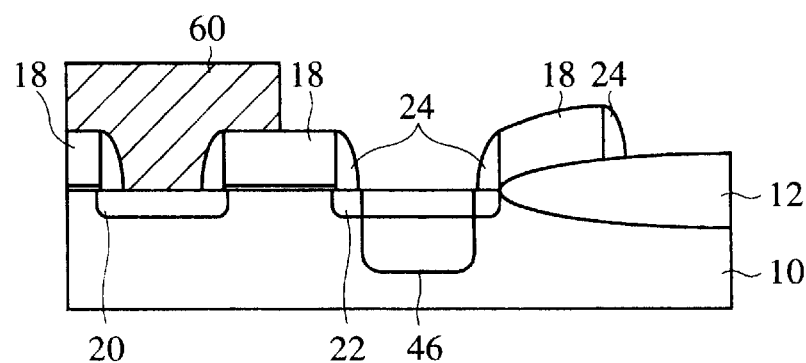
Figure 33C:
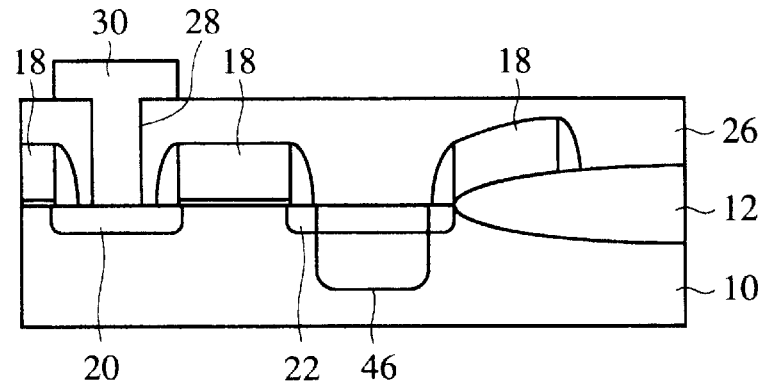
Figure 33D:
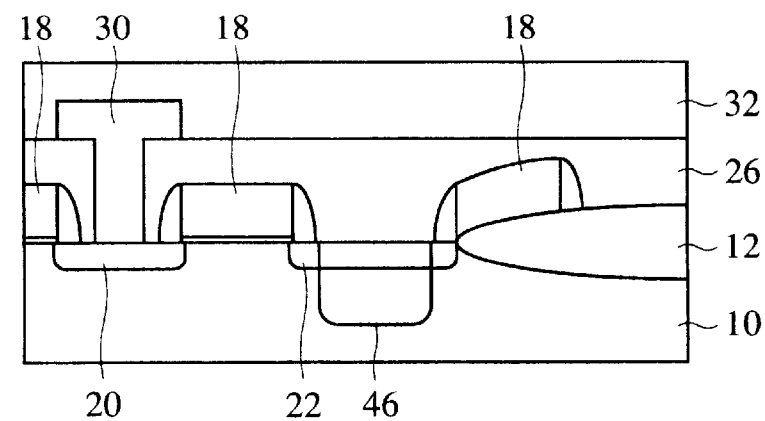
Figure 34A:
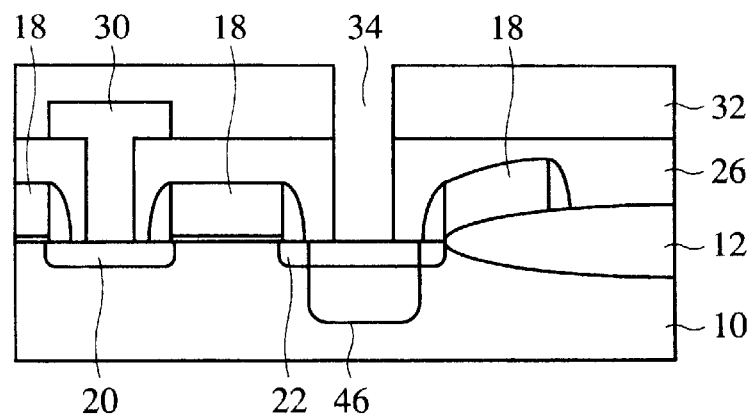
Figure 34B:
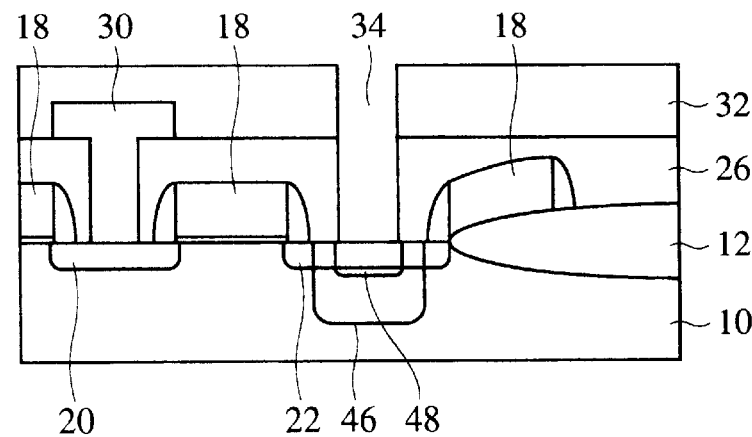
Figure 34C:
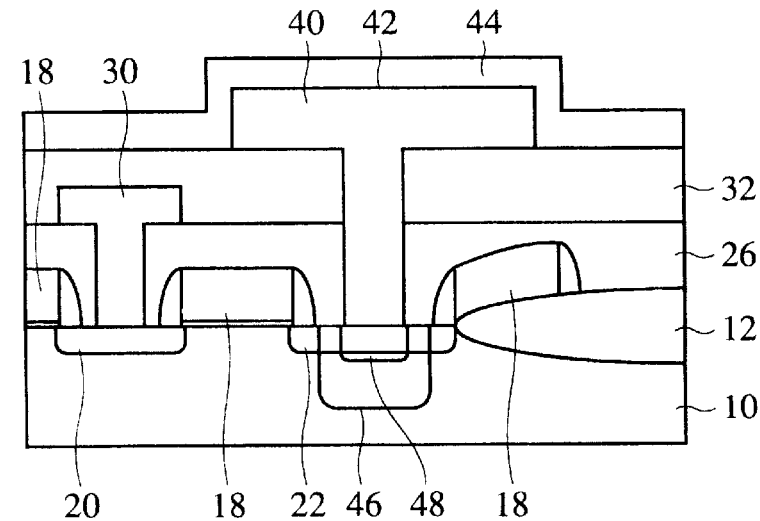

First, in the same way as in the method for fabricating the semiconductor device according to, e.g., the second embodiment shown in FIG. 9A, a transfer transistor is formed on a silicon substrate 10 (FIG. 33A).

Then, an insulation film is grown on the entire surface of a silicon substrate 10 by, e.g., CVD method and is etched by RIE to form a spacer 24 on the side walls of a gate electrode 18.

Subsequently, a photoresist 60 for covering the source/drain diffused layer 20 is formed by the usual lithography techniques. The photoresist 60 is a mask for not forming the diffused layer 46 in the source/drain diffused layer 20.

Then, phosphorus ions are implanted with the device isolation film 12, the gate electrode 18, the spacer 24 and the photoresist 60 as a mask to form the diffused layer 46 in the silicon substrate 10. In this ion implantation phosphorus ions are implanted, e.g., at 100 keV acceleration energy and a $5 \times 10^{12}$ cm$^{-2}$ dose. In this ion implantation, because of the photoresist 60 formed on the source/drain diffused layer 20, the diffused layer 46 is formed only in the region where the source/drain diffused layer 22 is formed, i.e., the storage node region.

The diffused layer 46 for mitigating the electric field is thus formed immediately after the spacer 24 is formed, whereby the electric field in all the diffused layer region surrounded by the spacer 24 on the side walls of the gate electrode 18 is mitigated, and a data retention time which is longer than that of the semiconductor device according to the first embodiment can be obtained.

Next, the photoresist 60 is removed, and then in the same way as in the method for fabricating the semiconductor device according to the second embodiment shown in FIGS. 9C to 10C, a DRAM comprising memory cells each including one transistor and one capacitor is formed (FIG. 33C–FIG. 34C).

As described above, according to the present embodiment, the diffused layer 46 for mitigating the electric field in the storage node is not formed in the contact region where the bit line 30 and the source/drain diffused layer 20 are connected to each other but only in the contact region where a storage electrode 40 and the source/drain diffused layer 22 are connected to each other, whereby influence on the short channel effect of the MOSFET is depressed while the electric field in the storage node can be mitigated.

The present embodiment has been explained by means of the semiconductor device and the method for fabricating the same according to the second embodiment, but is applicable, in the same way, to the semiconductor device and the method for fabricating the same according to the third, the fifth and the seventh embodiments. In this case, the photoresist film for covering the source/drain diffused layer 20 is formed prior to the step of implanting ions for forming the diffused layers 46, 52.

[A Tenth Embodiment]

The semiconductor device according to a tenth embodiment of the present invention and the method for fabricating the semiconductor device will be explained with reference to FIGS. 35, 36A–36E and 37A–37C. The same members of the present embodiment as those of the semiconductor device and the method for fabricating the same according to the first to the ninth embodiments are represented by the same reference numbers not to repeat or to simplify their explanation.

Figure 35:
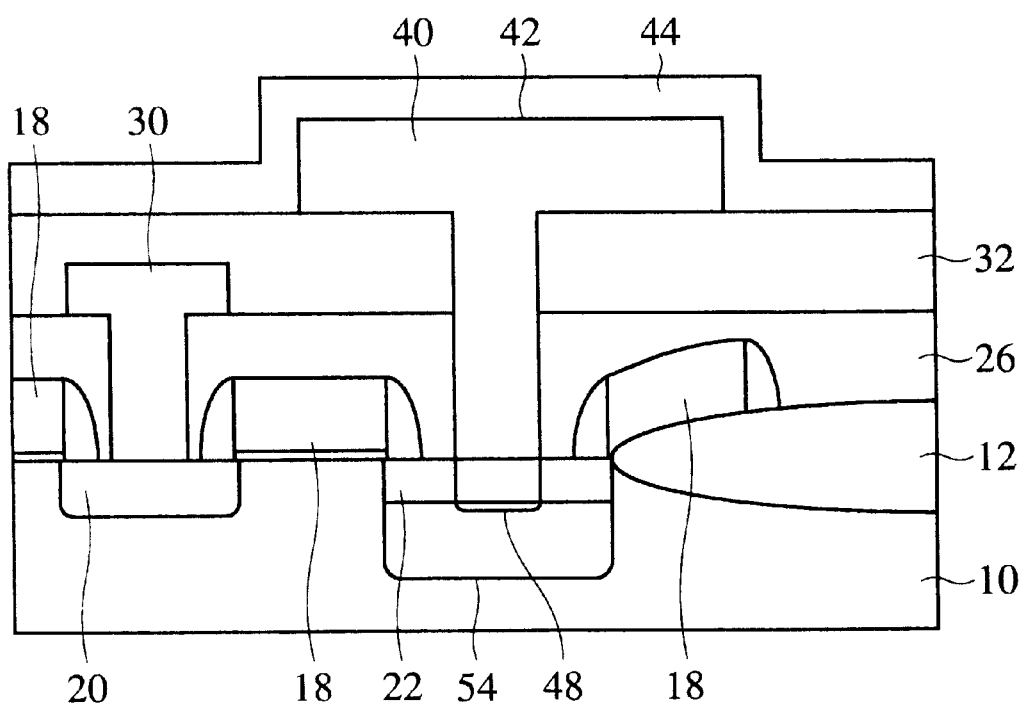
FIG. 35 is a diagrammatic sectional view of the semiconductor device according to a tenth embodiment of the present invention, which shows a structure thereof.

FIG. 35 is a diagrammatic sectional view of the semiconductor device according to the present embodiment, which shows a structure thereof. FIGS. 36A–36E and 37A–37C are sectional views of the semiconductor device according to the present embodiment in the steps of the method for fabricating the same, which explain the method.

The semiconductor device and the method for fabricating the same according to the present embodiment is a combination of the semiconductor device and the method for fabricating the same according to the fourth embodiment with the semiconductor device and the method for fabricating the same according to the ninth embodiment.

That is, as shown in FIG. 35, the semiconductor device according to the present embodiment is characterized in that a diffused layer 54 is formed only in a region where a source/drain diffused layer 22 is formed.

Then, the semiconductor device and the method for fabricating the same according to the present embodiment will be detailed in accordance with the fabrication steps.

Figure 36A:
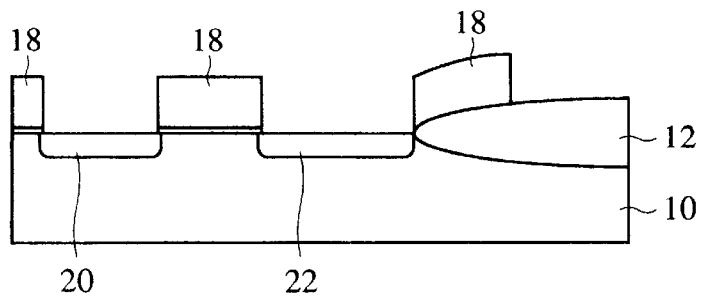
FIGS. 36A–36E and 37A–37C are sectional views of the semiconductor device according to the tenth embodiment in the steps of the method for fabricating the same, which show the method.
Figure 36B:
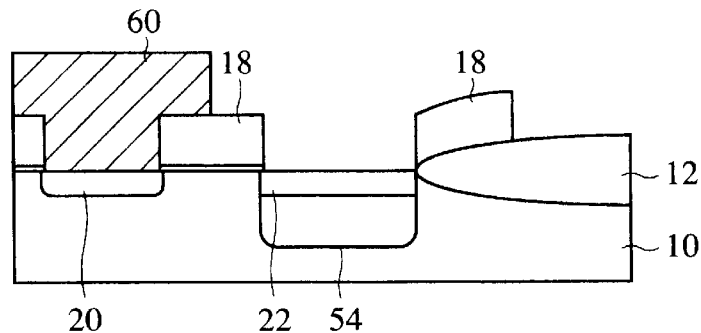

First, in the same way as in the method for fabrication the semiconductor device according to, e.g., the second embodiment shown in FIG. 9A, a transfer transistor is formed on a silicon substrate 10 (FIG. 36A).

Next, a photoresist 60 for covering the source/drain diffused layer 20 is formed by the usual lithography techniques. The photoresist 60 is a mask for not forming the diffused layer 54 in the source/drain diffused layer 20.

Subsequently, donor ions are implanted with the gate electrode 18, a device isolation film 12 and the photoresist 60 as a mask to form the n-type diffused layer 54 for the electric field mitigation (FIG. 36A). The diffused layer 54 is formed by implanting, e.g., phosphorus ions at 100 keV acceleration energy and a $5 \times 10^{12}$ cm$^{-2}$ dose. In this ion implantation, because of the photoresist 60 formed on the source/drain diffused layer 20 the diffused layer 54 is formed only in the region where the source/drain diffused layer 22 is formed, i.e., only in the storage node region.

The diffused layer 54 is for the electric field mitigation, and is deeper and is not more heavily doped that the source/drain diffused layer 22. The ion implantation for forming the diffused layer 54 is performed under the same conditions for the forming the diffused layer 36 of the first embodiment.

Figure 36C:
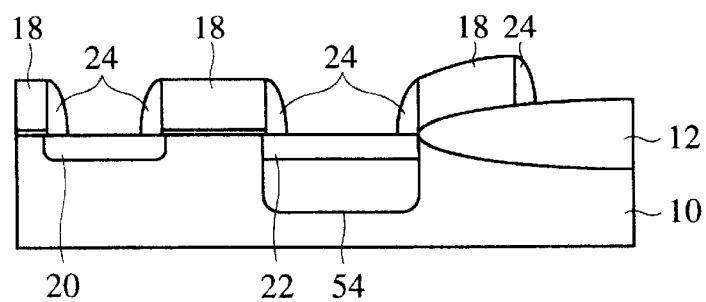
Figure 36D:
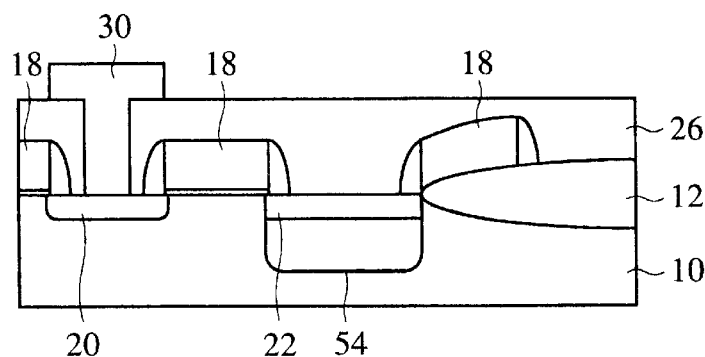
Figure 36E:
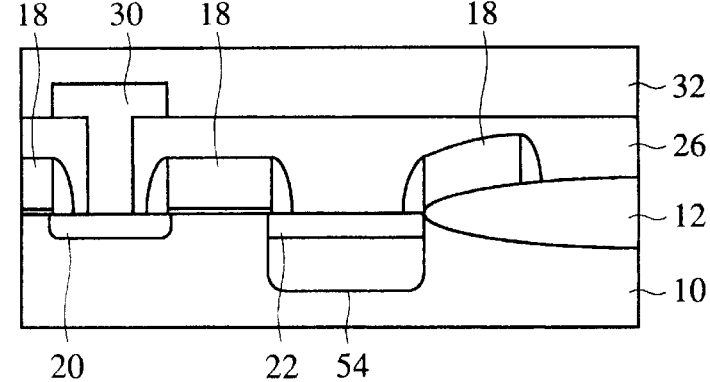
Figure 37A:
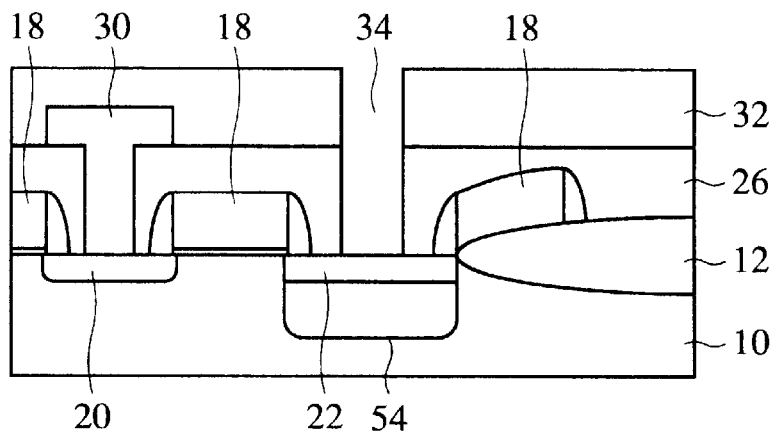
Figure 37B:
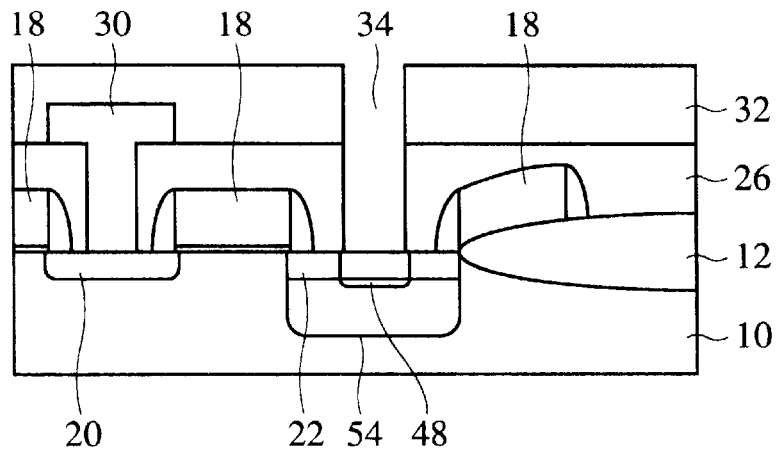
Figure 37C:
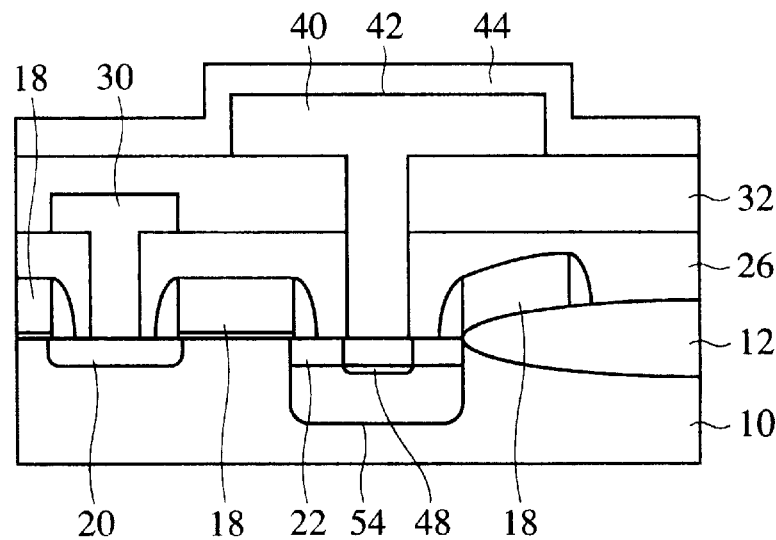

After the photoresist 60 is removed, an insulation film is grown on the entire surface of the silicon substrate 10 by, e.g., CVD method and is etched by RIE to form a spacer 24 on the side walls of the gate electrode 18 (FIG. 36C).

Then, in the same way as in the method for fabricating the semiconductor device according to, e.g., the fourth embodiment shown in FIGS. 16C to 17C, a DRAM comprising memory cells each including one transistor and one capacitor is formed (FIGS. 36D to 37C).

As described above, according to the present embodiment, the diffused layer 54 for mitigating the electric field in the storage node is not formed in the contact region where the bit line 30 and the source/drain diffused layer 20 are connected to each other but is formed only in the contact region where a storage electrode 40 and the source/drain diffused layer 22 are connected to each other, whereby influence on the short channel effect of the MOSFET is depressed while the electric field in the storage node can be mitigated.

The present embodiment has been explained by means of the semiconductor device according to the fourth embodiment but is applicable in the same way to the semiconductor device and the method for fabricating the same according to the sixth and the eighth embodiments. In this case, the photoresist for covering the source/drain diffused layer 20 is formed prior to the step of implanting ions for forming the diffused layer 54.

[An Eleventh Embodiment]

The semiconductor device and the method for fabricating the same according to an eleventh embodiment of the present invention will be explained with reference to FIGS. 38A–38C, 39A–39B and 40A–40C. The same members of the present embodiment as those of the semiconductor device and the method for fabricating the same according to the first to the tenth embodiments are represented by the same reference numbers not to repeat or to simplify their explanation.

FIGS. 38A–38C and 39A–39B are sectional views of the semiconductor device in the steps of the method for fabricating the same, which explain the method. FIGS. 40A–40C are sectional views of modifications of the present embodiment and the methods for fabricating the modifications.

In the semiconductor device and the method for fabricating the same according to the first to the tenth embodiments, only the memory cell region has been described mainly for the electric field mitigation in the storage node, but an actual DRAM includes, in addition to the memory cell region, also a peripheral circuit region which controls the memory cell region or is an interface with the outside. The peripheral circuit region is constituted by n-channel MOSFETs and p-channel MOSFETs.

Here, in the semiconductor device and the method for fabricating the same according to the present embodiment, how to use the ion implantation step for forming the diffused layers 36, 46, 54 for the electric field mitigation or the diffused layer 52 in the formation of the peripheral circuit region including conventional CMOS transistors will be explained.

Then, the semiconductor device and the method for fabricating the same according to the present embodiment will be detailed in accordance with the fabrication steps.

First, a device isolation film 12 for defining an active region is formed on a p-type silicon substrate by, e.g., LOCOS method. An n-well (not shown) and a p-well (not shown) are formed before or after the device isolation film 12 is formed.

Then, a conducting layer, e.g., a laminated film of a polycrystalline silicon film and a metal silicide film is grown on the silicon substrate 10 by, e.g., CVD method and is patterned to form gate electrodes 18 of the transfer transistor and a transistor of a peripheral circuit.

Next, ion implantation is performed in a memory cell region and a region of a peripheral circuit region where the n-channel-MOSFET is to be formed with the gate electrodes 18 and the device isolation film 12 as a mask. An n-type diffused layer is formed in a region where source/drain diffused layers 20, 22, 62 are to be formed. In the ion implantation, for example, phosphorus ions are implanted at 30 keV acceleration energy and a $2\times10^{13}$ cm$^{-2}$.

Figure 38A:
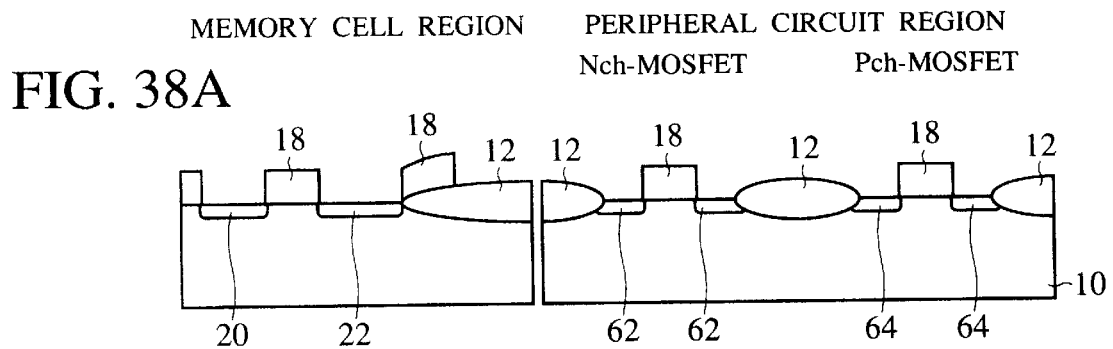
FIGS. 38A–38C and 39A–39B are a diagrammatic sectional view of the semiconductor device according to an eleventh embodiment in the steps of the method for fabricating the same, which show the method.

On the other hand, ion implantation is performed in a region of the peripheral circuit region where the p-channel-MOSFET is to be formed with the gate electrodes 18 and the device isolation film 12 to form a p-type diffused layer in a region where the source/drain diffused layer 64 is to be formed (FIG. 38A). In the ion implantation, for example, B (boron) ions are implanted at 10 keV acceleration energy and a $2\times10^{13}$ cm$^{-2}$ dose.

In the above-described example, the source/drain diffused layers 20, 22 of the memory cell region and the source/drain diffused layer 62 of the n-channel-MOSFET region are concurrently formed, but they may be formed in separate steps. The ion implantation in the region where the p-channel-MOSFET is to be formed can be omitted.

The source/drain diffused layers 62, 64 formed in the region where the peripheral circuit is to be formed may be used as a lightly doped diffused layer of LDD (Lightly Doped Drain) structure.

Next, an insulation film is grown on the entire surface of the silicon substrate 10 by, e.g., CVD method and is etched by RIE to form a spacer 24 on the side walls of the gate electrodes 18.

Subsequently, a photoresist 66 for covering the peripheral circuit region is formed by the usual lithography techniques, and next the ion implantation for mitigating an electric field in the storage node is performed. A diffused layer 46 is formed by, e.g., implanting phosphorus ions at 100 keV acceleration energy and a $5\times10^{12}$ cm$^{-2}$ (FIG. 38B).

By forming the diffused layer 46 with the peripheral circuit region covered with the photoresist 66, whereby conditions for forming the diffused layer 46 can be selected without considering influence on the peripheral circuit. A reticle (mask) for forming the photoresist 66 for exposing the memory cell region alone can be provided by a reticle used in the ion implantation step for controlling a threshold voltage of the MOSFET of a memory cell, or other steps, which provides a merit of a smaller number of reticles.

Figure 38B:
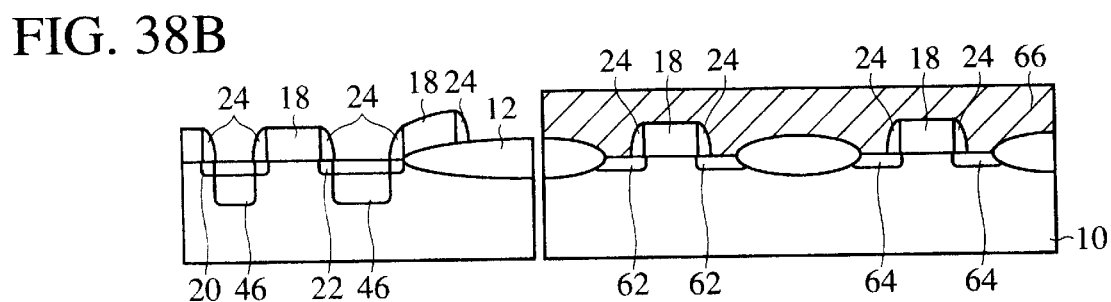

The diffused layer 46 can be formed in various methods other than that shown in FIG. 38B.

The method shown in FIG. 40A is characterized in that in the ion implantation step of forming the diffused layer 46 the photoresist 66 is not formed, and the ion implantation is performed in all the memory cell and the peripheral circuit regions.

As described above, the ion implantation for the electric field mitigation is an about $5\times10^{12}$ cm$^{-2}$ dose, which is relatively small. Accordingly, even when ions intrude into the p-channel-MOSFET in the ion implantation, substantially no influence will be caused.

The method shown in FIG. 40A permits the ion implantation for forming the diffused layer 46 for the electric field mitigation to be performed without the use of a photoresist as a mask, which results in a smaller number of lithographic steps.

The method shown in FIG. 40B is characterized in that in the ion implantation step for forming the diffused layer 46, ions are implanted only in a region for the source/drain diffused layer 22 connected to a storage electrode 40 of the memory cell region.

That is, the ion implantation for forming the diffused layer 46 is performed after the source/drain diffused layer 20 to which a bit line 30 is to be connected, and the n-channel-MOSFET and the p-channel-MOSFET regions of the peripheral circuit region are covered with the photoresist 68.

The method shown in FIG. 40B has a merit that proximal conditions can be selected without considering influence on the short channel effect of the peripheral circuit and the transfer transistor, but considering only mitigation of the electric field in the storage node.

The method shown in FIG. 40C is characterized in that in the ion implantation step of forming the diffused layer 46, ions are implanted only in the source/drain diffused layer 22 to which the storage electrode 40 of the memory cell region is to be connected, and the n-channel-MOSFET of the peripheral circuit region.

That is, the ion implantation for forming the diffused layer is performed after the source/drain diffused layer 20 to which the bit line 30 of the memory cell is connected, and the p-channel-MOSFET of the peripheral circuit region are covered with a photoresist 70.

In the method shown in FIG. 40C, because the ion implantation is performed only in the source/drain diffused layer 22 to which the storage electrode 40 is to be connected, the short channel effect of the transfer transistor of the memory cell region, which is most strict, can be minimized. The ion implantation is performed also in the n-channel-MOSFET region of the peripheral circuit region, whereby as in the transfer transistor, the electric field can be mitigated, and leak current can be reduced.

It is possible that the ion implantation is not performed in all the n-channel-MOSFETs, but only in those of the MOSFETs whose leak current must be reduced or those of the MOSFETs to which a voltage higher than usual is applied.

The method shown in FIG. 40D is characterized in that in the ion implantation step of forming the diffused layer 46, the ion implantation is performed in the source/drain diffused layers 20, 22 of the transfer transistor, and only the n-channel-MOSFET of the peripheral circuit region.

That is, the ion implantation for forming the diffused layer 46 is performed after only the region of the p-channel-MOSFET of the peripheral circuit region is covered with the photoresist 72.

The method shown in FIG. 40D can reduce a number of reticles (masks). This is because in, e.g., FIG. 38A, the reticle for this use can be provided by a reticle used in forming the source/drain diffused layers 20, 22, 62. Accordingly, in the method shown in FIG. 40D, the ion implantation for the electric field mitigation can be performed without preparing a new reticle.

The methods shown in FIGS. 40A to 40D have respective merits and can be selected for devices in accordance with purposes of the devices.

Figure 38C:
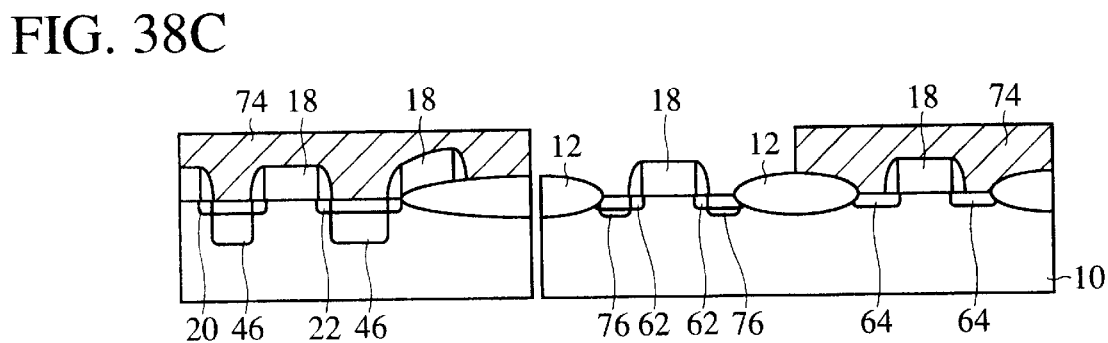

Then, the memory cell region and the p-channel-MOSFET region of the peripheral circuit region is covered with photoresist 74 by the usual lithography techniques, and ion implantation is performed to form a heavily doped n-type diffused layer 76 in the n-channel-MOSFET region of the peripheral circuit region (FIG. 38C). In the ion implantation, for example, arsenic ions are implanted at 30 keV acceleration energy and a $1\times10^{15}$ cm$^{-2}$ dose. The thus formed diffused layer 76 is to be a heavily doped diffused layer of LDD structure.

Figure 39A:
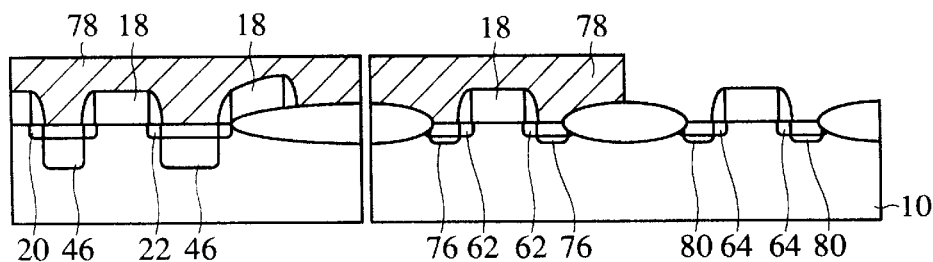

Then, the memory cell region and the n-channel-MOSFET region of the peripheral circuit region is covered with photoresist 78 by the usual lithography techniques, and ion implantation is performed to form a heavily doped p-type diffused layer 80 in the p-channel-MOSFET region of the peripheral circuit region (FIG. 39A). In the ion implantation, for example, boron ions are implanted at 20 keV acceleration energy and a $1\times10^{15}$ cm$^{-2}$ dose. The thus-formed diffused layer 80 is to be a heavily doped diffused layer of LDD structure.

Figure 39B:
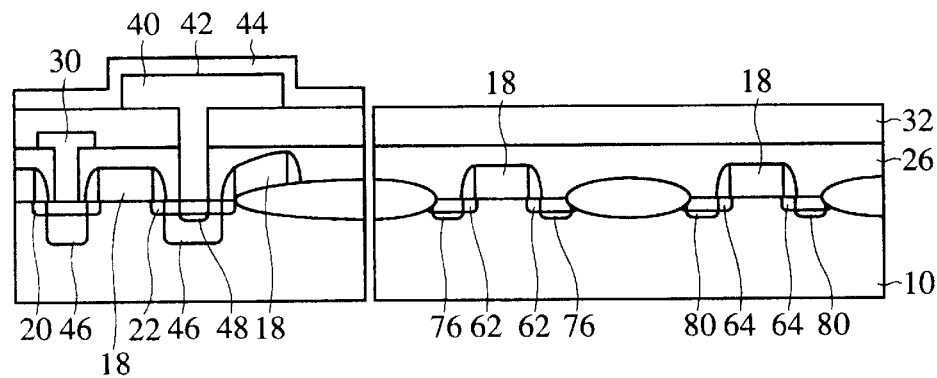
Figure 41:
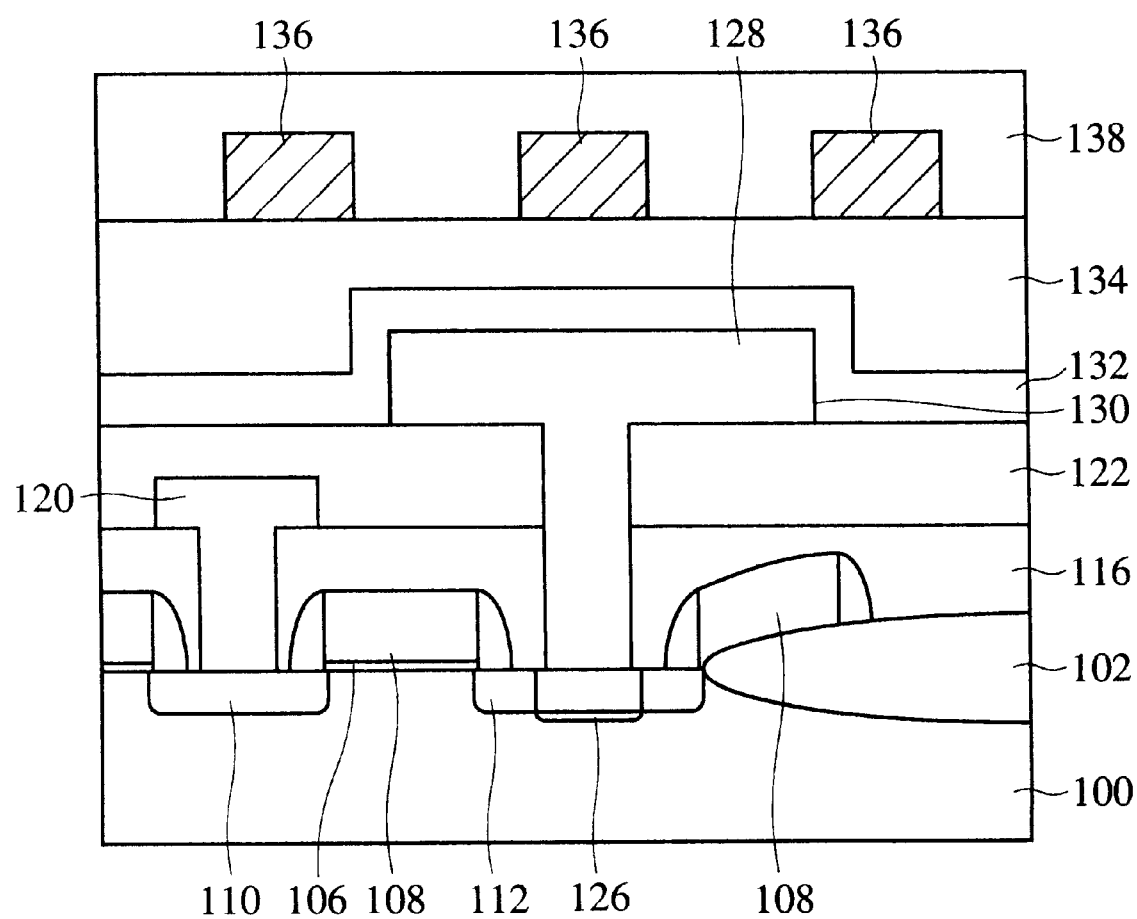
FIG. 41 is a diagrammatic sectional view of the conventional semiconductor device, which shows a structure thereof.
Figure 42A:
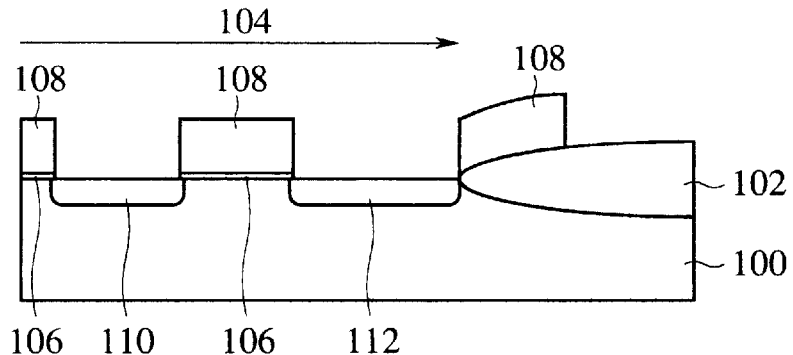
FIGS. 42A–42D and 43A–43C are sectional views of the conventional semiconductor device in the steps of the method for fabricating the same, which show the method.
Figure 42B:
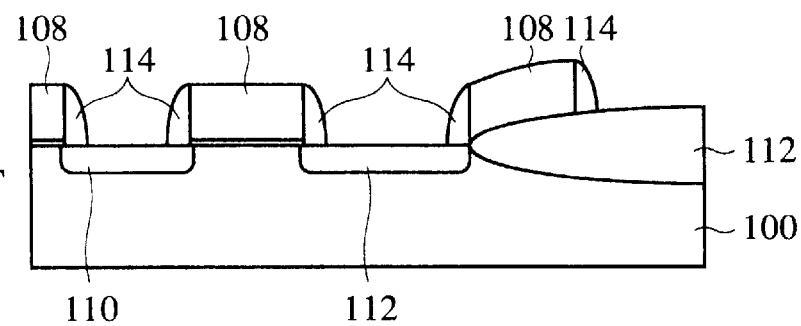
Figure 42C:
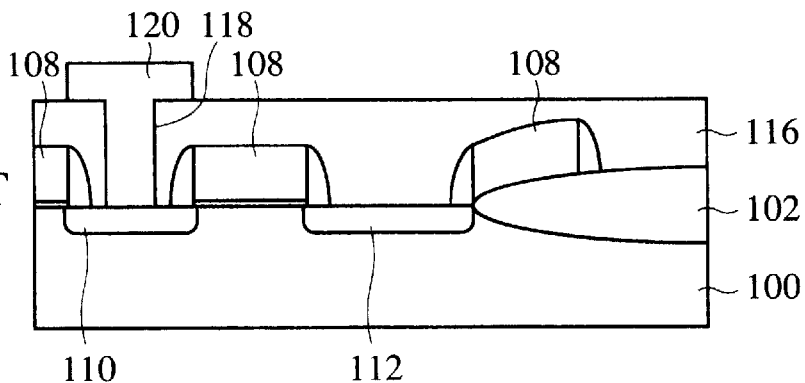
Figure 42D:
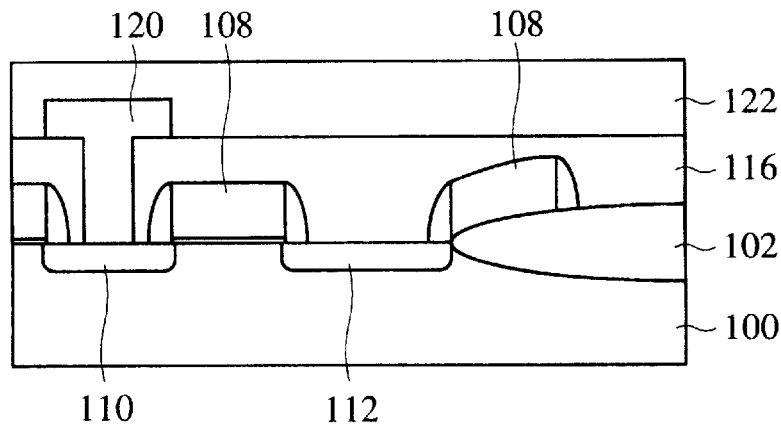
Figure 43A:
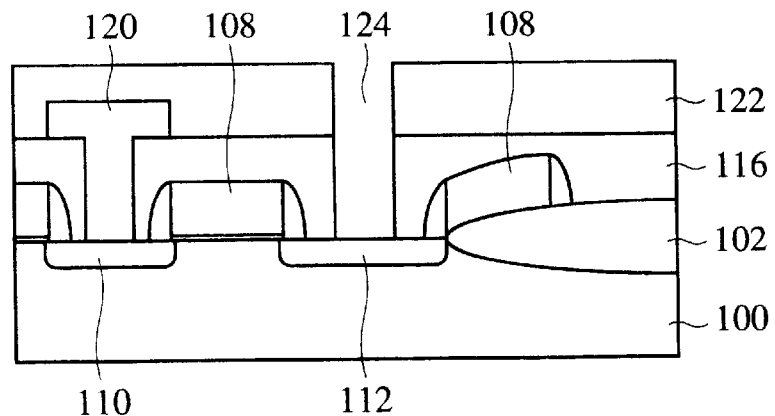
Figure 43B:
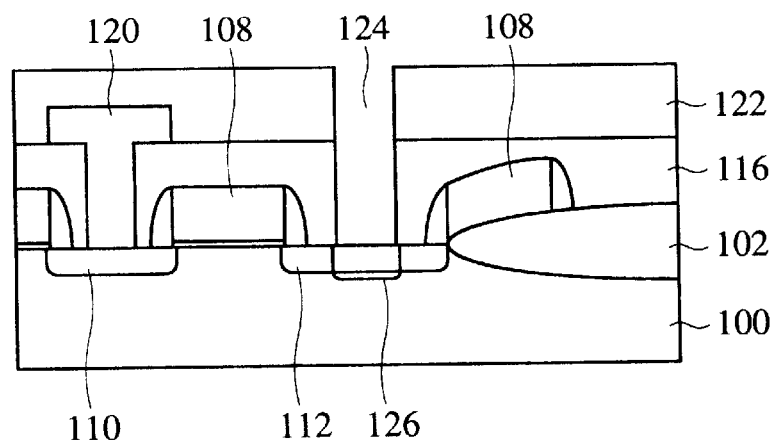
Figure 43C:
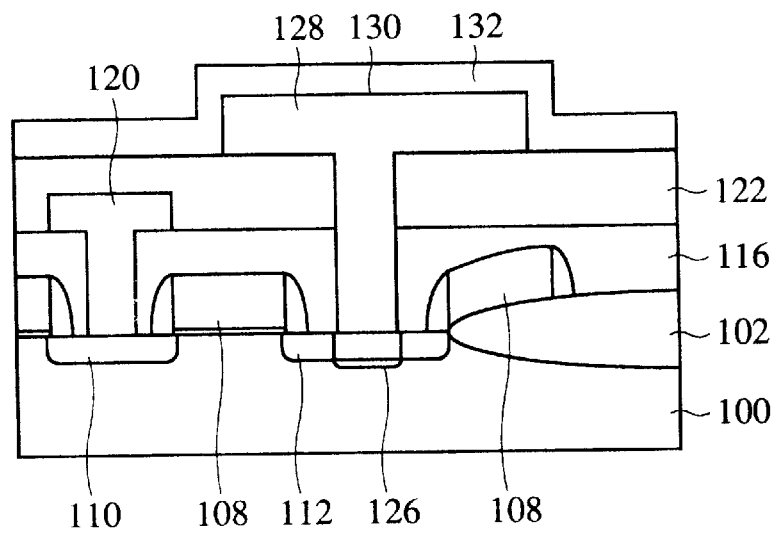

Then, in the same way as in the method for fabricating the semiconductor device according to, e.g., the second embodiment shown in FIGS. 9C to 10C, a DRAM comprising memory cells each including one transistor and one capacitor is formed (FIG. 39B).

As described above, according to the present embodiment, the step of forming the diffused layer 46 for mitigating the electric field in the storage node, and the step of forming a transistor of the peripheral circuit can be rationalized. Resultant various merits that a number of lithography steps can be reduced, the electric field mitigation effect can be obtained in the transistor of the peripheral circuit, etc. can be produced.

The present embodiment has rationalized the semiconductor device and the method for fabricating the same according to the second embodiment in forming the diffused layer 46 for the electric field mitigation after the spacer 24 in connection with the peripheral circuit region, but is applicable to other embodiments in the same way.

The present embodiment is applicable to embodiments as exemplified by the semiconductor device and the method for fabricating the same according to the fourth embodiment, wherein the diffused layer 54 for the electric field mitigation is formed after the gate electrode 18 is formed and before the spacer 24 is formed.

What is claimed is:

1. A method for fabricating a semiconductor device comprising:
   a gate electrode forming step of forming a gate electrode on a semiconductor device through a gate insulation film;
   a first ion implantation step of implanting ions into the semiconductor substrate with the gate electrode as a mask to form a first diffused layer in the semiconductor substrate on both sides of the gate electrode;
   an insulation film forming step of forming an insulation film on the entire surface of the semiconductor substrate;
   a contact hole forming step of forming a contact hole which reaches the first diffused layer in the insulation film;
   a second ion implantation step of implanting ions into the semiconductor substrate immediately below the contact hole with the insulation film as a mask to form a second diffused layer of the same conduction type as the first diffused layer;
   a third ion implantation step of implanting ions into the semiconductor substrate immediately below the contact hole with the insulation film as a mask to form a third diffused layer formed extending to a region which is deeper than the first and the second diffused layers, and having the same conduction type as the first diffused layer; and
   a capacitor forming step of forming a capacitor connected to the first diffused layer through the contact hole.

2. A method for fabricating a semiconductor device according to claim 1, wherein
   in the second implantation step and the third ion implantation step, phosphorus ions are implanted to form the second diffused layer and the third diffused layer.

3. A method for fabricating a semiconductor device according to claim 1, wherein
   in the third ion implantation step, ions are implanted at a smaller dose than in the first ion implantation step.

4. A method for fabricating a semiconductor device according to claim 1, wherein
   in the contact hole forming step, a part of the contact hole is formed, passed through a device isolation film.

5. A method for fabricating a semiconductor device comprising:
   a gate electrode forming step of forming a gate electrode on a semiconductor substrate through a gate insulation film;
   a first ion implantation step of implanting ions into the semiconductor substrate with the gate electrode as a mask to form a first diffused layer in the semiconductor substrate on both sides of the gate electrode;
   a spacer forming step of forming a spacer on a side wall of the gate electrode;
   a second ion implantation step of implanting ions in the semiconductor substrate with the gate electrode and the spacer as a mask to form a second diffused layer which is formed extending to a region which is deeper than the first diffused layer and has the same conduction type as the first diffused layer;
   an insulation film forming step of forming an insulation film on the entre surface of the semiconductor substrate;
   a contact hole forming step of forming a contact hole which reaches the first diffused layer in the insulation film; and a capacitor forming step of forming a capacitor connected to the first diffused layer through the contact hole.

6. A method for fabricating a semiconductor device comprising:

a gate electrode forming step of forming a gate electrode on a semiconductor substrate through a gate insulation film;

a first ion implantation step of implanting ions into the semiconductor substrate with the gate electrode as a mask to form a first diffused layer in the semiconductor substrate on both sides of the gate electrode;

a second ion implantation step of implanting ions into the semiconductor substrate with the gate electrode as a mask to form a second diffused layer formed extending to a region which is deeper than the first diffused layer and having the same conduction type as the first diffused layer;

an insulation film forming step of forming an insulation film on the entire surface of the semiconductor substrate;

a contact hole forming step of forming a contact hole which reaches the first diffused layer in the insulation film; and a capacitor forming step of forming a capacitor connected to the first diffused layer through the contact hole.

7. A method for fabricating a semiconductor device according to claim 5, wherein in the second ion implantation step, the second diffused layer is formed in the semiconductor substrate on both sides of the gate electrode.

8. A method for fabricating a semiconductor device according to claim 5, wherein in the second ion implantation step, the second diffused layer is formed in the semiconductor substrate on both sides of the gate electrode.

9. A method for fabricating a semiconductor device according to claim 5, further comprising before the insulation film forming step, a third ion implantation step of implanting ions into an n-channel transistor forming region of a peripheral circuit region at a large dose than in the first ion implantation step and the second ion implantation step with a gate electrode of the n-channel transistor and a spacer formed on a side wall of the gate electrode to form a third diffused layer which is more heavily doped than the first and the second diffused layers.

10. A method for fabricating a semiconductor device according to claim 6, further comprising before the insulation film forming step, a third ion implantation step of implanting ions into an n-channel transistor forming region of a peripheral circuit region at a large dose than in the first ion implantation step and the second ion implantation step with a gate electrode of the n-channel transistor and a spacer formed on a side wall of the gate electrode to form a third diffused layer which is more heavily doped than the first and the second diffused layers.

11. A method for fabricating a semiconductor device according to claim 5, wherein in the second ion implantation step, ion implantation is performed with the gate electrode of the n-channel transistor and the spacer formed on the side wall of the gate electrode as a mask to form in the n-channel transistor forming region a fourth diffused layer having substantially the same impurity distribution as the second diffused layer.

12. A method for fabricating a semiconductor device according to claim 6, wherein in the second ion implantation step, ion implantation is performed with the gate electrode of the n-channel transistor as a mask to form in the n-channel transistor forming region a fourth diffused layer having substantially the same impurity distribution as the second diffused layer.

13. A method for fabricating a semiconductor device according to claim 5, further comprising before the insulation forming step, a fourth ion implantation step of implanting ions into a p-channel transistor forming region of the peripheral circuit region with a gate electrode of the p-channel transistor and a spacer formed on a side wall of the gate electrode as a mask to form a fifth diffused layer, and wherein in the second ion implantation step, ion implantation is performed with the gate electrode of the p-channel transistor and the spacer formed on the side wall of the gate electrode as a mask to form in the p-channel transistor forming region a sixth diffused layer having substantially the same impurity distribution as the second diffused layer.

14. A method for fabricating a semiconductor device according to claim 6, further comprising before the insulation forming step, a fourth ion implantation step of implanting ions into a p-channel transistor forming region of the peripheral circuit region with a gate electrode of the p-channel transistor and a spacer formed on a side wall of the gate electrode as a mask to form a fifth diffused layer, and wherein in the second ion implantation step, ion implantation is performed with the gate electrode of the p-channel transistor as a mask to form in the p-channel transistor forming region a sixth diffused layer having substantially the same impurity distribution as the second diffused layer.

15. A method for fabricating a semiconductor device according to claim 5, wherein in the second ion implantation step, the ion implantation is performed at a smaller dose than in the first ion implantation step.

16. A method for fabricating a semiconductor device according to claim 6, wherein in the second ion implantation step, the ion implantation is performed at a smaller dose than in the first ion implantation step.

17. A method for fabricating a semiconductor device according to claim 5, wherein in the second ion implantation step, phosphorus ions are implanted to form the second diffused layer.

18. A method for fabricating a semiconductor device according to claim 6, wherein in the second ion implantation step, phosphorus ions are implanted to form the second diffused layer.

19. A method for fabricating a semiconductor device according to claim 5, wherein in the contact hole forming step, the contact hole is opened in self-alignment with the gate electrode.

20. A method for fabricating a semiconductor device according to claim 6, wherein in the contact hole forming step, the contact hole is opened in self-alignment with the gate electrode.

21. A method for fabricating a semiconductor device according to claim 5, further comprising after the contact hole forming step, a fifth ion implantation step of implanting ions into the semiconductor substrate immediately below the contact hole with the insulation film as a mask to form a seventh diffused layer having the same conduction type as the first diffused layer.

22. A method for fabricating a semiconductor device according to claim 6, further comprising after the contact hole forming step, a fifth ion implantation step of implanting ions into the semiconductor substrate immediately below the contact hole with the insulation film as a mask to form a seventh diffused layer having the same conduction type as the first diffused layer.

23. A method for fabricating a semiconductor device according to claim 1, further comprising before the gate electrode forming step, a device isolation region forming step of forming a trench in the semiconductor substrate in a device isolation region, and burying an insulation film in the trench to form a device isolation region of the insulation film buried in the trench.

24. A method for fabricating a semiconductor device according to claim 5, further comprising before the gate electrode forming step, a device isolation region forming step of forming a trench in the semiconductor substrate in a device isolation region, and burying an insulation film in the trench to form a device isolation region of the insulation film buried in the trench.

25. A method for fabricating a semiconductor device according to claim 6, further comprising before the gate electrode forming step, a device isolation region forming step of forming a trench in the semiconductor substrate in a device isolation region, and burying an insulation film in the trench to form a device isolation region of the insulation film buried in the trench.

* * * * *